United States Patent
Nishio et al.

(10) Patent No.: US 11,579,528 B2
(45) Date of Patent: Feb. 14, 2023

(54) ACTINIC RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

(71) Applicant: FUJIFILM Corporation, Tokyo (JP)

(72) Inventors: Ryo Nishio, Haibara-gun (JP); Akira Takada, Haibara-gun (JP); Akiyoshi Goto, Haibara-gun (JP); Naohiro Tango, Haibara-gun (JP); Kazuhiro Marumo, Haibara-gun (JP); Keiyu O, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 47 days.

(21) Appl. No.: 16/748,285

(22) Filed: Jan. 21, 2020

(65) Prior Publication Data
US 2020/0159117 A1    May 21, 2020

Related U.S. Application Data

(63) Continuation of application No. PCT/JP2018/025482, filed on Jul. 5, 2018.

(30) Foreign Application Priority Data

Jul. 31, 2017 (JP) .............................. JP2017-147570

(51) Int. Cl.
G03F 7/039 (2006.01)
G03F 7/30 (2006.01)
G03F 7/20 (2006.01)

(52) U.S. Cl.
CPC ............ *G03F 7/0392* (2013.01); *G03F 7/039* (2013.01); *G03F 7/0397* (2013.01); *G03F 7/2041* (2013.01); *G03F 7/30* (2013.01)

(58) Field of Classification Search
CPC .......... G03F 7/039; G03F 7/0397; G03F 7/30; G03F 7/38; G03F 7/2041
See application file for complete search history.

(56) References Cited

U.S. PATENT DOCUMENTS

| 2005/0042539 A1* | 2/2005 | Kim ...................... G03F 7/0397 430/270.1 |
| --- | --- | --- |
| 2006/0008736 A1 | 1/2006 | Kanda et al. |
| 2007/0009832 A1* | 1/2007 | Kinsho ................... C08G 77/24 430/270.1 |
| 2012/0219905 A1 | 8/2012 | Ichikawa et al. |
| 2013/0078426 A1 | 3/2013 | Koshijima et al. |
| 2015/0323869 A1 | 11/2015 | Liu et al. |
| 2016/0004156 A1* | 1/2016 | Sugiyama ................. G03F 7/16 430/311 |
| 2017/0184970 A1* | 6/2017 | Goto ..................... H01L 21/027 |

FOREIGN PATENT DOCUMENTS

| CN | 105255246 A | 1/2016 |
| --- | --- | --- |
| JP | 2006-048029 A | 2/2006 |
| JP | 2010-224066 A | 10/2010 |
| JP | 2012-137565 A | 7/2012 |
| JP | 2012-190008 A | 10/2012 |
| JP | 2013-068776 A | 4/2013 |
| JP | 2015-135490 A | 7/2015 |
| JP | 2016-212403 A | 12/2016 |
| TW | 201632990 A | 9/2016 |

OTHER PUBLICATIONS

Uetani, Y. Tomioka, J. Moriuma, H. Miya, Y. "Contrast Enhancement By Alkali Decomposable Additives in Quinonedizide-type Positive Resists." Proceedings of SPIE, 3333, Advances in Resist Technology and Processing XV, (Jun. 29, 1998); pp. 1280-1287.*
Notification of Reason for Refusal dated Aug. 17, 2021 from the Korean Intellectual Property Office in KR Application No. 10-2020-7001785.
Communication dated Jul. 20, 2021 by the Taiwanese Patent Office in Taiwanese Application No. 107124008.
International Search Report dated Sep. 11, 2018, issued by the International Searching Authority in application No. PCT/JP2018/025482.
Written Opinion dated Sep. 11, 2018, issued by the International Searching Authority in application No. PCT/JP2018/025482.
International Preliminary Report on Patentability dated Feb. 4, 2020, issued by the International Searching Authority in application No. PCT/JP2018/025482.
Communication dated Jun. 9, 2020, from the Japanese Patent Office in Application No. 2019-533990.
Office Action dated Mar. 2, 2022 in Taiwanese Application No. 107124008.

* cited by examiner

*Primary Examiner* — John S Chu
(74) *Attorney, Agent, or Firm* — Sughure Mion, PLLC

(57) ABSTRACT

An actinic ray-sensitive or radiation-sensitive resin composition includes a resin whose solubility in an aqueous alkali solution increases by the action of an acid, a compound that generates an acid upon irradiation with actinic rays or radiation, an ester compound, and a fluorine-containing polymer, in which the ester compound has alkali decomposability and has a molecular weight of 50 or more and less than 1,500.

19 Claims, No Drawings

US 11,579,528 B2

ACTINIC RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

CROSS-REFERENCE TO RELATED APPLICATIONS

This application is a Continuation of PCT International Application No. PCT/JP2018/025482 filed on Jul. 5, 2018, which claims priority under 35 U.S.C. § 119(a) to Japanese Patent Application No. 2017-147570 filed on Jul. 31, 2017. Each of the above application(s) is hereby expressly incorporated by reference, in its entirety, into the present application.

BACKGROUND OF THE INVENTION

1. Field of the Invention

The present invention relates to an actinic ray-sensitive or radiation-sensitive resin composition, a resist film, a pattern forming method, and a method for manufacturing an electronic device.

2. Description of the Related Art

In the related art, microprocessing by lithography using an actinic ray-sensitive or radiation-sensitive resin composition which is a so-called photoresist composition has been performed in a process for manufacturing a semiconductor device such as an integrated circuit (IC).

In recent years, liquid immersion exposure is used in some cases in order to form finer patterns. In a case of performing exposure using a scan-type liquid immersion exposure machine in the liquid immersion exposure, it is required that an immersion liquid also moves at a high speed and is tracked with a high-speed movement of a lens of the liquid immersion exposure machine. In a case where the immersion liquid is water, it is preferable that a resist film is hydrophobic. Accordingly, a hydrophobic resin such as a polymer having a fluorine atom is included in the actinic ray-sensitive or radiation-sensitive resin composition in some cases (JP2010-224066A).

SUMMARY OF THE INVENTION

The present inventors have found that in a case where the actinic ray-sensitive or radiation-sensitive resin composition described in JP2010-224066A is applied to a liquid immersion exposing step and a developing step, a resist film formed from the actinic ray-sensitive or radiation-sensitive resin composition does not reach a level of depth of focus (DOF) which has recently been required, and thus, an improvement in a tracking property with respect to water (water tracking property) is further required. Further, the water tracking property in the present specification is a value measurable by the method described in Examples and can be used as an index of whether an immersion liquid can be tracked with a high-speed movement of an exposure apparatus on a resist film during liquid immersion exposure.

An object of the present invention is to provide an actinic ray-sensitive or radiation-sensitive resin composition which can form a resist film having an excellent water tracking property and exhibits excellent DOF.

In addition, another object of the present invention is to provide a resist film formed from the actinic ray-sensitive or radiation-sensitive resin composition, a pattern forming method, and a method for manufacturing an electronic device.

The present inventors have conducted extensive studies on the objects, and as a result, they have found that the objects can be accomplished by using a fluorine-containing polymer and a predetermined ester compound in combination, thereby leading to the present invention.

That is, the present inventors have found that the objects can be accomplished by the following configurations.

(1) An actinic ray-sensitive or radiation-sensitive resin composition comprising:
a resin whose solubility in an aqueous alkali solution increases by the action of an acid;
a compound that generates an acid upon irradiation with actinic rays or radiation;
an ester compound; and
a fluorine-containing polymer,
in which the ester compound has alkali decomposability and has a molecular weight of 50 or more and less than 1,500.

(2) The actinic ray-sensitive or radiation-sensitive resin composition as described in (1),
in which the ester compound has at least one or more electron-withdrawing groups.

(3) The actinic ray-sensitive or radiation-sensitive resin composition as described in (1) or (2),
in which the ester compound has a partial structure represented by Formula (A) which will be described later.

(4) The actinic ray-sensitive or radiation-sensitive resin composition as described in any one of (1) to (3),
in which the ester compound is a compound represented by Formula (B) which will be described later.

(5) The actinic ray-sensitive or radiation-sensitive resin composition as described in (4),
in which at least one of Rd's is an electron-withdrawing group.

(6) The actinic ray-sensitive or radiation-sensitive resin composition as described in (4) or (5),
in which Rc is an n-valent chained hydrocarbon group.

(7) The actinic ray-sensitive or radiation-sensitive resin composition as described in any one of (2) to (6),
in which the electron-withdrawing group is a halogenated alkyl group, a halogen atom, a cyano group, a nitro group, or a group represented by —COO—Rb, and Rb represents an alkyl group.

(8) The actinic ray-sensitive or radiation-sensitive resin composition as described in any one of (2) to (7),
in which the electron-withdrawing group is a halogenated alkyl group.

(9) The actinic ray-sensitive or radiation-sensitive resin composition as described in any one of (1) to (8),
in which the molecular weight of the ester compound is 300 to 1,000.

(10) The actinic ray-sensitive or radiation-sensitive resin composition as described in any one of (1) to (9),
in which a content of the ester compound is 1.0% to 6.0% by mass with respect to a total solid content of the actinic ray-sensitive or radiation-sensitive resin composition.

(11) The actinic ray-sensitive or radiation-sensitive resin composition as described in any one of (1) to (10),
in which the fluorine-containing polymer has alkali decomposability.

(12) The actinic ray-sensitive or radiation-sensitive resin composition as described in any one of (1) to (11), in which the fluorine-containing polymer has a repeating unit represented by Formula (X) which will be described later.

(13) The actinic ray-sensitive or radiation-sensitive resin composition as described in (12), in which the repeating unit represented by Formula (X) is a repeating unit represented by Formula (Y-1) which will be described later or a repeating unit represented by Formula (Y-2) which will be described later.

(14) A resist film formed from the actinic ray-sensitive or radiation-sensitive resin composition as described in any one of (1) to (13).

(15) A pattern forming method comprising:

forming a resist film on a substrate with the actinic ray-sensitive or radiation-sensitive resin composition as described in any one of (1) to (13);

irradiating the resist film with actinic rays or radiation; and developing the resist film with an aqueous alkali solution.

(16) The pattern forming method as described in (15), in which the irradiation with actinic rays or radiation is performed with liquid immersion exposure.

(17) A method for manufacturing an electronic device, the method comprising the pattern forming method as described in (15) or (16).

(18) A resist film comprising:

an underlayer including a resin whose solubility in an aqueous alkali solution increases by the action of an acid, a compound that generates an acid upon irradiation with actinic rays or radiation, and an ester compound; and an upper layer arranged on the underlayer, including a fluorine-containing polymer, in which the ester compound has alkali decomposability and has a molecular weight of 50 or more and less than 1,500.

According to the present invention, it is possible to provide an actinic ray-sensitive or radiation-sensitive resin composition which can form a resist film having an excellent water tracking property and exhibits excellent DOF.

In addition, according to the present invention, it is also possible to provide a resist film formed from the actinic ray-sensitive or radiation-sensitive resin composition, a pattern forming method, and a method for manufacturing an electronic device.

DESCRIPTION OF THE PREFERRED EMBODIMENTS

Hereinafter, suitable aspects of the present invention will be described in detail.

In citations for a group and an atomic group in the present specification, in a case where the group or the atomic group is denoted without specifying whether it is substituted or unsubstituted, the group or the atomic group includes both a group and an atomic group not having a substituent, and a group and an atomic group having a substituent. For example, an "alkyl group" which is not denoted about whether it is substituted or unsubstituted encompasses not only an alkyl group not having a substituent (unsubstituted alkyl group), but also an alkyl group having a substituent (substituted alkyl group).

Furthermore, in the present invention, "actinic rays" or "radiation" means, for example, a bright line spectrum of a mercury lamp, far ultraviolet rays typified by an excimer laser, extreme ultraviolet rays (EUV light), X-rays, particle rays such as electron beams and ion beams, or the like. In addition, in the present invention, "light" means actinic rays or radiation.

Furthermore, unless otherwise specified, "exposure" in the present specification encompasses not only exposure by a bright line spectrum of a mercury lamp, far ultraviolet rays typified by an excimer laser, X-rays, extreme ultraviolet rays (EUV light), or the like, but also lithography by particle rays such as electron beams and ion beams.

In the present specification, "(meth)acrylate" means "at least one of acrylate or methacrylate". Further, "(meth) acrylic acid" means "at least one of acrylic acid or methacrylic acid".

In the present specification, a numerical range expressed using "to" means a range that includes the preceding and succeeding numerical values of "to" as the lower limit value and the upper limit value, respectively.

First, the actinic ray-sensitive or radiation-sensitive resin composition (hereinafter also referred to as a "composition") of an embodiment according to the present invention will be described. The composition is used for positive tone development (development in which an unexposed area remains as a pattern and an exposed area is removed). That is, the development is performed with an aqueous alkali solution.

In the composition of an embodiment of the present invention, a fluorine-containing polymer and a predetermined ester compound may be used in combination. Since the ester compound has a compound having a small molecular weight, that is, a so-called low molecular compound, it has excellent diffusibility in the resist film. With this property, the ester compound has a high uneven distribution with respect to a hydrophobic area (that is, the unexposed area) in the resist film, which causes a plasticizing effect in the area with the uneven distribution. As a result, the diffusibility of an acid in the unexposed area is relatively improved with respect to the exposed area, which contributes to an improvement in DOF. In addition, it is possible to satisfy both of surface water repellency and DOF of the resist film by using the fluorine-containing polymer in combination with the others.

Furthermore, since the ester compound has alkali decomposability, it is also possible to suppress the generation of development defects during development. In addition, it is possible to easily obtain effects such as suppression of pattern collapse, improvement in line edge roughness, and suppression of scum in a case of using the composition of the embodiment of the present invention.

Hereinafter, the components included in the composition will be described in detail, and then a pattern forming method using the composition will be described in detail.

<Resin Whose Solubility in Aqueous Alkali-Solution Increases by Action of Acid>

A resin whose solubility in an aqueous alkali solution increases by the action of an acid (hereinafter also referred to as a "resin (A)") is preferably a resin having a group (hereinafter also referred to as an "acid-decomposable group") that decomposes by the action of an acid in the main chain or a side chain, or both the main chain and the side chain of the resin to generate an alkali-soluble group.

Examples of the alkali-soluble group include a phenolic hydroxyl group, a carboxyl group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl) imido group, a bis(alkylsulfonyl)methylene group, a bis (alkylsulfonyl)imido group, a tris(alkylcarbonyl)methylene group, and a tris(alkylsulfonyl)methylene group.

Examples of the group that decomposes by the action of an acid to generate an alkali-soluble group include a group in which an alkali-soluble group is protected with a group that leaves by an acid. Examples of the group that leaves by an acid include —C($R_{36}$)($R_{37}$)($R_{38}$) and —C($R_{01}$)($R_{02}$)(O$R_{39}$).

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ to $R_{02}$ each independently represent a hydrogen atom, an alkyl group, a cycloalkyl group, an aryl group, an aralkyl group, or an alkenyl group.

As the acid-decomposable group, a cumyl ester group, an enol ester group, an acetal ester group, or a tertiary alkyl ester group is preferable.

The resin (A) preferably has a repeating unit having an acid-decomposable group. As the repeating unit having an acid-decomposable group, a repeating unit represented by Formula (AI) is preferable.

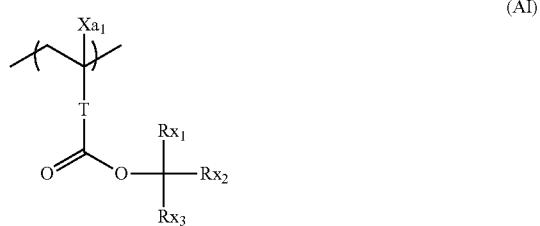

(AI)

In Formula (AI), $X_{a1}$ represents a hydrogen atom, a methyl group, a trifluoromethyl group, or a hydroxymethyl group. T represents a single bond or a divalent linking group.

$Rx_1$ to $Rx_3$ each independently represent an (linear or branched) alkyl group or a (monocyclic or polycyclic) cycloalkyl group.

At least two of $Rx_1$, . . . , or $Rx_3$ may be bonded to each other to form a (monocyclic or polycyclic) cycloalkyl group.

Examples of the divalent linking group of T include an alkylene group, a —COO—Rt- group, and an —O-Rt- group. In the formulae, Rt represents an alkylene group or a cycloalkylene group.

An aspect in which $Rx_1$ is a methyl group or an ethyl group, and $Rx_2$ and $Rx_3$ are bonded to each other to form the above-mentioned cycloalkyl group, and/or an aspect in which at least one of $Rx_1$, . . . , or $Rx_3$ is the above-mentioned cycloalkyl group is preferable.

The —C($Rx_1$)($Rx_2$)($Rx_3$) group which is an acid-decomposable group in Formula (AI) may have a group represented by at least one -(L)$_{n1}$-P as a substituent. Here, L represents a divalent linking group, n1 represents 0 or 1, and P represents a polar group.

Examples of the divalent linking group of L include a linear or branched alkylene group and a cycloalkylene group, and the number of atoms of the divalent linking group as L is preferably 20 or less, and more preferably 15 or less. The linear or branched alkylene group and the cycloalkylene group preferably have 8 or less carbon atoms. The linear or branched alkylene group and the cycloalkylene group may have a substituent, and examples of the substituent include an alkyl group, a halogen atom, a hydroxyl group, an alkoxy group, a carboxyl group, and an alkoxycarbonyl group.

Examples of the polar group of P include heteroatom-including groups such as a hydroxyl group, a ketone group, a cyano group, an amido group, an alkylamido group, a sulfonamido group, a lower ester group, and a lower sulfonate group. Here, the lower group is preferably the group having 2 or 3 carbon atoms. As the polar group, a hydroxyl group, a cyano group, or an amido group is preferable, and the hydroxyl group is more preferable.

Examples of the group represented by -(L)$_{n1}$-P include, in a case of n1=1, a linear or branched alkyl group (preferably having 1 to 10 carbon atoms) and a cycloalkyl group (preferably having 3 to 15 carbon atoms), each of which has a hydroxyl group, a cyano group, an amino group, an alkylamido group, an acid amido group, or a sulfonamido group, and the alkyl group having a hydroxyl group is preferable.

Among those, the group in which P is a hydroxyl group, n1 is 0 or 1, an L is a linear or branched alkylene group (preferably having 1 to 5 carbon atoms) is preferable.

The group represented by —C($Rx_1$)($Rx_2$)($Rx_3$) in Formula (AI) preferably has one to three groups represented by -(L)$_{n1}$-P, more preferably one or two groups represented by -(L)$_{n1}$-P, and still more preferably one group represented by -(L)$_{n1}$-P.

As the repeating unit represented by Formula (AI), a repeating unit represented by Formula (1-1) is preferable.

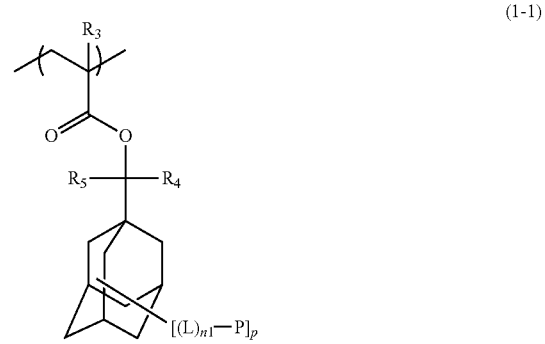

(1-1)

In Formula (1-1), $R_3$ is the same as $X_{a1}$ in Formula (AI).

$R_4$ and $R_5$ are each the same as $Rx_1$ and $Rx_2$ in Formula (AI).

The group represented by -(L)$_{n1}$-P is the same as the group represented by -(L)$_{n1}$-P for Formula (AI).

p represents an integer of 1 to 3. p is preferably 1 or 2, and more preferably 1.

A monomer corresponding to the repeating unit of Formula (AI) can be synthesized by, for example, the method described in JP2006-016379A.

The content of the repeating unit having an acid-decomposable group is preferably 20% to 50% by mole, and more preferably 25% to 45% by mole, with respect to all the repeating units in the resin (A).

Suitable aspects of the acid-decomposable group include the repeating units described in paragraphs 0049 to 0054 of JP2010-044358A (hereinafter referred to "Document A"), the contents of which are herein incorporated by reference.

The resin (A) preferably has a repeating unit having at least one group selected from the group consisting of a lactone group, a hydroxyl group, a cyano group, and an alkali-soluble group, and more preferably has a repeating unit having a lactone group (lactone structure).

As the lactone structure, 5- to 7-membered ring lactone structures are preferable, and the 5- to 7-membered ring lactone structures fused with other ring structures to form bicyclo structures or spiro structures are more preferable.

The resin (A) preferably has a repeating unit having a lactone structure represented by any one of Formula (LC1-1), . . . , or (LC1-17). In addition, the lactone structure may be directly bonded to the main chain. As the lactone structure, a lactone structure represented by Formula (LC1-1), Formula (LC1-4), Formula (LC1-5), Formula (LC1-6), Formula (LC1-13), Formula (LC1-14), or Formula (LC1-17) is preferable.

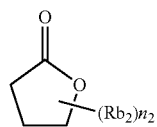

LC1-1

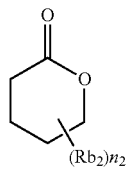

LC1-2

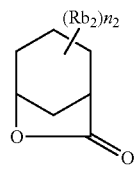

LC1-3

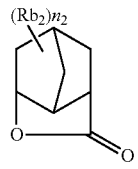

LC1-4

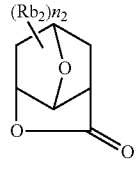

LC1-5

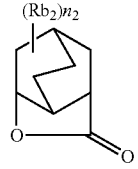

LC1-6

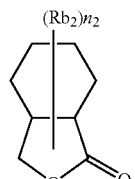

LC1-7

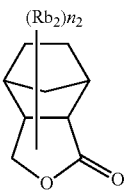

LC1-8

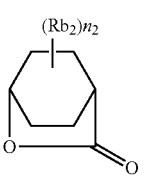

LC1-9

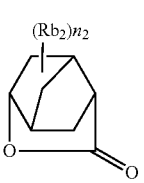

LC1-10

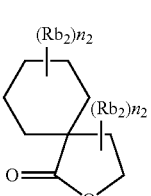

LC1-11

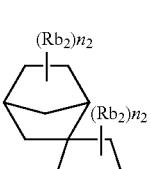

LC1-12

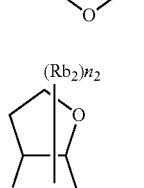

LC1-13

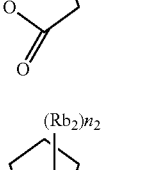

LC1-14

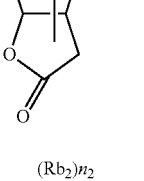

LC1-15

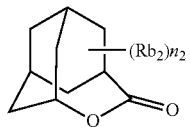

LC1-16

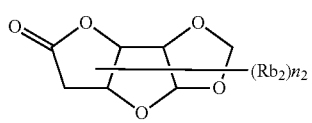

LC1-17

The lactone structure moiety may or may not have a substituent ($Rb_2$). As the substituent ($Rb_2$), an alkyl group having 1 to 8 carbon atoms (a hydrogen atom in the alkyl group may be substituted with a fluorine atom), a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, or an acid-decomposable group is preferable, and an alkyl group having 1 to 4 carbon atoms, a cyano group, or an acid-decomposable group is more preferable. $n_2$ represents an integer of 0 to 4. In a case where $n_2$ is 2 or more, the substituents ($Rb_2$) which are present in plural numbers may be the same as or different from each other and the substituents ($Rb_2$) which are present in plural numbers may be bonded to each other to form a ring.

Specific examples of the repeating unit having a lactone structure represented by any one of Formula (LC1-1), . . . , or Formula (LC1-17) include a repeating unit represented by Formula (AII).

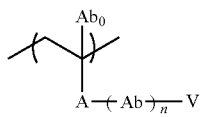

(AII)

In Formula (AII), $Ab_0$ represents a hydrogen atom, a halogen atom, or an alkyl group having 1 to 4 carbon atoms, may have a substituent. As the substituent which may be contained in the alkyl group of $Ab_0$, a hydroxyl group or a halogen atom is preferable. Examples of the halogen atom of $Ab_0$ include a fluorine atom, a chlorine atom, a bromine atom, and an iodine atom. As $Ab_0$, a hydrogen atom, a methyl group, a hydroxymethyl group, or a trifluoromethyl group is preferable, and the hydrogen atom or the methyl group is more preferable.

A represents a —COO— group or a —CONH— group.

Ab represents a single bond, an alkylene group, a divalent linking group having a monocyclic or polycyclic alicyclic hydrocarbon structure, an ether bond, an ester bond, a carbonyl group, an amide bond, a urethane bond, a urea bond, or a divalent linking group formed by combination thereof. Among these, a single bond or a divalent linking group represented by -$Ab_1$-$CO_2$— is preferable.

$Ab_1$ is a linear or branched alkylene group, or a monocyclic or polycyclic cycloalkylene group, and is preferably a methylene group, an ethylene group, a cyclohexylene group, an adamantylene group, or a norbornylene group. n represents an integer of 1 to 5. n is preferably 1 or 2, and more preferably 1.

V represents a group having a structure represented by any one of Formula (LC1-1), . . . , or Formula (LC1-17).

Specific examples of the repeating unit having a lactone structure include the repeating units described in paragraphs 0064 to 0067 of Document A, the contents of which are herein incorporated by reference.

The resin (A) preferably has a repeating unit having a lactone structure represented by Formula (3).

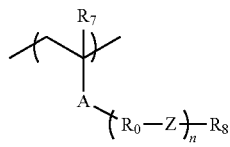

(3)

In Formula (3),

A represents an ester bond (—COO—) or an amide bond (—CONH—).

In a case where a plurality of $R_0$'s are present, $R_0$'s each independently represent an alkylene group, a cycloalkylene group, or a combination thereof.

In a case where a plurality of Z's are present, Z's each independently represent an ether bond, an ester bond, a carbonyl group, an amide bond, a urethane bond, or a urea bond.

$R_8$ represents a monovalent organic group having a lactone structure.

n is a repetition number of the structures represented by —$R_0$—Z— in the repeating unit represented by Formula (3), and represents an integer of 1 to 5. n is preferably 1 or 2, and more preferably 1.

$R_7$ represents a hydrogen atom, a halogen atom, or an alkyl group which may have a substituent.

The alkylene group or cyclic alkylene group represented by $R_0$ may have a substituent.

Z is preferably an ether bond or an ester bond, and more preferably the ester bond.

Examples of the repeating unit having a lactone structure represented by Formula (3) include the repeating units described in paragraph 0079 of Document A, the contents of which are herein incorporated by reference.

As the repeating unit having a lactone structure, a repeating unit represented by Formula (3-1) is more preferable.

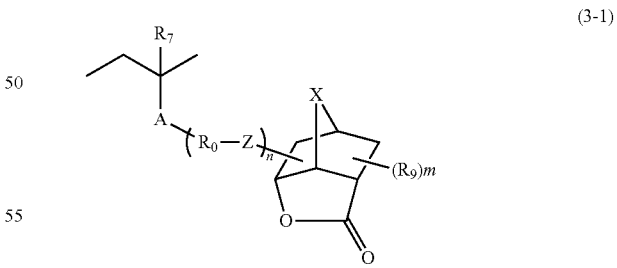

(3-1)

In Formula (3-1), $R_7$, A, $R_0$, Z, and n have the same definitions as in Formula (3).

In a case where a plurality of $R_9$'s are present, $R_9$'s each independently represent an alkyl group, a cycloalkyl group, an alkoxycarbonyl group, a cyano group, a hydroxyl group, or an alkoxy group, and in a case where a plurality of $R_9$'s are present, two of $R_9$'s may be bonded to each other to form a ring.

X represents an alkylene group, an oxygen atom, or a sulfur atom.

m is the number of the substituents and represents an integer of 0 to 5. m is preferably 0 or 1. In a case of m=1, it is preferable that $R_9$ is substituted at the α- or β-position of the carbonyl group of the lactone, and it is more preferable that $R_9$ is substituted at the α-position.

As the alkyl group of $R_9$, an alkyl group having 1 to 4 carbon atoms is preferable, a methyl group or an ethyl group is more preferable, and the methyl group is still more preferable. Examples of the cycloalkyl group include a cyclopropyl group, a cyclobutyl group, a cyclopentyl group, and a cyclohexyl group. Examples of the ester group include a methoxycarbonyl group, an ethoxycarbonyl group, an n-butoxycarbonyl group, and a t-butoxycarbonyl group. Examples of the substituent include an alkoxy group, a hydroxyl group, a cyano group, and a halogen atom. As $R_9$, the methyl group, the cyano group, or the alkoxycarbonyl group is preferable, and the cyano group is more preferable.

Examples of the alkylene group of X include a methylene group and an ethylene group. As X, an oxygen atom or a methylene group is preferable, and the methylene group is more preferable.

Specific examples of the repeating unit containing a lactone structure represented by Formula (3-1) include the repeating units described in paragraphs 0083 and 0084 of Document A, the contents of which are herein incorporated by reference.

In the repeating unit having a lactone group, optical isomers are typically present, but any of the optical isomers may be used. In addition, one optical isomer may be used singly or a mixture of a plurality of the optical isomers may be used. In a case where one optical isomer is mainly used, an optical purity (ee) thereof is preferably 90 or more, and more preferably 95 or more.

The content of the repeating unit having a lactone group is preferably 15% to 60% by mole, more preferably 20% to 50% by mole, and still more preferably 30% to 50% by mole, with respect to all the repeating units in the resin (A).

The resin (A) may have a repeating unit having a hydroxyl group or a cyano group, which is not included in Formulae (AI) and (AII). As the repeating unit having a hydroxyl group or a cyano group, a repeating unit having an alicyclic hydrocarbon structure substituted with a hydroxyl group or a cyano group is preferable. As the alicyclic hydrocarbon structure in the alicyclic hydrocarbon structure substituted with a hydroxyl group or a cyano group, an adamantyl group, a diadamantyl group, or a norbornane group is preferable. As the alicyclic hydrocarbon structure substituted with a hydroxyl group or a cyano group, partial structures represented by Formulae (VIIa) to (VIId) are preferable.

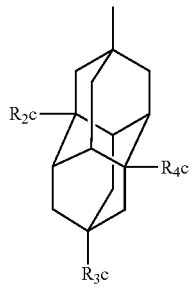

(VIIa)

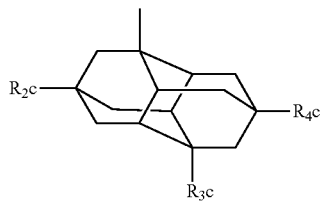

(VIIb)

(VIIc)

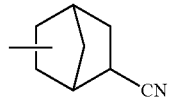

(VIId)

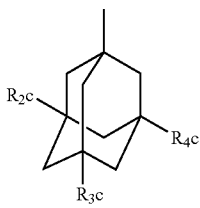

In Formulae (VIIa) to (VIIc), $R_2c$ to $R_4c$ each independently represent a hydrogen atom, a hydroxyl group, or a cyano group. It should be noted that at least one of $R_2c$, . . . , or $R_4c$ represents a hydroxyl group or a cyano group. It is preferable that one or two of $R_2c$ to $R_4c$ are each a hydroxyl group while the other or others are hydrogen atoms. It is more preferable that two of $R_2c$ to $R_4c$ are hydroxyl groups and the other is a hydrogen atom in Formula (VIIa).

Examples of the repeating unit having a partial structure represented by each of Formulae (VIIa) to (VIId) include the repeating units described in paragraphs 0090 and 0091 of Document A, the contents of which are herein incorporated by reference.

The content of the repeating unit having a hydroxyl group or a cyano group is preferably 5% to 40% by mole, more preferably 5% to 30% by mole, and still more preferably 10% to 25% by mole, with respect to all the repeating units in the resin (A).

Examples of the repeating unit having a hydroxyl group or a cyano group include the repeating units described in paragraph 0093 of Document A, the contents of which are herein incorporated by reference.

The resin (A) may have a repeating unit having an alkali-soluble group. Examples of the repeating unit having an alkali-soluble group include the above-mentioned groups. As the repeating unit having an alkali-soluble group, a repeating unit having a carboxyl group is preferable. Above all, examples of the repeating unit having an alkali-soluble group include a repeating unit in which an alkali-soluble group is directly bonded to the main chain of the resin, such as a repeating unit formed from acrylic acid or methacrylic acid. Other examples of the repeating unit include a repeating unit in which an alkali-soluble group is bonded to the main chain of a resin via a linking group. In addition, an aspect in which a polymerization initiator and/or a chain transfer agent having an alkali-soluble group is used during polymerization and introduced into a terminal of a polymer chain. The linking group may have a cyclic hydrocarbon structure which is monocyclic or polycyclic. Among those, the repeating unit derived from acrylic acid or methacrylic acid is preferable.

The resin (A) may further have a repeating unit represented by Formula (I), which has neither a hydroxyl group nor a cyano group.

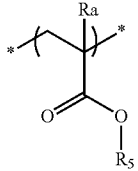
(I)

In Formula (I), $R_5$ represents a hydrocarbon group which has at least one cyclic structure and has neither a hydroxyl group nor a cyano group.

Ra represents a hydrogen atom, an alkyl group, or a —$CH_2$—O—$Ra_2$ group. In the formula, $Ra_2$ represents a hydrogen atom, an alkyl group, or an acyl group. Examples of Ra include a hydrogen atom, a methyl group, a trifluoromethyl group, and a hydroxymethyl group.

The molar ratio of the contents of the respective repeating structural units in the resin (A) is appropriately set in order to adjust dry etching resistance and/or suitability for a standard developer of a resist, adhesiveness to a substrate, a resist profile, and resolving power, heat resistance, and sensitivity, each of which is general required performance of the resist.

In a case where the composition is used for ArF exposure, it is preferable that the resin (A) does not have an aromatic group from the viewpoint of transparency to ArF light.

Furthermore, it is preferable that the resin (A) does not have a fluorine atom and a silicon atom.

The resin (A) can be synthesized in accordance with an ordinary method (for example, radical polymerization).

The weight-average molecular weight of the resin (A) as a value in terms of polystyrene by a gel permeation chromatography (GPC) method is preferably 1,000 to 200,000, and more preferably 2,000 to 20,000.

The content of the resin (A) in the composition is not particularly limited, but is preferably 50% to 99% by mass, and more preferably 70% to 98% by mass, with respect to a total solid content of the composition.

In addition, the total solid content of the composition is intended to mean components excluding solvents in the composition.

The resin (A) may be used singly or in combination of a plurality of kinds thereof.

<Compound B that Generates Acid Upon Irradiation with Actinic Rays or Radiation>

The composition includes a compound that generates an acid upon irradiation with actinic rays or radiation (hereinafter also referred to as an "acid generator").

As the acid generator, known compounds may be mentioned.

Examples of the acid generator include a diazonium salt, a phosphonium salt, a sulfonium salt, an iodonium salt, imidosulfonate, oxime sulfonate, diazodisulfone, disulfone, and o-nitrobenzyl sulfonate.

As the acid generator, a compound represented by Formula (ZI), (ZII), or (ZIII) is preferable.

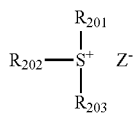
(ZI)

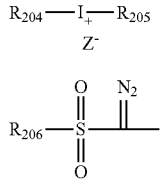
(ZII)

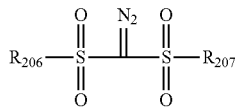
(ZIII)

In Formula (ZI), $R_{201}$, $R_{202}$, and $R_{203}$ each independently represent an organic group.

The number of carbon atoms of the organic group as each of $R_{201}$, $R_{202}$, and $R_{203}$ is preferably 1 to 30, and more preferably 1 to 20.

Furthermore, two of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two of $R_{201}$ to $R_{203}$ include an alkylene group (for example, a butylene group and a pentylene group).

$Z^-$ represents a non-nucleophilic anion.

Examples of the non-nucleophilic anion represented by $Z^-$ include a sulfonate anion, a carboxylate anion, a sulfonylimide anion, a bis(alkylsulfonyl)imide anion, and a tris(alkylsulfonyl)methyl anion.

The non-nucleophilic anion is an anion having a noticeably low ability for causing a nucleophilic reaction, and is also an anion that can suppress temporal decomposition caused by an intra-molecular nucleophilic reaction.

Examples of the compound represented by Formula (ZI) include a compound (ZI-1), a compound (ZI-2), and a compound (ZI-3) which will each be described below.

The compound (ZI-1) is an arylsulfonium compound, that is, a compound having arylsulfonium as a cation, in which at least one of $R_{201}$, . . . , or $R_{203}$ in Formula (ZI) is an aryl group.

The compound (ZI-2) is a compound in which $R_{201}$ to $R_{203}$ in Formula (ZI) each independently represent an organic group not having an aromatic ring. Here, the aromatic ring also encompasses an aromatic ring including a heteroatom.

The compound (ZI-3) is a compound represented by Formula (ZI-3), which includes a phenacylsulfonium salt structure.

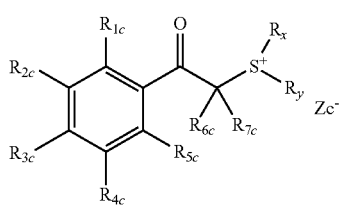
(ZI-3)

In Formula (ZI-3), $R_{1c}$ to $R_{5c}$ each independently represent a hydrogen atom, an alkyl group, a cycloalkyl group, an alkoxy group, or a halogen atom.

$R_{6c}$ and $R_{7c}$ each independently represent a hydrogen atom, an alkyl group, or a cycloalkyl group.

$R_x$ and $R_y$ each independently represent an alkyl group, a cycloalkyl group, an allyl group, or a vinyl group.

Any two or more of $R_{1c}, \ldots,$ or $R_{5c}$, $R_{6c}$ and $R_{7c}$, and $R_x$ and $R_y$ may be bonded to each other to form a ring structure, and the ring structure may include an oxygen atom, a sulfur atom, an ester bond, or an amide bond. Examples of the group formed by the bonding of any two or more of $R_{1c}, \ldots,$ or $R_{5c}$, $R_{6c}$ and $R_{7c}$, and $R_x$ and $R_y$ include a butylene group and a pentylene group.

$Zc^-$ represents a non-nucleophilic anion, and examples thereof include the same non-nucleophilic anions as $Z^-$ in Formula (ZI).

In Formulae (ZII) an (ZIII), $R_{204}$ to $R_{207}$ each independently represent an aryl group, an alkyl group, or a cycloalkyl group.

The aryl group of each of $R_{204}$ to $R_{207}$ is preferably a phenyl group or a naphthyl group, and more preferably a phenyl group. The aryl group of each of $R_{204}$ to $R_{207}$ may be an aryl group having a heterocyclic structure including an oxygen atom, a nitrogen atom, a sulfur atom, or the like. Examples of the aryl group including a heterocyclic structure include a pyrrole residue (a group formed by loss of one hydrogen atom from pyrrole), a furan residue (a group formed by loss of one hydrogen atom from furan), a thiophene residue (a group formed by loss of one hydrogen atom from thiophene), an indole residue (a group formed by loss of one hydrogen atom from indole), a benzofuran residue (a group formed by loss of one hydrogen atom from benzofuran), and a benzothiophene residue (a group formed by loss of one hydrogen atom from benzothiophene).

$Z^-$ represents a non-nucleophilic anion, and examples thereof include the same non-nucleophilic anions as the non-nucleophilic anions of $Z^-$ in Formula (ZI). Examples of the acid generator further include a compound represented by Formula (ZIV), Formula (ZV), or Formula (ZVI).

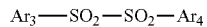
(ZIV)
Ar₃—SO₂—SO₂—Ar₄

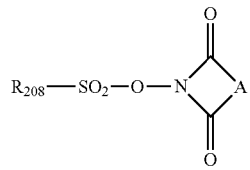
(ZV)

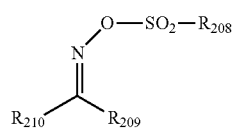
(ZVI)

In Formulae (ZIV) to (ZVI), $Ar_3$ and $Ar_4$ each independently represent an aryl group.

$R_{208}$, $R_{209}$, and $R_{210}$ each independently represent an alkyl group, a cycloalkyl group, or an aryl group.

A represents an alkylene group, an alkenylene group, or an arylene group.

As the acid generator, the compounds represented by Formulae (ZI) to (ZIII) are preferable.

Furthermore, as the acid generator, a compound that generates an acid including one sulfonic acid group or imido group is preferable, a compound that generates a monovalent perfluoroalkanesulfonic acid, a compound that generates an aromatic sulfonic acid substituted with a monovalent fluorine atom or a group including a fluorine atom, or a compound that generates an imide acid substituted with a monovalent fluorine atom or a group including a fluorine atom is more preferable, and a sulfonium salt of fluoro-substituted alkanesulfonic acid, fluorine-substituted benzenesulfonic acid, fluorine-substituted imide acid, or fluorine-substituted methide acid is still more preferable.

In addition, as the acid generator, a fluoro-substituted alkanesulfonic acid, a fluoro-substituted benzenesulfonic acid, or a fluoro-substituted imide acid, each of which has a pKa of an acid generated of pKa=−1 or less, is also preferable.

Particularly preferred examples out of the acid generators are shown below.

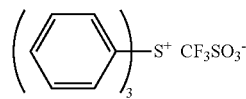
(z1)

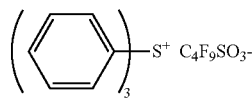
(z2)

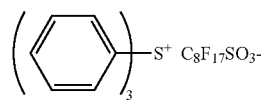
(z3)

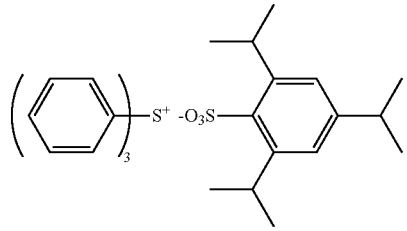
(z4)

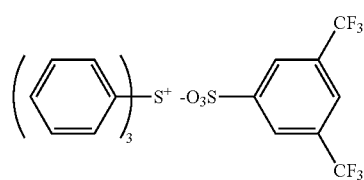
(z5)

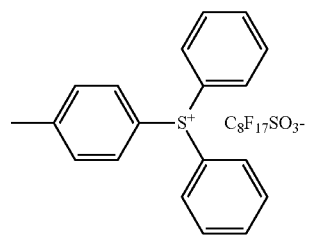
(z6)

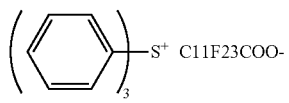 (z7)
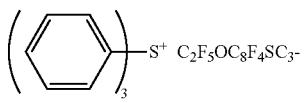 (z8)
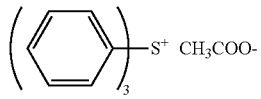 (z9)
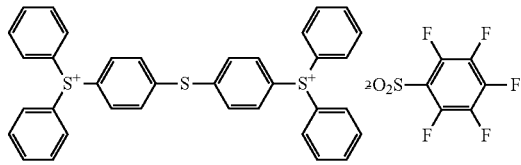 (z10)
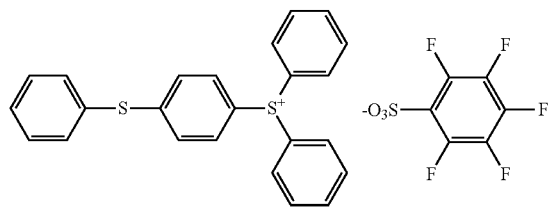 (z11)
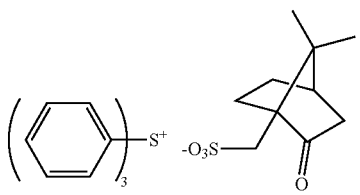 (z12)
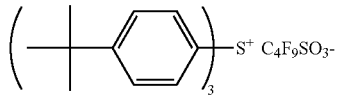 (z13)
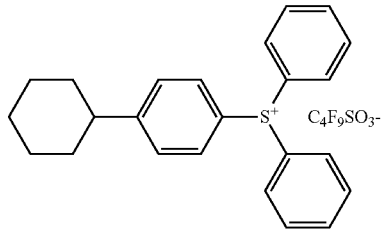 (z14)
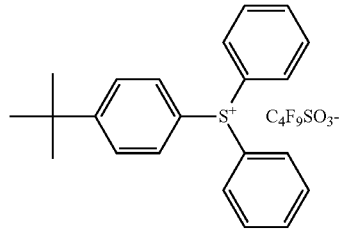 (z15)
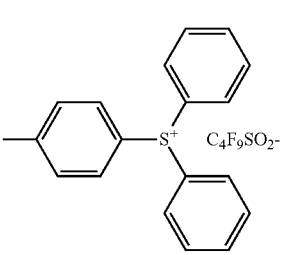 (z16)
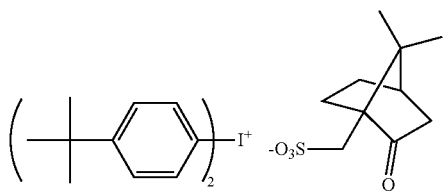 (z17)
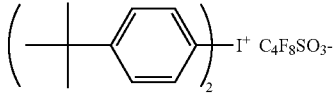 (z18)
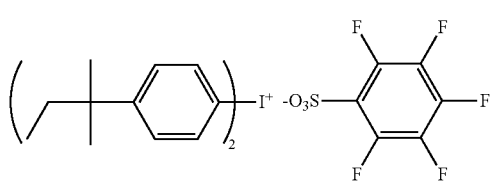 (z19)
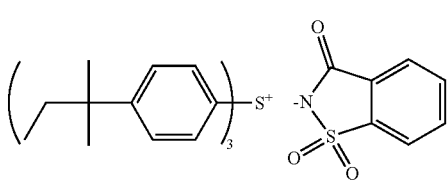 (z20)
 (z21)
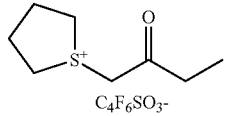 (z22)

-continued
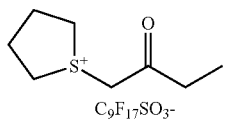
(z23)
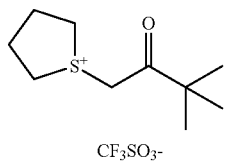
(z24)
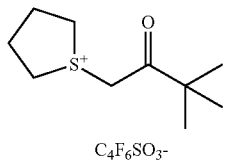
(z25)
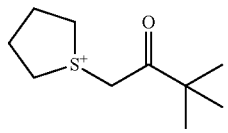
(z26)
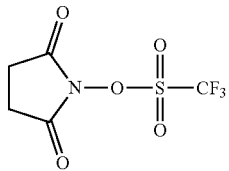
(z28)
(z27)
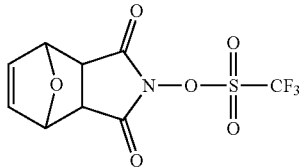
(z29)
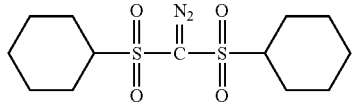
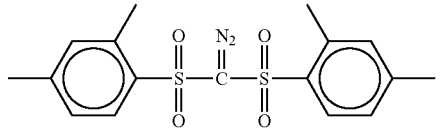
(z30)
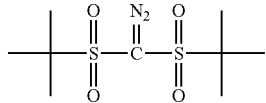
(z32)
(z31)
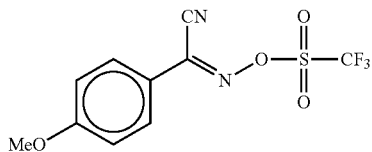
(z33)
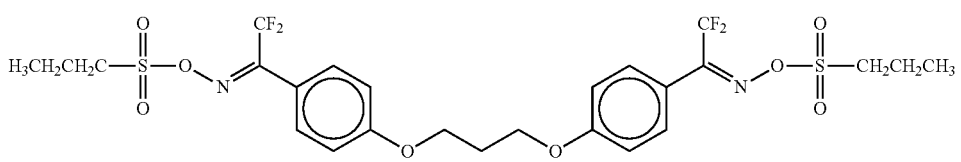
(z34)
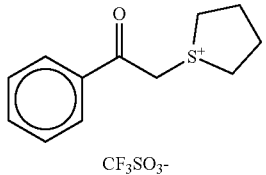
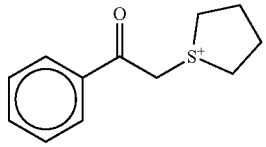
(z36)
(z35)
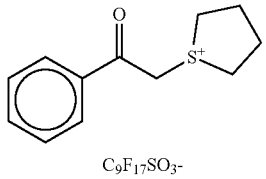
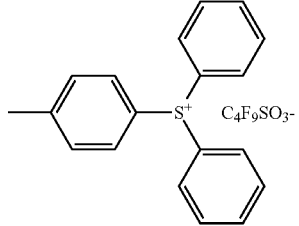
(z38)
(z37)

-continued
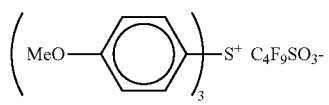 (z39)
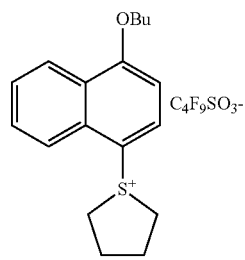 (z40)
 (z41)
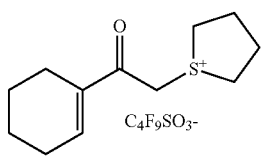 (z42)
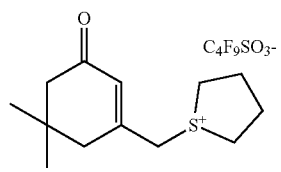 (z43)
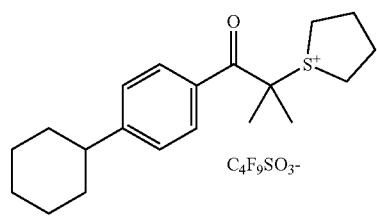 (z44)
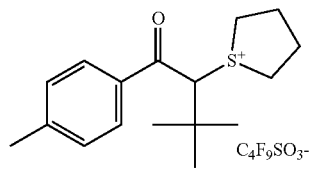 (z45)
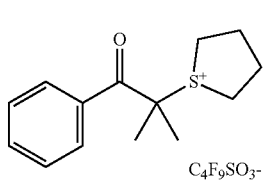 (z46)
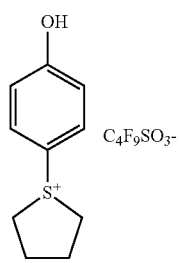 (z47)
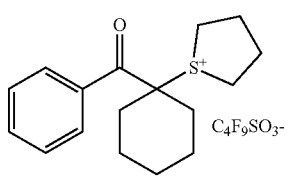 (z48)
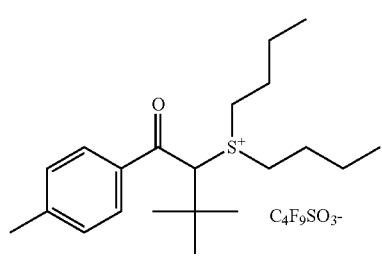 (z49)
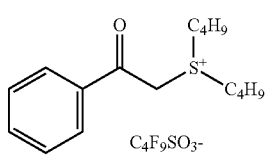 (z50)
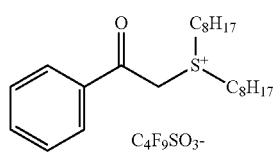 (z51)
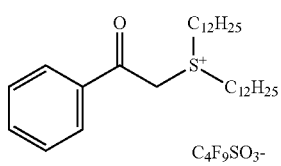 (z52)

-continued
(z53) 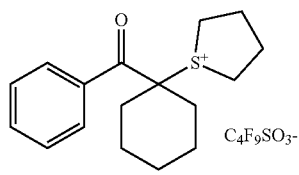
(z54) 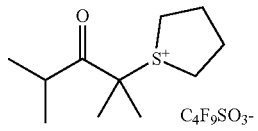
(z55) 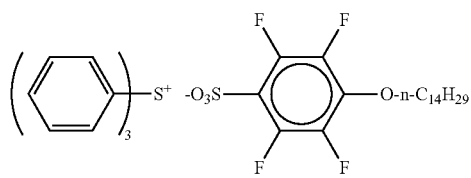
(z56) 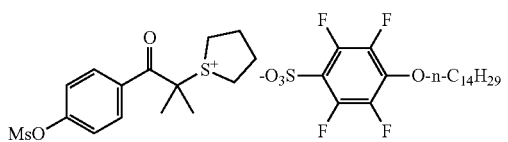
(z57) 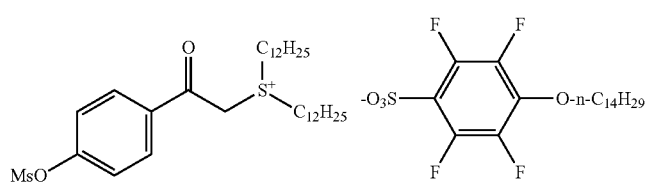
(z58) 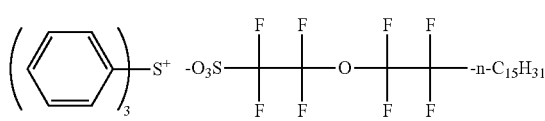
(z59) 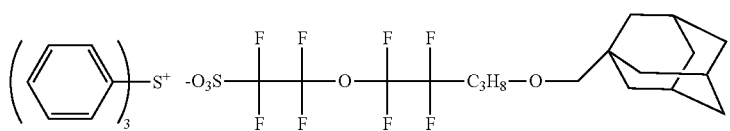
(z60) 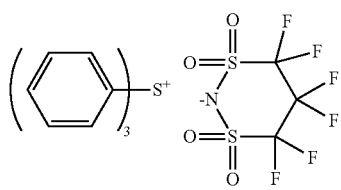
(z61) 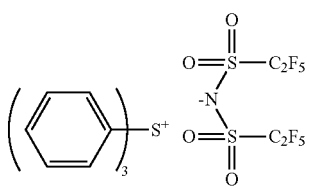
(z62) 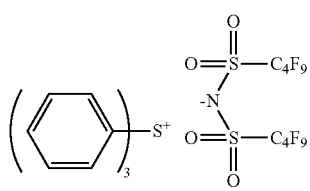
(z63) 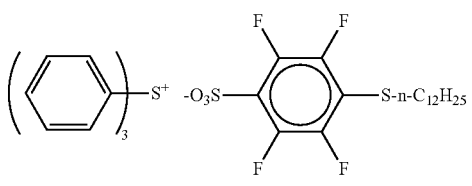
(z64) 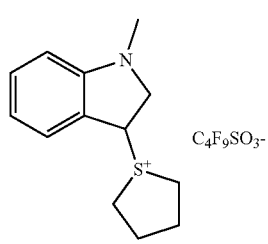
(z65) 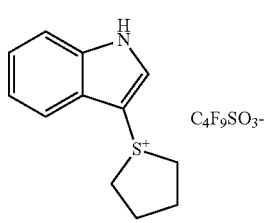
(z66) 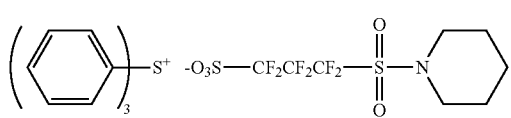
(z67) 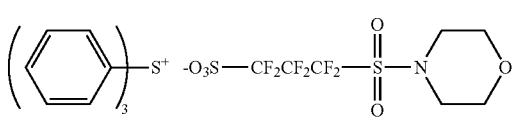

-continued
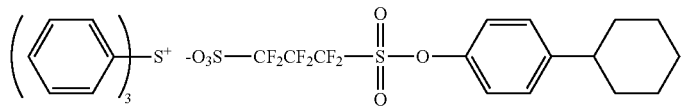
(z68)
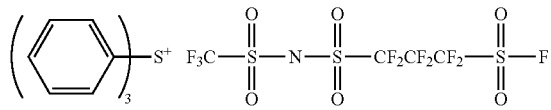
(z69)
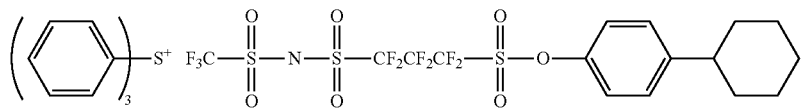
(z70)
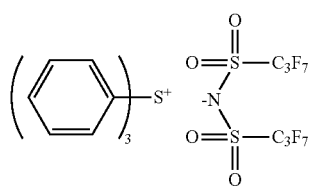
(z71)
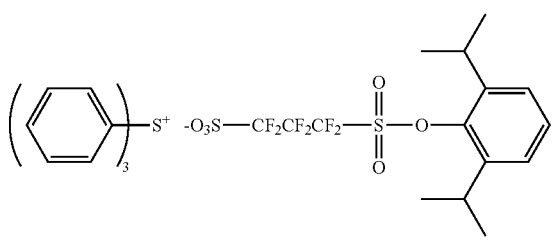
(z72)
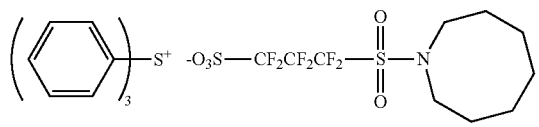
(z73)
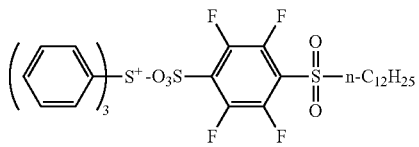
(z74)
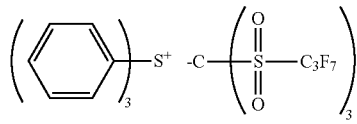
(z75)
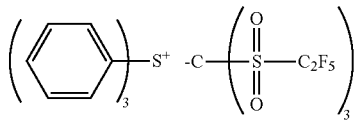
(z76)
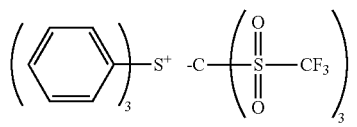
(z77)
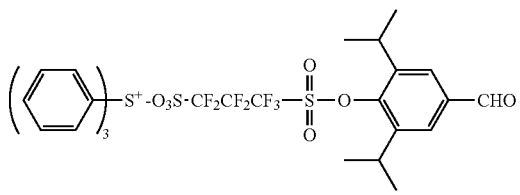
(z78)
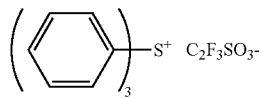
(z79)
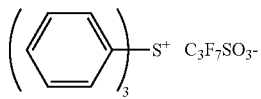
(z80)
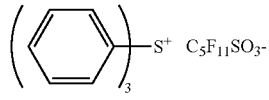
(z81)
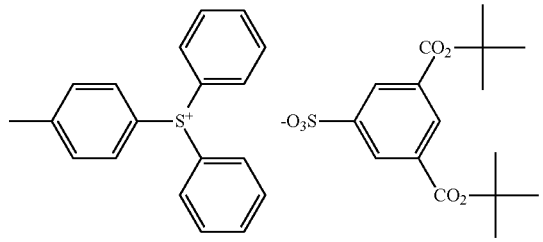
(z82)

-continued
(z83)
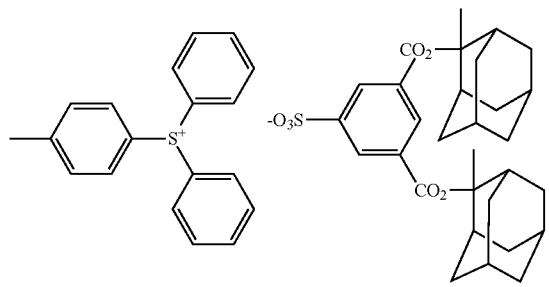
(z84)
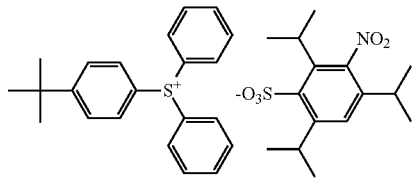
(z85)
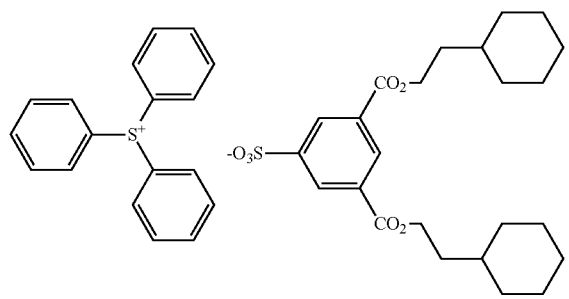
(z86)
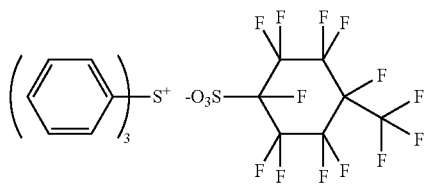
(z87)
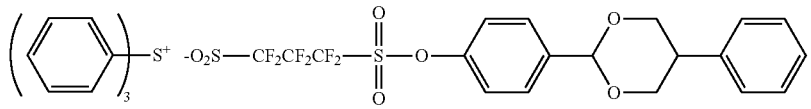
(z88)
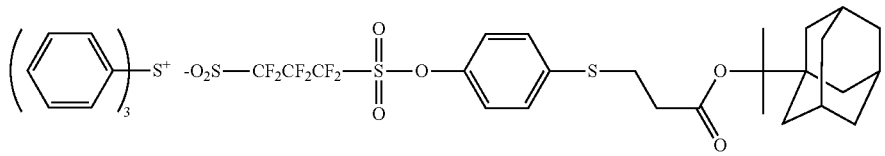
(z89)
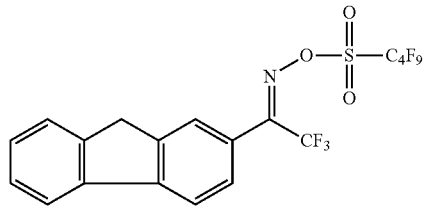
(z90)
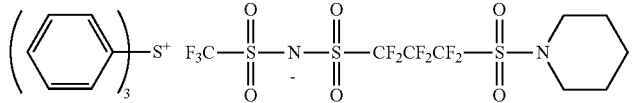
(z91)
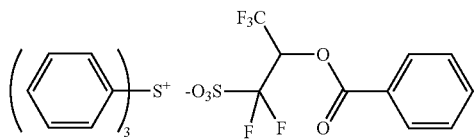

The content of the acid generator in the composition is preferably 0.1% to 20% by mass, and more preferably 0.5 to 15% by mass, with respect to a total solid content of the composition.

The acid generators can be used singly or in combination of two or more kinds thereof.

<Ester Compound>

The ester compound is a compound having an ester bond, which has alkali decomposability and has a molecular weight of 50 or more and less than 1,500.

An expression, "the ester compound has alkali decomposability" means that in a case where 100 mg of the ester compound is added to a mixed liquid of 2 mL of a buffer solution with pH 10 and 8 mL of tetrahydrofuran (THF) and left to stand at 40° C., 30% by mole or more of a total amount of the ester bonds contained in the ester compound is hydrolyzed after 10 minutes. In addition, the decomposition rate can be calculated from a ratio of a raw material to a decomposition product, obtained by nuclear magnetic resonance (NMR) analysis.

The molecular weight of the ester compound is 50 or more and less than 1,500. Above all, from the viewpoint that at least one effect of enhancement of DOF, improvement in a water tracking property, suppression of pattern collapse, enhancement of line edge roughness, suppression of scum, of suppression of development defects is obtained (hereinafter also referred to as "the viewpoint that the effects of the present invention are more excellent"), the molecular weight of the ester compound is preferably 150 or more, more preferably 200 or more, and still more preferably 300 or more, and also preferably 1,000 or less, and more preferably 600 or less. Examples of the range include a range of 150 to 1,000, and the range is preferably 300 to 1,000, and more preferably 300 to 600.

The C log P value of the ester compound is not particularly limited, but is 1 to 12 in many cases, and from the viewpoint that the effects of the present invention are more excellent, the C log P value is preferably 3 to 11.

The C log P value is a calculated value of Log P expressed in a common logarithm log P of a partition coefficient P in water-n-octanol, and used as an index indicating a hydrophilicity/hydrophobicity degree of a substance. The C log P of the ester compound can be calculated by using, for example, ChemDraw Ultra 8.0, software from Cambridge Soft Corporation.

From the viewpoint that the effects of the present invention are more excellent, it is preferable that the ester compound has at least one or more electron-withdrawing groups. The number of the electron-withdrawing groups is not particularly limited, but is preferably 1 to 5, and more preferably 1 to 4.

Examples of the electron-withdrawing group include known electron-withdrawing groups, and the electron-withdrawing group is preferably a halogenated alkyl group, a halogen atom, a cyano group, a nitro group, or a group represented by —COO—Rb (Rb represents an alkyl group), and more preferably the halogenated alkyl group.

In addition, examples of the halogen atom in the halogenated alkyl group include a fluorine atom, a chlorine atom, a bromine atom, and an iodine atom.

The ester compound preferably has a partial structure represented by Formula (A). * represents a bonding position. An ester compound having the following partial structure has alkali decomposability.

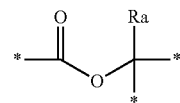

Formula (A)

In Formula (A), Ra represents an electron-withdrawing group. Suitable aspects of the electron-withdrawing group are as described above.

As the ester compound, a compound represented by Formula (B) is preferable.

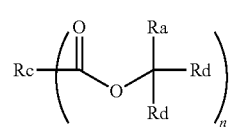

Formula (B)

In Formula (B), Ra represents an electron-withdrawing group. Suitable aspects of the electron-withdrawing group are as described above.

Rc represents an n-valent hydrocarbon group. The number of carbon atoms in the hydrocarbon group is not particularly limited, but from the viewpoint that the effects of the present invention are excellent, the number of carbon atoms is preferably 2 to 25, and more preferably 3 to 20.

The hydrocarbon group may be either chained or cyclic. Among those, from the viewpoint that the effects of the present invention are more excellent, a chained hydrocarbon group is preferable. The chained hydrocarbon group may be either linear or branched.

In addition, n represents an integer of 1 to 3, as described later, and in a case where n is 1, Rc represents a monovalent hydrocarbon group (preferably an alkyl group), and in a case where n is 2, Rc represents a divalent hydrocarbon group (preferably an alkylene group).

Rd's each independently represent a hydrogen atom or a substituent.

Examples of a substituent include a halogen atoms such as a fluorine atom, a chlorine atom, a bromine atom, and an iodine atom; an alkoxy group such as a methoxy group, an ethoxy group, and a tert-butoxy group; an aryloxy group such as a phenoxy group and a p-tolyloxy group; an alkoxycarbonyl group such as a methoxycarbonyl group, a butoxycarbonyl group, and a phenoxycarbonyl group; an acyloxy group such as an acetoxy group, a propionyloxy group, and a benzoyloxy group; an acyl group such as an acetyl group, a benzoyl group, an isobutyryl group, an acryloyl group, a methacryloyl group, and a methoxalyl group; an alkylsulfanyl group such as a methylsulfanyl group and a tert-butylsulfanyl group; an arylsulfanyl group such as a phenylsulfanyl group and a p-tolylsulfanyl group; an alkyl group; a cycloalkyl group; an aryl group; a heteroaryl group; a hydroxyl group; a carboxyl group; a formyl group; a sulfo group; a cyano group; an alkylaminocarbonyl group; an arylaminocarbonyl group; a sulfonamido group; a silyl group; an amino group; a monoalkylamino group; a dialkylamino group; an arylamino group; and combinations thereof.

Among those, from the viewpoint that the effects of the present invention are more excellent, it is preferable that at least one of Rd's is an electron-withdrawing group. A suitable aspect of the electron-withdrawing group is as described above.

n represents an integer of 1 to 3. n is preferably 1 or 2.

The content of the ester compound in the composition is preferably 0.1% to 20% by mass, more preferably 0.5% to 8.0% by mass, and still more preferably 1.0% to 6.0% by mass, with respect to a total solid content of the composition.

The ester compounds may be used singly or in combination of two or more kinds thereof.

<Fluorine-Containing Polymer>

The composition includes a fluorine-containing polymer. By incorporating the fluorine-containing polymer into the composition, the fluorine-containing polymer is unevenly distributed on the surface layer of the resist film formed from the composition, and in a case where the liquid immersion medium is water, it is possible to increase the receding contact angle of the film surface with respect to water and enhance the immersion water tracking property.

The fluorine-containing polymer is a polymer having a fluorine atom, and a fluorine atom may be included in the main chain or a side chain of the polymer.

The fluorine-containing polymer is preferably a polymer having an alkyl group having a fluorine atom, a cycloalkyl group having a fluorine atom, or an aryl group having a fluorine atom as a partial structure having a fluorine atom.

The alkyl group having a fluorine atom is a linear or branched alkyl group in which at least one hydrogen atom is substituted with a fluorine atom, preferably has 1 to 10 carbon atoms, and more preferably has 1 to 4 carbon atoms.

The cycloalkyl group having a fluorine atom is a monocyclic or polycyclic cycloalkyl group in which at least one hydrogen atom is substituted with a fluorine atom.

Examples of the aryl group having a fluorine atom include an aryl group in which at least one hydrogen atom is substituted with a fluorine atom, such as a phenyl group and a naphthyl group.

As the alkyl group having a fluorine atom, the cycloalkyl group having a fluorine atom, and the aryl group having a fluorine atom, groups represented by Formulae (F2) to (F4) are preferable.

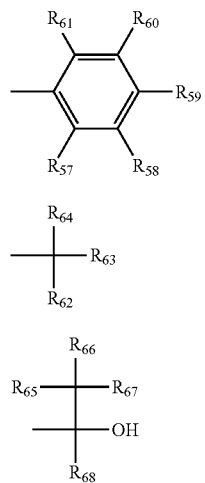

In Formulae (F2) to (F4), $R_{57}$ to $R_{68}$ each independently represent a hydrogen atom, a fluorine atom, or an (linear or branched) alkyl group. It should be noted that at least one of $R_{57}$, ..., or $R_{61}$, at least one of $R_{62}$, ..., or $R_{64}$, and at least one of $R_{65}$, ..., or $R_{68}$ each independently represent a fluorine atom or an alkyl group in which at least one hydrogen atom is substituted with a fluorine atom.

It is preferable that all of $R_{57}$ to $R_{61}$, and $R_{65}$ to $R_{67}$ are fluorine atoms. $R_{62}$, $R_{63}$, and $R_{68}$ are each preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be linked to each other to form a ring.

Among those, from the viewpoint that the effects of the present invention are more excellent, it is preferable that the fluorine-containing polymer has alkali decomposability.

The expression, "the fluorine-containing polymer has alkali decomposability" means that after 10 minutes from adding 100 mg of a fluorine-containing polymer to a mixed liquid of 2 mL of a buffer solution with pH 10 and 8 mL of THF and leaving the mixture to stand at 40° C., 30% or more of a total amount of the decomposable groups in the fluorine-containing polymer is hydrolyzed. Further, the decomposition rate can be calculated from a ratio of the raw materials to the decomposed products by means of NMR analysis.

The fluorine-containing polymer preferably has a repeating unit represented by Formula (X).

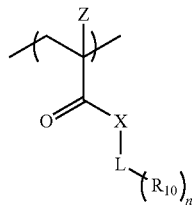

Formula (X)

In Formula (X), Z represents a halogen atom, a group represented by $R_{11}OCH_2$—, or a group represented by $R_{12}OC(=O)CH_2$—. $R_{11}$ and $R_{12}$ each independently represent a substituent. X represents an oxygen atom or a sulfur atom. L represents an (n+1)-valent linking group. $R_{10}$ represents a group having a group whose solubility in an aqueous alkali solution increases through decomposition by the action of the aqueous alkali solution. n represents a positive integer. In a case where n is 2 or more, a plurality of R's may be the same as or different from each other.

Examples of the halogen atom of Z include a fluorine atom, a chlorine atom, a bromine atom, and an iodine atom, and the fluorine atom is preferable.

Examples of the substituent as each of the $R_{11}$ and $R_{12}$ include an alkyl group (preferably having 1 to 4 carbon atoms), a cycloalkyl group (preferably having 6 to 10 carbon atoms), and an aryl group (preferably having 6 to 10 carbon atoms). Further, the substituent as each of the $R_{11}$ and $R_{12}$ may further have a substituent, and examples of such additional substituent include an alkyl group (preferably having 1 to 4 carbon atoms), a halogen atom, a hydroxyl group, an alkoxy group (preferably having 1 to 4 carbon atoms), and a carboxyl group.

The linking group as L is preferably a divalent or trivalent linking group (in other words, n is preferably 1 or 2), and more preferably the divalent linking group (in other words, n is preferably 1). The linking group as L is preferably a linking group selected from the group consisting of an aliphatic group, an aromatic group, and a combination thereof.

For example, in a case where n is 1 and the linking group as L is a divalent linking group, examples of the divalent aliphatic group include an alkylene group, an alkenylene group, an alkynylene group, and a polyalkyleneoxy group. Among those, the alkylene group or the alkenylene group is preferable, and the alkylene group is more preferable.

The divalent aliphatic group may have either a chained structure or a cyclic structure, but preferably has the chained structure rather than the cyclic structure, and preferably has a linear structure rather than the branch-chained structure. The divalent aliphatic group may have a substituent and examples of the substituent include a halogen atom (a fluorine atom, a chlorine atom, a bromine atom, or an iodine atom), a hydroxyl group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, an arylamino group, and a diarylamino group.

Examples of the divalent aromatic group include an arylene group. Among those, the phenylene group and the naphthylene group are preferable.

The divalent aromatic group may have a substituent, and examples thereof include an alkyl group, in addition to the examples of the substituent with regard to the divalent aliphatic group.

In addition, L may be a divalent group formed by removing two or more hydrogen atoms at any position from the structure represented by each of Formula (LC1-1) to Formula (LC1-17) as described above.

In a case where n is 2 or more, specific examples of the (n+1)-valent linking group include groups formed by removing any (n-1) hydrogen atoms from the specific examples of the divalent linking group as described above.

Specific examples of L include the following linking groups.
—CH$_2$—  —CH$_2$CH$_2$—  —CH$_2$CH$_2$CH$_2$—
—CH$_2$CH$_2$CH$_2$—
—CH$_2$CH$_2$CH$_2$CH$_2$—  —CH$_2$CH$_2$CH$_2$CH$_2$CH$_2$CH$_2$—

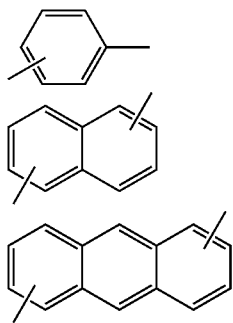

Moreover, these linking groups may further have a substituent as described above.

As R$_{10}$, a group represented by Formula (W) is preferable.

—Y—R$_{20}$  Formula (W)

In Formula (W), Y represents a group whose solubility in an aqueous alkali solution increases through decomposition by the action of the aqueous alkali solution. R$_{20}$ represents an electron-withdrawing group.

Examples of Y include a carboxylic acid ester group (—COO— or OCO—), an acid anhydride group (—C(O)OC(O)—), an acid imido group (—NHCONH—), a carboxylic acid thioester group (—COS—), a carbonic acid ester group (—OC(O)O—), a sulfuric acid ester group (—OSO$_2$O—), and a sulfonic acid ester group (—SO$_2$O—), and the carboxylic acid ester group is preferable.

As the electron-withdrawing group, a partial structure represented by Formula (EW) is preferable. * in Formula (EW) represents the number of bonds directly linked to a group Y in Formula (W).

(EW)

In Formula (EW), n$_{ew}$ is a repetition number of the linking groups represented by —C(R$_{ew1}$)(R$_{ew2}$)— and represents an integer of 0 or 1. A case where n$_{ew}$ is 0 indicates that the bonding is formed by a single bond and Y$_{ew1}$ is directly bonded.

Examples of Y$_{ew1}$ include a halogen atom, a cyano group, a nitro group, a halo(cyclo)alkyl group or haloaryl group represented by —C(R$_{f1}$)(R$_{f2}$)—R$_{f3}$ which will be described later, an oxy group, a carbonyl group, a sulfonyl group, a sulfinyl group, and a combination thereof. (It should be noted that in a case where Y$_{ew1}$ is a halogen atom, a cyano group, or a nitro group, n$_{ew}$ is 1.)

R$_{ew1}$ and R$_{ew2}$ each independently represent any group, for example, a hydrogen atom, an alkyl group (preferably having 1 to 8 carbon atoms), a cycloalkyl group (preferably having 3 to 10 carbon atoms), or an aryl group (preferably having 6 to 10 carbon atoms).

At least two of R$_{ew1}$, R$_{ew2}$, or Y$_{ew1}$ may be linked to each other to form a ring.

In addition, the "halo(cyclo)alkyl group" represents an alkyl group or cycloalkyl group which is at least partially halogenated, and the "haloaryl group" represents an aryl group which is at least partially halogenated.

As Y$_{ew1}$, a halogen atom, a halo(cyclo)alkyl group represented by —C(R$_{f1}$)(R$_{f2}$)—R$_{f3}$, or a haloaryl group is preferable.

R$_{f1}$ represents a halogen atom, a perhaloalkyl group, a perhalocycloalkyl group, or a perhaloaryl group, and is preferably a fluorine atom, a perfluoroalkyl group, or a perfluorocycloalkyl group, and more preferably the fluorine atom or the trifluoromethyl group.

R$_{f2}$ and R$_{f3}$ each independently represent a hydrogen atom, a halogen atom, or an organic group, and R$_{f2}$ and R$_{f3}$ may be linked to each other to form a ring. Examples of the organic group include an alkyl group, a cycloalkyl group, and an alkoxy group, and these may be substituted with a halogen atom (preferably a fluorine atom). It is preferable that R$_{f2}$ and R$_{f3}$ are each a (halo)alkyl group or a (halo)cycloalkyl group. It is more preferable that R$_{f2}$ represents the same group as R$_{f1}$ or is linked to R$_{f3}$ to form a ring.

Examples of the ring formed by the linking of R$_{f2}$ and R$_{f3}$ include a (halo)cycloalkyl ring.

The (halo)alkyl group in R$_{f1}$ to R$_{f3}$ may be either linear or branched, and the linear (halo)alkyl group preferably has 1 to 30 carbon atoms, and more preferably 1 to 20 carbon atoms.

The (halo)cycloalkyl group in R$_{f1}$ to R$_{f3}$, or the ring formed by the linking of R$_{f2}$ and R$_{f3}$ may be either monocyclic or polycyclic. In a case where the (halo)cycloalkyl group is polycyclic, the (halo)cycloalkyl group may be bridged. That is, in this case, the (halo)cycloalkyl group may have a crosslinked structure.

Examples of these (halo)cycloalkyl groups include those represented by the following formulae, and groups formed by halogenating the groups. Further, some of carbon atoms in the cycloalkyl group may be substituted with heteroatoms such as an oxygen atom.

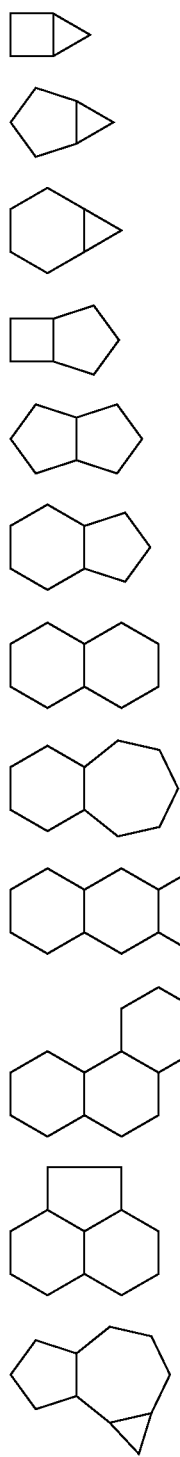

(1)
(2)
(3)
(4)
(5)
(6)
(7)
(8)
(9)
(10)
(11)
(12)

-continued

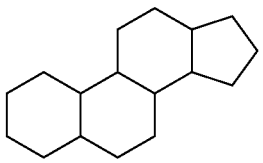

(13)

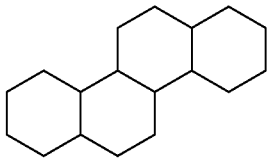

(14)

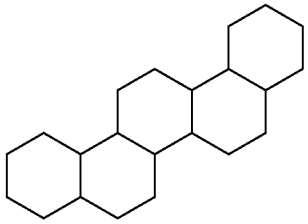

(15)

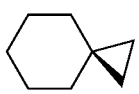

(16)

(17)

(18)

(19)

(20)

(21)

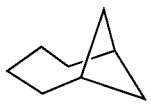

(22)

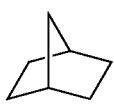

(23)

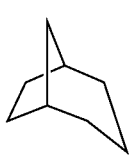

(24)

-continued
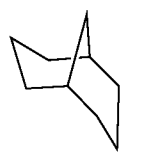 (25)
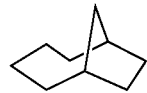 (26)
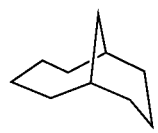 (27)
 (28)
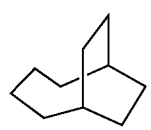 (29)
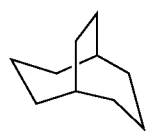 (30)
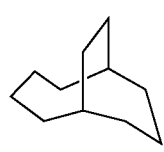 (31)
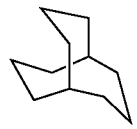 (32)
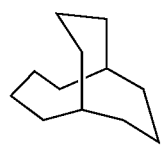 (33)
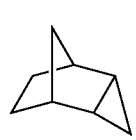 (34)
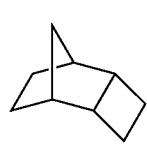 (35)
-continued
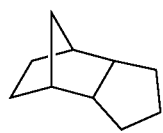 (36)
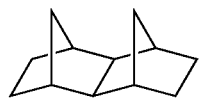 (37)
(38)
 (39)
 (40)
 (41)
 (42)
 (43)
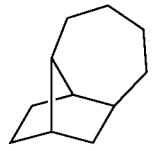 (44)
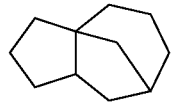 (45)
(46)
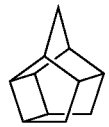 (47)
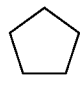 (48)

-continued (49)

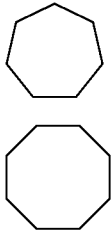

(50)

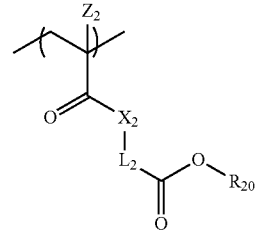
Formula (X-1)

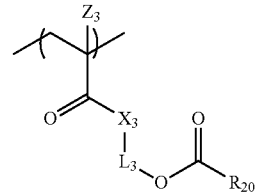
Formula (X-2)

As the (halo)cycloalkyl group in $R_{f2}$ and $R_{f3}$, or a ring formed by the linking of $R_{f2}$ and $R_{f3}$, a fluorocycloalkyl group represented by $-C_{(n)}F_{(2n-2)}H$ is preferable. Here, the number of carbon atoms, n, is not particularly limited, but is preferably 5 to 13, and more preferably 6.

Examples of the (per)haloaryl group in $Y_{ew1}$ or $R_{f1}$ include a perfluoroaryl group represented by $-C_{(n)}F_{(n-1)}$. Here, the number of carbon atoms, n, is not particularly limited, but is preferably 5 to 13, and more preferably 6.

As a ring formed by the linking of at least two of $R_{ew1}$, $R_{ew2}$, or $Y_{ew1}$, a cycloalkyl group or a heterocyclic group is preferable.

Each of the groups and the rings constituting the partial structure represented by Formula (EW) may further have a substituent.

In Formula (W), $R_{20}$ is preferably an alkyl group substituted with one or more selected from the group consisting of a halogen atom, a cyano group, and a nitro group, more preferably an alkyl group substituted with a halogen atom (haloalkyl group), and still more preferably a fluoroalkyl group. The alkyl group substituted with one or more selected from the group consisting of a halogen atom, a cyano group, and a nitro group preferably has 1 to 10 carbon atoms, and more preferably 1 to 5 carbon atoms.

More specifically, $R_{20}$ is preferably an atomic group represented by $-C(R'_1)(R'_{f1})(R'_{f2})$ or $-C(R'_1)(R'_2)(R'_{f1})$. $R'_1$ and $R'_2$ each independently represent a hydrogen atom, or an alkyl group not substituted with an electron-withdrawing group (preferably an unsubstituted alkyl group). $R'_{f1}$ and $R'_{f2}$ each independently represent a halogen atom, a cyano group, a nitro group, or a perfluoroalkyl group.

The alkyl group as each of $R'_1$ and $R'_2$ may be either linear or branched, and preferably has 1 to 6 carbon atoms.

The perfluoroalkyl group as each of $R'_{f1}$ and $R'_{f2}$ may be either linear or branched, and preferably has 1 to 6 carbon atoms.

Specific preferred examples of $R_{20}$ include $-CF_3$, $-C_2F_5$, $-C_3F_7$, $-C_4F_9$, $-CF(CF_3)_2$, $-CF(CF_3)C_2F_5$, $-CF_2CF(CF_3)_2$, $-C(CF_3)_3$, $-C_5F_{11}$, $-C_6F_{13}$, $-C_7F_{15}$, $-C_8F_{17}$, $-CH_2CF_3$, $-CH_2C_2F_5$, $-CH_2C_3F_7$, $-CH(CF_3)_2$, $-CH(CF_3)C_2F_5$, $-CH_2CF(CF_3)_2$, and $-CH_2CN$. Among those, $-CF_3$, $-C_2F_5$, $-C_3F_7$, $-C_4F_9$, $-CH_2CF_3$, $-CH_2C_2F_5$, $-CH_2C_3F_7$, $-CH(CF_3)_2$, or $-CH_2CN$ is preferable, $-CH_2CF_3$, $-CH_2C_2F_5$, $-CH_2C_3F_7$, $-CH(CF_3)_2$, or $-CH_2CN$ is more preferable, $-CH_2C_2F_5$, $-CH(CF_3)_2$, or $-CH_2CN$ is still more preferable, and $-CH_2C_2F_5$ or $-CH(CF_3)_2$ is particularly preferable.

As the repeating unit represented by Formula (X), a repeating unit represented by Formula (X-1) or Formula (X-2) is preferable, and the repeating unit represented by Formula (X-1) is more preferable.

In Formula (X-1), $R_{20}$ represents an electron-withdrawing group. $L_2$ represents a divalent linking group. $X_2$ represents an oxygen atom or a sulfur atom. $Z_2$ represents a halogen atom.

In Formula (X-2), $R_{20}$ represents an electron-withdrawing group. $L_3$ represents a divalent linking group. $X_3$ represents an oxygen atom or a sulfur atom. $Z_3$ represents a halogen atom.

Specific examples and preferred examples of the divalent linking group of each of $L_2$ and $L_3$ include the same ones as described in L as the divalent linking group in Formula (X).

The electron-withdrawing group as each of $R_2$ and $R_3$ is preferably the partial structure represented by Formula (EW), specific examples and preferred examples thereof are the same as described above, but the halo(cyclo)alkyl group is more preferable.

Moreover, in Formula (X-1), $L_2$ and $R_2$ are not bonded to each other to form a ring, and in Formula (X-2), $L_3$ and $R_3$ are not bonded to each other to form a ring.

$X_2$ and $X_3$ are each preferably an oxygen atom.

As each of $Z_2$ and $Z_3$, a fluorine atom or a chlorine atom is preferable, and the fluorine atom is more preferable.

In addition, as the repeating unit represented by Formula (X), a repeating unit represented by Formula (X-3) is also preferable.

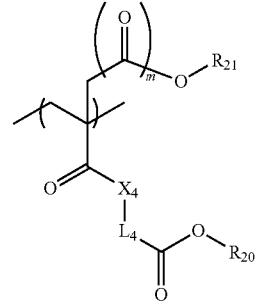
Formula (X-3)

In Formula (X-3), $R_{20}$ represents an electron-withdrawing group. $R_{21}$ represents a hydrogen atom, an alkyl group, or an aryl group. $L_4$ represents a divalent linking group. $X_4$ represents an oxygen atom or a sulfur atom. m represents 0 or 1.

Specific examples and preferred examples of the divalent linking group of $L_4$ include the same ones as described in L as the divalent linking group in Formula (X).

The electron-withdrawing group as $R_4$ is preferably the partial structure represented by Formula (EW), specific examples and preferred examples thereof are the same as described above, but the halo(cyclo)alkyl group is more preferable.

Furthermore, in Formula (X-3), $L_4$ and $R_4$ are not bonded to each other to form a ring.

As $X_4$, an oxygen atom is preferable.

Moreover, as the repeating unit represented by Formula (X), a repeating unit represented by Formula (Y-1) or a repeating unit represented by Formula (Y-2) is also preferable.

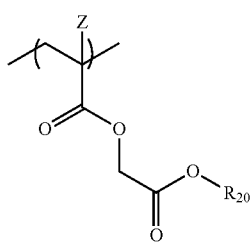

Formula (Y-1)

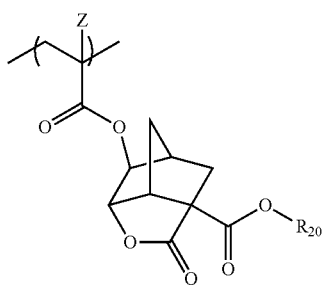

Formula (Y-2)

In Formula (Y-1) and Formula (Y-2), Z represents a halogen atom, a group represented by $R_{11}OCH_2$—, or a group represented by $R_{12}OC(=O)CH_2$—. $R_{11}$ and $R_{12}$ each independently represent a substituent. $R_{20}$ represents an electron-withdrawing group.

The electron-withdrawing group as $R_{20}$ is preferably the partial structure represented by Formula (EW), specific examples and preferred examples thereof are the same as described above, but the halo(cyclo)alkyl group is more preferable.

Specific examples and preferred examples of the halogen atom, the group represented by $R_{11}OCH_2$—, or the group represented by $R_{12}OC(=O)CH_2$— as Z include the same ones as described in Formula (1).

The content of the repeating unit represented by Formula (X) is preferably 10% to 100% by mole, more preferably 20% to 100% by mole, and still more preferably 30% to 100% by mole, with respect to all the repeating units of the fluorine-containing polymer.

The fluorine-containing polymer may have at least one repeating unit (x) of a repeating unit represented by Formula (II) or a repeating unit represented by Formula (III).

Hereinafter, the repeating unit represented by Formula (II) will be described in detail.

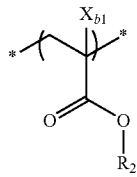

(II)

In Formula (II), $X_{b1}$ represents a hydrogen atom, an alkyl group, a cyano group, or a halogen atom, and $R_2$ represents an organic group which has one or more $CH_3$ partial structures and is stable against an acid. Here, more specifically, the organic group which is stable against an acid is preferably an organic group which does not have an acid-decomposable group (a group that decomposes by the action of an acid to generate a polar group such as a carboxyl group).

Examples of $R_2$ include an alkyl group, a cycloalkyl group, an alkenyl group, a cycloalkenyl group, an aryl group, and an aralkyl group, each of which has one or more $CH_3$ partial structures.

$R_2$ is preferably an alkyl group or alkyl-substituted cycloalkyl group, which has one or more $CH_3$ partial structures.

Hereinafter, the repeating unit represented by Formula (III) will be described in detail.

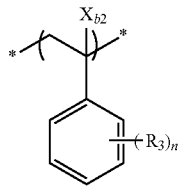

(III)

In Formula (III), $X_{b2}$ represents a hydrogen atom, an alkyl group, a cyano group, or a halogen atom, $R_3$ represents an organic group which has one or more $CH_3$ partial structures and is stable against an acid, and n represents an integer of 1 to 5.

Since $R_3$ is an organic group stable against an acid, more specifically, $R_3$ is preferably an organic group which does not have an acid-decomposable group.

Examples of $R_3$ include an alkyl group having one or more $CH_3$ partial structures.

n represents an integer of 1 to 5, more preferably 1 to 3, and still more preferably 1 or 2.

The fluorine-containing polymer may have at least one group selected from the following groups (x) and (z):
(x) an alkali-soluble group and
(z) a group that decomposes by the action of an acid.

That is, the fluorine-containing polymer may have at least one selected from the group consisting of a repeating unit having an alkali-soluble group and a repeating unit having a group that decomposes by the action of an acid.

Specific examples of the fluorine-containing polymer and the repeating units which can be included in the fluorine-containing polymer are shown below. In the tables below, the compositional ratios of the repeating units represent molar ratios. Further, the repeating units in the compositions described in the following tables will be described later (TMS represents a trimethylsilyl group). In the tables, Pd represents a dispersity (Mw/Mn) of the fluorine-containing polymer.

TABLE 1

| Resin | Composition (compositional ratio) | Mw | Pd |
|---|---|---|---|
| P-1 | p-1 (100) | 7,500 | 1.6 |
| P-2 | p-4 (100) | 11,000 | 1.5 |
| P-3 | p-7/p-60 (90/10) | 12,000 | 1.6 |
| P-4 | p-13/p-60 (80/20) | 9,000 | 1.6 |
| P-5 | p-12 (100) | 9,000 | 1.6 |
| P-6 | p-30 (100) | 7,000 | 1.5 |
| P-7 | p-47/p-63 (90/10) | 8,000 | 1.6 |
| P-8 | p-50 (100) | 9,000 | 1.5 |
| P-9 | p-45 (100) | 10,000 | 1.6 |
| P-10 | p-3/p-38 (90/10) | 11,000 | 1.5 |
| P-11 | p-20 (100) | 12,000 | 1.6 |
| P-12 | p-16/p-62 (90/10) | 12,000 | 1.4 |
| P-13 | p-23 (100) | 11,500 | 1.6 |
| P-14 | p-27 (100) | 15,000 | 1.5 |
| P-15 | p-57 (100) | 8,500 | 1.6 |
| P-16 | p-3/p-39 (98/2) | 17,000 | 1.4 |
| P-17 | p-8 (100) | 12,000 | 1.4 |
| P-18 | p-17 (100} | 15,000 | 1.6 |
| P-19 | p-40/p-65 (98/2) | 10,000 | 1.6 |
| P-20 | p-42 (100) | 8,500 | 1.5 |
| P-21 | p-42/p-61 (80/20) | 9,000 | 1.6 |
| P-22 | p-1/p-63 (90/10) | 11,000 | 1.6 |
| P-23 | p-41 (100) | 16,000 | 1.6 |
| P-24 | p-11 (100) | 14,500 | 1.6 |
| P-25 | p-43 (100) | 12,500 | 1.6 |
| P-26 | p-54 (100) | 12,000 | 1.4 |
| P-27 | p-54/p-38 (80/20) | 13,500 | 1.6 |
| P-28 | p-42/p-61 (80/20) | 9,000 | 1.6 |
| P-29 | p-18 (100) | 10,000 | 1.6 |
| P-30 | p-23/p-63 (98/2) | 95,000 | 1.4 |
| P-31 | p-20/p-64 (90/10) | 8,000 | 1.6 |
| P-32 | p-10 (100) | 9,500 | 1.6 |
| P-33 | p-5/p-69 (80/20) | 12,000 | 1.6 |
| P-34 | p-44 (100) | 10,000 | 1.6 |
| P-35 | p-44/p-71 (98/2) | 9,500 | 1.6 |
| P-36 | p-44/p-64 (90/10) | 15,000 | 1.6 |
| P-37 | p-54/p-74 (70/30) | 16,000 | 1.6 |
| P-38 | p-55 (100) | 17,000 | 1.6 |
| P-39 | p-25 (100) | 9,500 | 1.6 |
| P-40 | p-29 (100) | 9,000 | 1.6 |
| P-41 | p-41/p-70 (90/10) | 11,000 | 1.6 |
| P-42 | p-41/p-71 (80/20) | 12,000 | 1.6 |
| P-43 | p-36 (100) | 12,000 | 1.6 |
| P-44 | p-36/p-73 (90/10) | 11,500 | 1.6 |
| P-45 | p-37 (100) | 15,000 | 1.6 |
| P-46 | p-22/p-75 (90/10) | 8,500 | 1.6 |
| P-47 | p-8/p-63 (90/10) | 6,500 | 1.6 |
| P-48 | p-15/p-38 (98/2) | 7,000 | 1.6 |
| P-49 | p-2 (100) | 11,000 | 1.5 |
| P-50 | p-31/p-70 (98/2) | 12,000 | 1.6 |
| P-51 | p-55/p-69 (90/10) | 9,000 | 1.6 |
| P-52 | p-56/p-68 (80/20) | 9,000 | 1.4 |
| P-53 | p-6/p-2 (50/50) | 7,000 | 1.6 |
| P-54 | p-57/p-74 (80/20) | 8,000 | 1.6 |
| P-55 | p-57/p-75 (70/30) | 9,000 | 1.6 |
| P-56 | p-57/p-67 (90/10) | 10,000 | 1.6 |
| P-57 | p-48/p-72 (98/2) | 15,000 | 1.6 |
| P-58 | p-48 (100) | 16,000 | 1.6 |
| P-59 | p-16 (100) | 10,000 | 1.4 |
| P-60 | p-19/p-67 (98/2) | 9,000 | 1.6 |
| P-61 | p-39/p-32 (80/20) | 9,000 | 1.5 |
| P-62 | p-19 (100) | 11,000 | 1.6 |
| P-63 | p-8/p-74 (80/20) | 12,000 | 1.4 |
| P-64 | p-40 (100) | 12,000 | 1.6 |
| P-65 | p-47 (100) | 14,500 | 1.4 |
| P-66 | p-53/p-61 (80/20) | 12,500 | 1.6 |
| P-67 | p-4/p-70 (80/20) | 12,000 | 1.6 |
| P-68 | p-4/p-71 (80/20) | 13,500 | 1.6 |
| P-69 | P-31 (100) | 11,500 | 1.6 |
| P-70 | p-37/p-64 (80/20) | 11,000 | 1.6 |
| P-71 | p-50/p-75 (80/20) | 8,000 | 1.6 |
| P-72 | p-51/p-61 (98/2) | 10,000 | 1.6 |
| P-73 | p-51/p-62 (90/10) | 9,000 | 1.6 |
| P-74 | p-25/p-57 (90/10) | 9,000 | 1.6 |
| P-75 | p-5 (100) | 11,000 | 1.6 |
| P-76 | p-45/p-65 (80/20) | 12,000 | 1.6 |
| P-77 | p-46 (100) | 8,000 | 1.6 |
| P-78 | p-43/p-63 (98/2) | 9,000 | 1.4 |
| P-79 | p-9 (100) | 9,000 | 1.6 |
| P-80 | p-9/p-62 (98/2) | 7,000 | 1.5 |

TABLE 2

| Resin | Composition (compositional ratio) | Mw | Pd |
|---|---|---|---|
| P-81 | p-11/p-61 (90/10) | 8,000 | 1.6 |
| P-82 | p-43/p-60 (90/10) | 9,000 | 1.4 |
| P-83 | p-14/p-56 (80/20) | 11,000 | 1.4 |
| P-84 | p-29/p-63 (98/2) | 12,000 | 1.6 |
| P-85 | p-52/p-56 (90/10) | 12,000 | 1.6 |
| P-86 | p-3 (100) | 12,000 | 1.6 |
| P-87 | p-26 (100) | 15,000 | 1.6 |
| P-88 | p-33 (100) | 10,000 | 1.6 |
| P-89 | p-33/p-73 (90/10) | 9,000 | 1.6 |
| P-90 | p-52 (100) | 9,000 | 1.6 |
| P-91 | p-52/p-57 (50/50) | 11,000 | 1.6 |
| P-92 | p-59 (100) | 12,000 | 1.6 |
| P-93 | p-8/p-63 (98/2) | 10,000 | 1.5 |
| P-94 | p-24 (100) | 9,000 | 1.6 |
| P-95 | p-1/p-65 (98/2) | 9,000 | 1.6 |
| P-96 | p-24/p-70 (50/50) | 11,000 | 1.4 |
| P-97 | p-32 (100) | 12,000 | 1.6 |
| P-98 | p-32/p-69 (90/10) | 12,000 | 1.6 |
| P-99 | p-53 (100) | 11,500 | 1.6 |
| P-100 | p-53/p-66 (80/20) | 12,000 | 1.6 |
| P-101 | p-13/p-66 (80/20) | 9,000 | 1.6 |
| P-102 | p-34 (100) | 9,000 | 1.6 |
| P-103 | p-39 (100) | 11,000 | 1.6 |
| P-104 | p-22 (100) | 8,500 | 1.6 |
| P-105 | p-46/p-66 (90/10) | 11,000 | 1.4 |
| P-106 | p-58 (100) | 12,000 | 1.6 |
| P-107 | p-58/p-68 (98/2) | 9,000 | 1.5 |
| P-108 | p-10/p-68 (90/10) | 7,000 | 1.6 |
| P-109 | p-6 (100) | 8,000 | 1.4 |
| P-110 | p-49 (100) | 8,000 | 1.6 |
| p-111 | p-49/p-63 (90/10) | 7,000 | 1.4 |
| P-112 | p-49/p-60 (98/2) | 12,000 | 1.6 |
| P-113 | p-58/p-75 (80/20) | 15,000 | 1.6 |
| P-114 | p-59/p-66 (90/10) | 10,000 | 1.6 |
| P-115 | p-28/p-62 (80/20) | 9,000 | 1.6 |
| P-116 | p-7 (100) | 14,000 | 1.6 |
| P-117 | p-21/p-72 (80/20) | 7,500 | 1.6 |
| P-118 | p-2/p-40 (90/10) | 8,000 | 1.6 |
| P-119 | p-35 (100) | 9,000 | 1.6 |
| P-120 | p-49/p-76 (90/10) | 10,000 | 1.6 |
| P-121 | p-49/p-60/p-87 (90/8/2) | 9,000 | 1.6 |
| P-122 | p-59/p-81 (80/20) | 9,000 | 1.6 |
| P-123 | p-58/p-81 (91/9) | 11,000 | 1.6 |
| P-124 | p-8/p-85 (83/17) | 13,000 | 1.6 |
| P-125 | p-22/p-84 (90/10) | 8,000 | 1.6 |
| P-126 | p-2/p-77 (90/10) | 9,000 | 1.4 |
| P-127 | p-15/p-80 (95/5) | 9,000 | 1.6 |
| P-128 | p-2 (100) | 7,000 | 1.5 |
| P-129 | p-31/p-70/p-79 (80/18/2) | 12,000 | 1.6 |
| P-130 | p-55/p-69/p-63 (90/5/5) | 11,500 | 1.6 |
| P-131 | p-56/p-83 (80/20) | 15,000 | 1.6 |
| P-132 | p-37/p-82 (81/19) | 8,500 | 1.6 |
| P-133 | p-50/p-75/p-76 (80/15/5) | 6,500 | 1.5 |
| P-134 | p-10/p-86 (94/6) | 7,000 | 1.6 |
| P-135 | p-17/p-79 (89/11) | 11,000 | 1.6 |
| P-136 | p-25/p-87 (92/8) | 8,500 | 1.4 |
| P-137 | p-54/p-82 (82/18) | 9,000 | 1.6 |
| P-138 | p-42/p-76 (80/20) | 10,000 | 1.6 |
| P-139 | p-16/p-62/p-77 (88/10/2) | 11,000 | 1.6 |
| P-140 | p-23/p-85 (90/10) | 12,000 | 1.6 |
| P-141 | p-20/p-80 (90/10) | 11,000 | 1.6 |
| P-142 | p-32/p-82 (89/11) | 9,000 | 1.6 |
| P-143 | p-5/p-84 (83/17) | 9,000 | 1.6 |
| P-144 | p-3/p-86 (90/10) | 11,000 | 1.5 |
| P-145 | p-44/p-71/p-80 (91/7/2) | 10,000 | 1.6 |

TABLE 2-continued
| Resin | Composition (compositional ratio) | Mw | Pd |
|---|---|---|---|
| P-146 | p-1/p-84 (85/15) | 9,000 | 1.6 |
| P-147 | p-33/p-76 (70/30) | 9,000 | 1.4 |
| P-148 | p-30/p-79 (82/18) | 11,000 | 1.6 |
| P-149 | p-57/p-78 (78/22) | 9,000 | 1.6 |
| P-150 | p-57/p-84 (88/12) | 9,000 | 1.6 |
| P-151 | p-19/p-83 (88/12) | 11,000 | 1.6 |
| P-152 | p-55/p-77/p-78 (90/5/5) | 8,500 | 1.6 |
| P-153 | p-38/p-87 (80/20) | 12,000 | 1.6 |
| P-154 | p-6/p-7/p-84 (50/40/10) | 12,000 | 1.4 |
| P-155 | p-41/p-83 (96/4) | 15,000 | 1.6 |
| P-156 | p-40/p-78 (80/20) | 9,000 | 1.5 |
| P-157 | p-21/p-82 (86/14) | 14,000 | 1.6 |
| P-158 | p-2/p-81 (89/11) | 8,500 | 1.6 |
| P-159 | p-9/p-88 (70/30) | 11,000 | 1.6 |
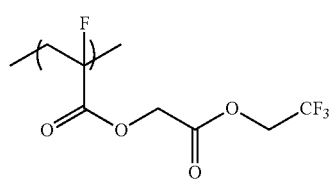
(p-1)
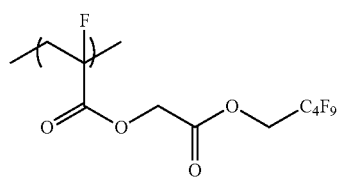
(p-2)
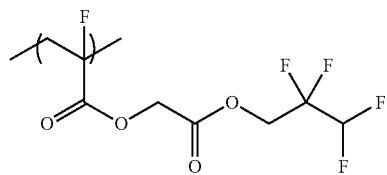
(p-3)
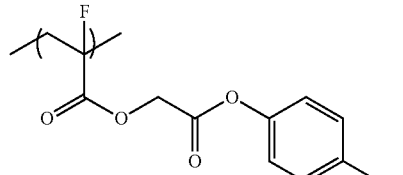
(p-4)
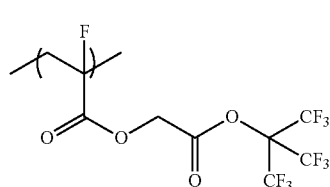
(p-5)
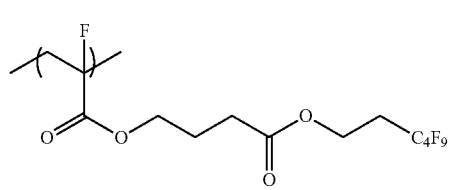
(p-6)
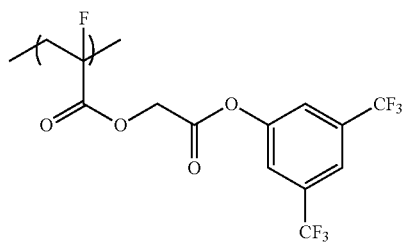
(P-7)
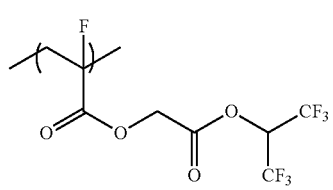
(p-8)
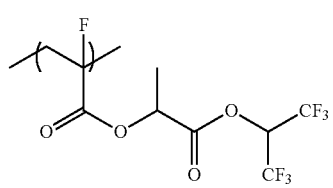
(p-9)
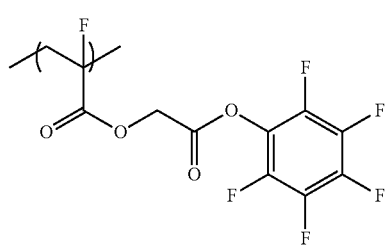
(p-10)
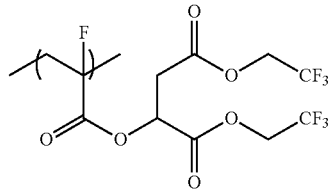
(p-11)
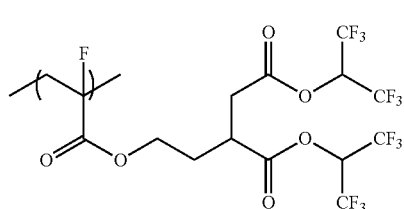
(p-12)
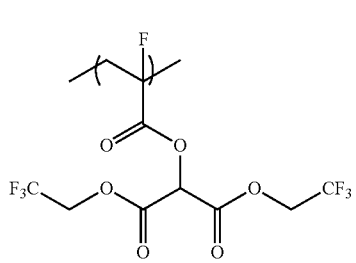
(p-13)

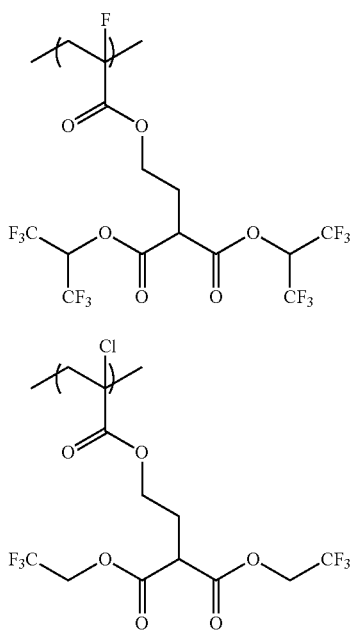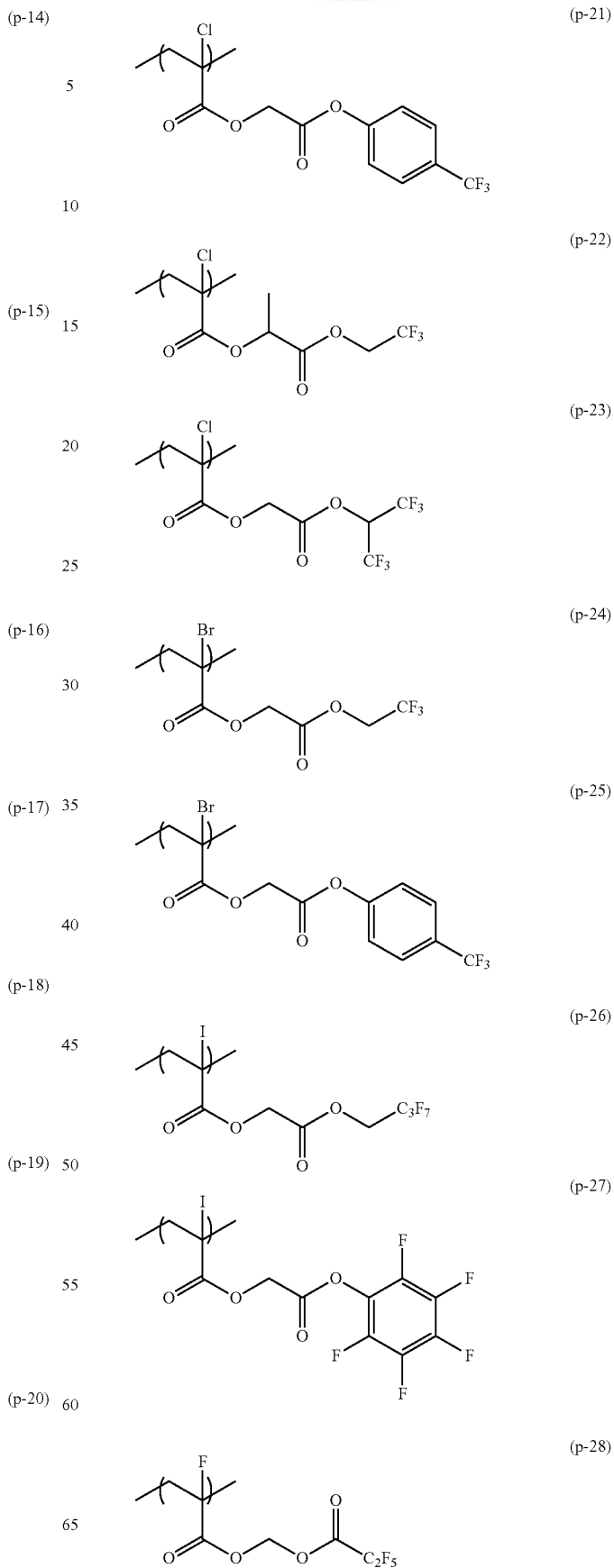

(p-29) 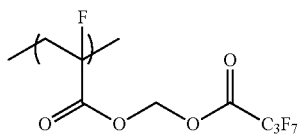
(p-30) 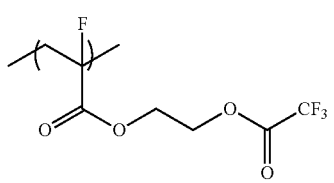
(p-31) 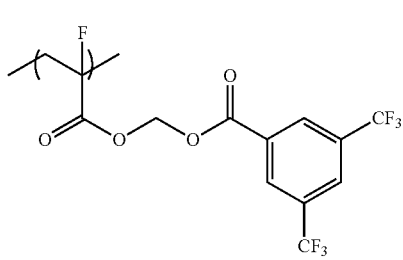
(p-32) 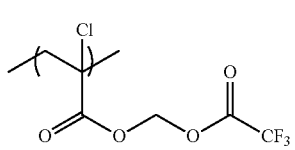
(p-33) 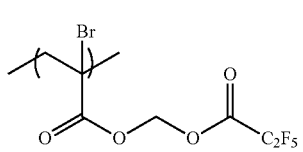
(p-34) 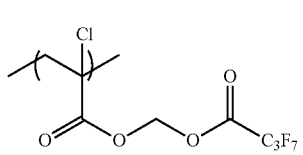
(p-35) 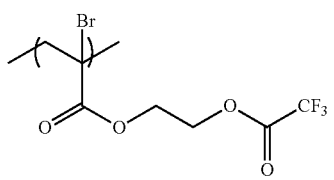
(p-36) 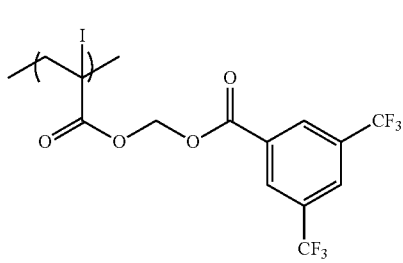
(p-37) 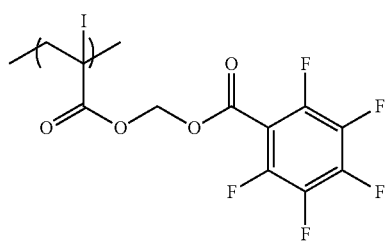
(p-38) 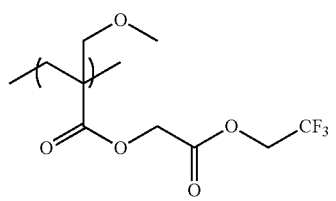
(p-39) 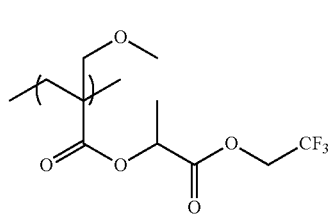
(p-40) 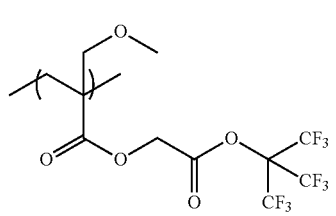
(p-41) 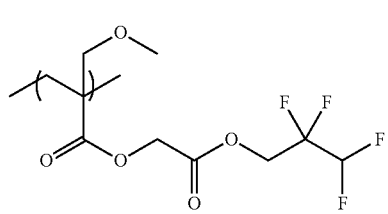
(p-42) 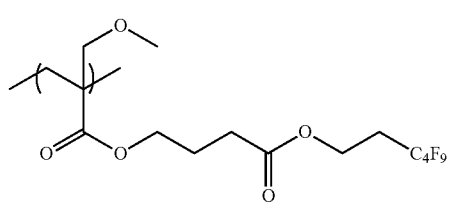
(p-43) 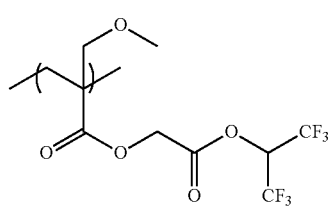

(p-44)
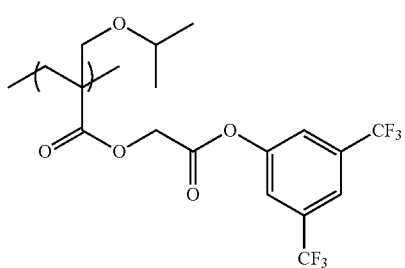
(p-45)
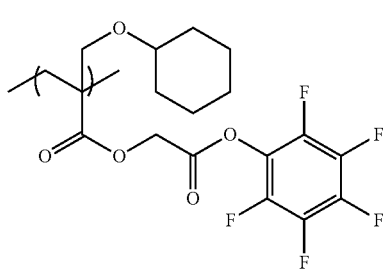
(p-46)
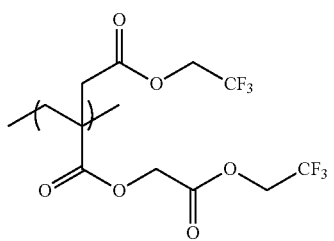
(p-47)
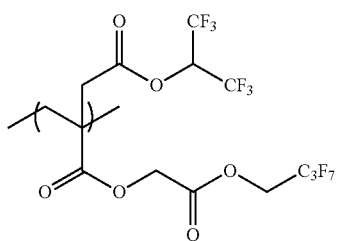
(p-48)
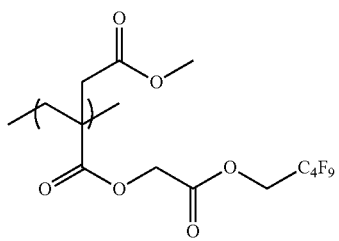
(p-49)
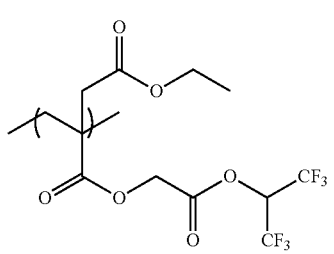
(p-50)
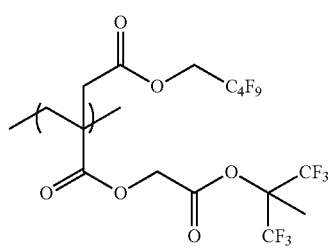
(p-51)
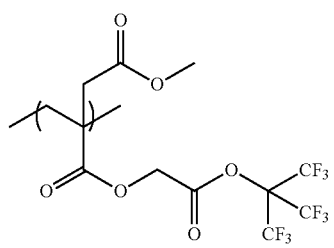
(p-52)
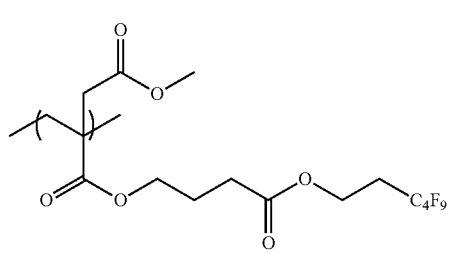
(p-53)
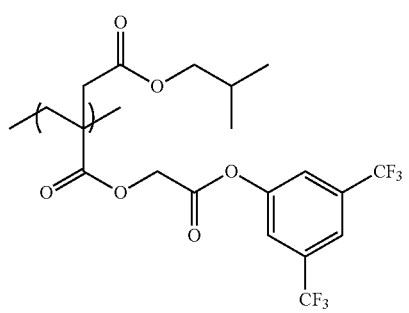
(p-54)
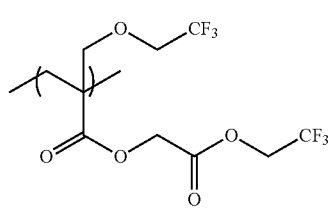
(p-55)
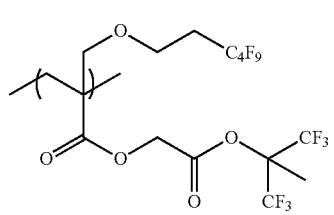

(p-56) 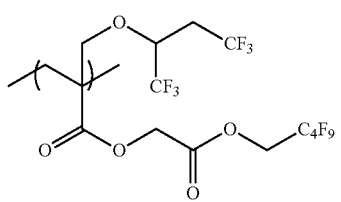
(p-57) 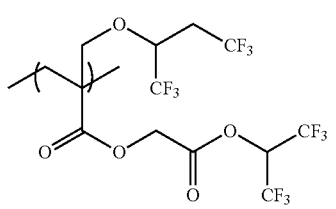
(p-58) 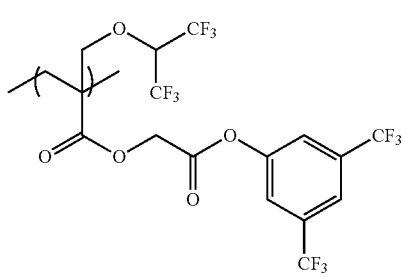
(p-59) 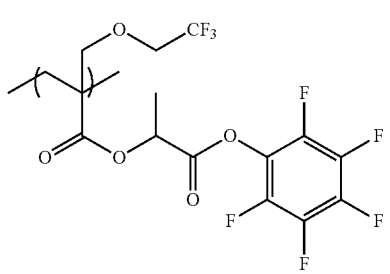
(p-60) 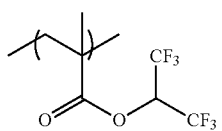
(p-61) 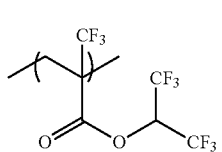
(p-62) 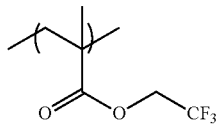
(p-63) 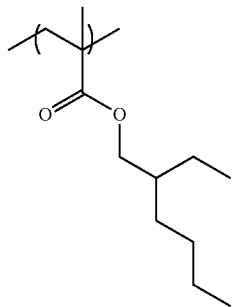
(p-64) 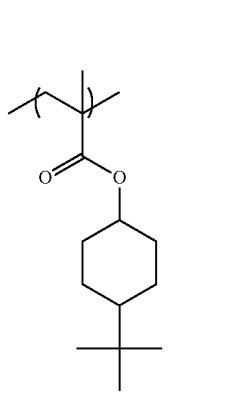
(p-65) 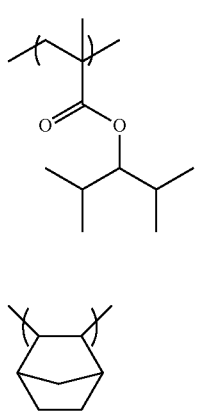
(p-66) 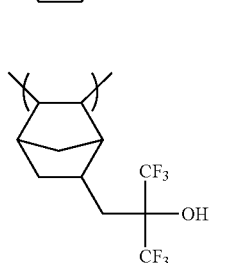
(p-67) 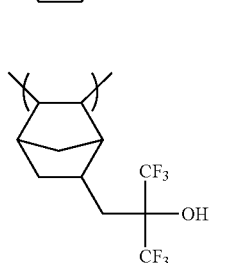
(p-68) 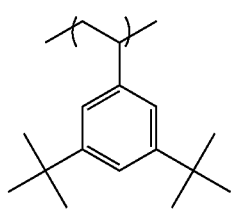

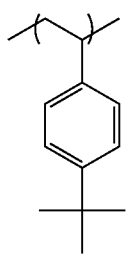 (p-69)
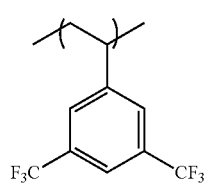 (p-70)
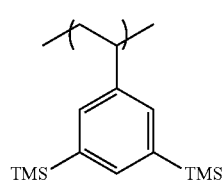 (p-71)
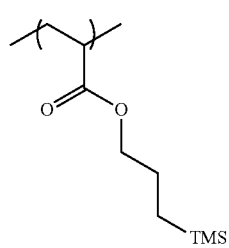 (p-72)
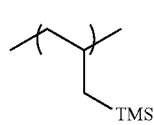 (p-73)
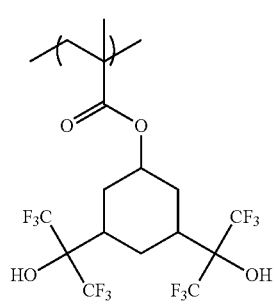 (p-74)
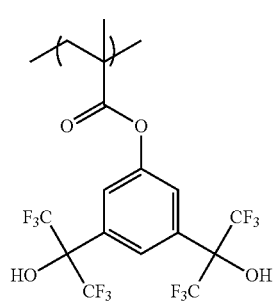 (p-75)
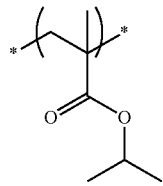 (p-76)
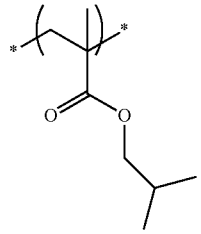 (p-77)
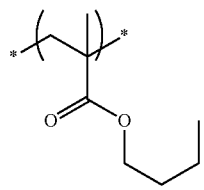 (p-78)
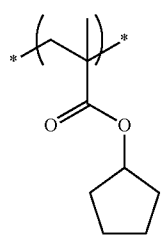 (p-79)
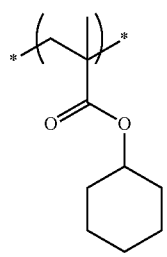 (p-80)
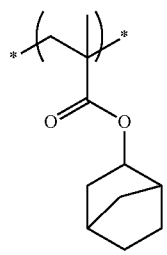 (p-81)

(p-82) 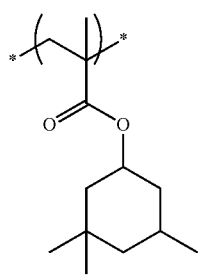
(p-83) 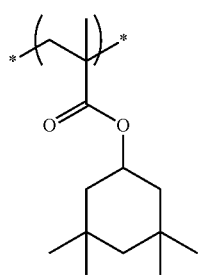
(p-84) 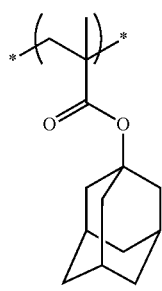
(p-85) 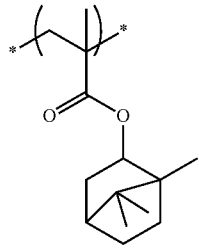
(p-86) 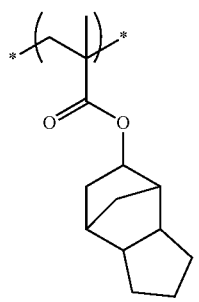
(p-87) 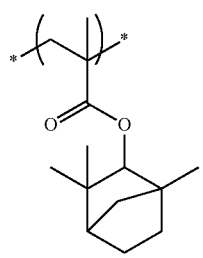
(p-88) 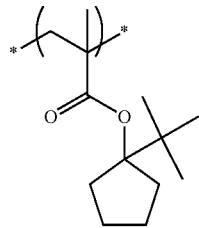
(P-201) 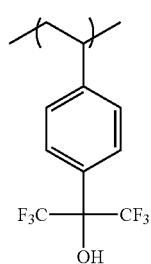
(P-202) 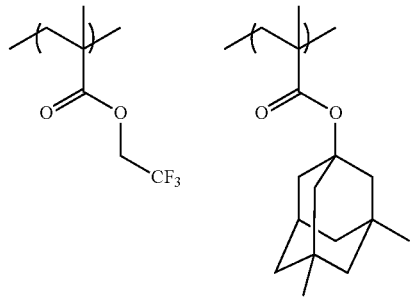
(P-203) 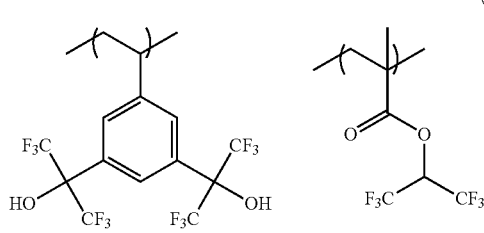
(P-204)

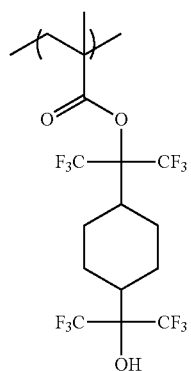
(P-205)
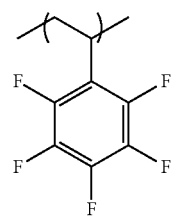
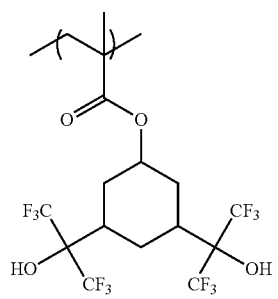
(P-206)
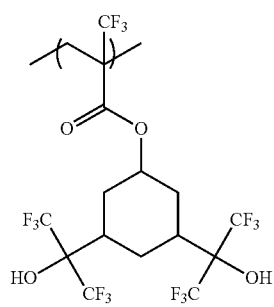
(P-207)
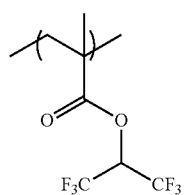
(P-208)
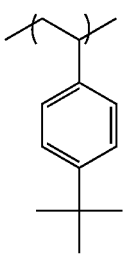
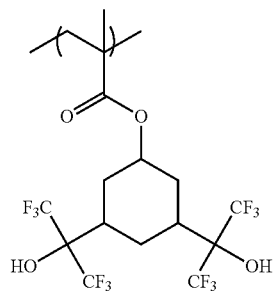
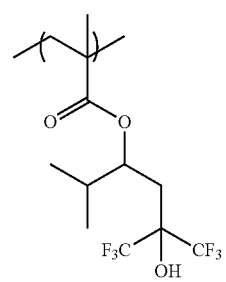
(P-209)
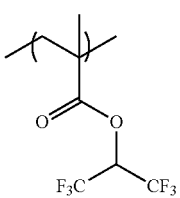
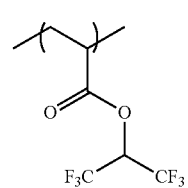
(P-210)
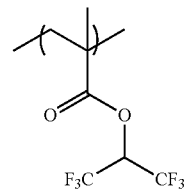
(P-211)
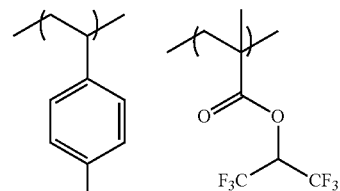
(P-212)
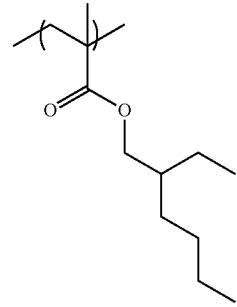
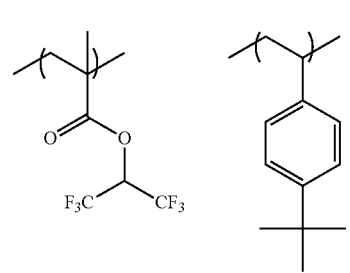
(P-213)

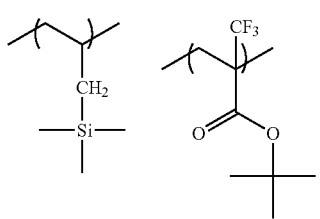 (P-214)
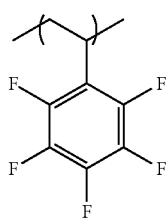 (P-215)
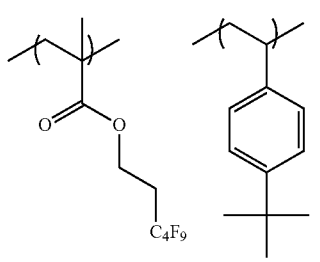 (P-216)
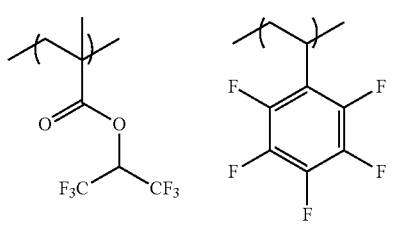 (P-217)
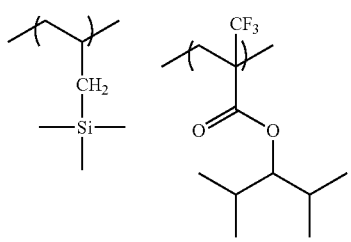 (P-218)
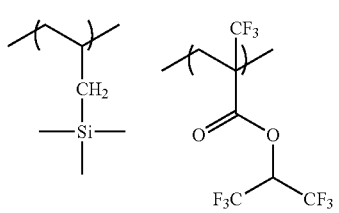 (P-219)
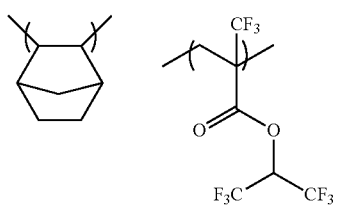 (P-220)
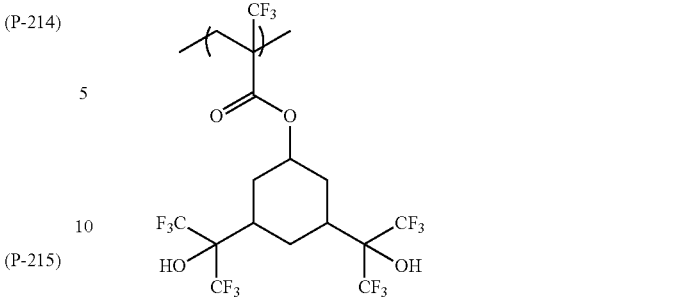

(P-225)
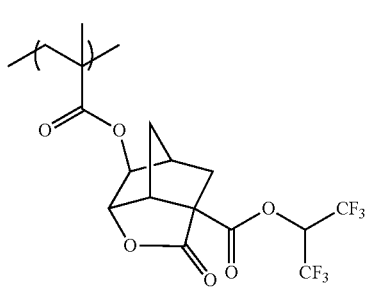 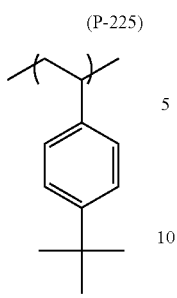
(P-226)
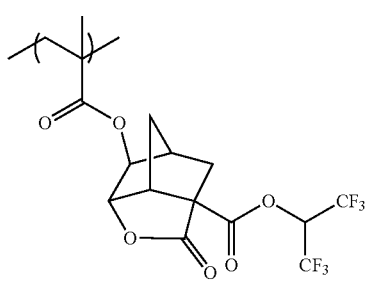 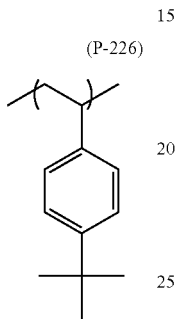
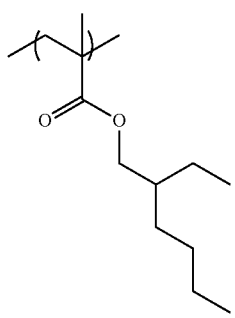
(P-227)
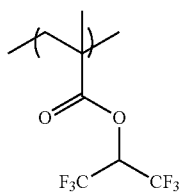 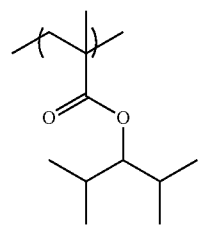
(P-228)
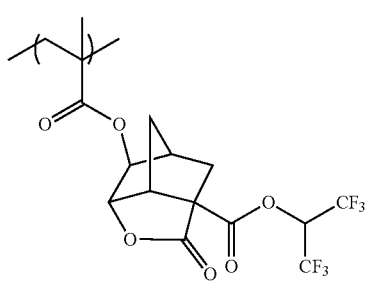
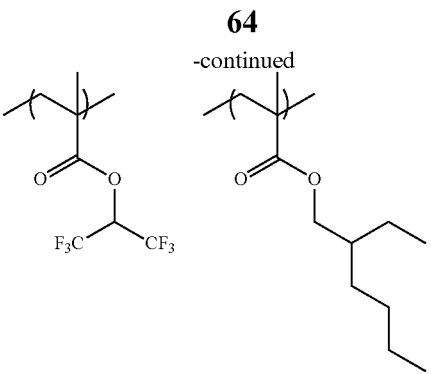
(P-229)
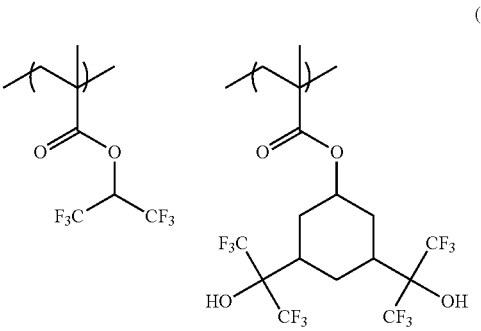
(P-232)
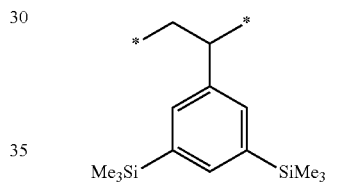 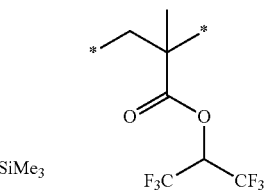
(P-233)
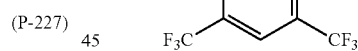 
(P-235)
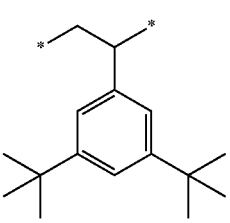
(P-236)
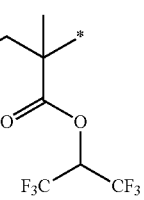 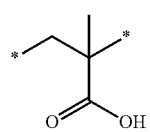

-continued

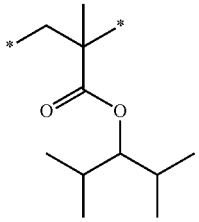

| Resin | Composition (compositional ratio) | Mw | Pd |
|---|---|---|---|
| P-201 | 100 | 9,000 | 1.6 |
| P-202 | 70/30 | 11,000 | 1.6 |
| P-203 | 60/40 | 12,000 | 1.4 |
| P-204 | 100 | 12,000 | 1.6 |
| P-205 | 90/10 | 11,500 | 1.6 |
| P-206 | 100 | 13,500 | 1.6 |
| P-207 | 40/60 | 11,500 | 1.6 |
| P-208 | 60/10/30 | 11,000 | 1.5 |
| P-209 | 40/60 | 8,000 | 1.6 |
| P-210 | 100 | 10,000 | 1.5 |
| P-211 | 100 | 9,000 | 1.6 |
| P-212 | 56/40/2/2 | 9,000 | 1.4 |
| P-213 | 50/50 | 9,000 | 1.6 |
| P-214 | 50/50 | 7,000 | 1.5 |
| P-215 | 100 | 8,000 | 1.6 |
| P-216 | 30/70 | 8,000 | 1.4 |
| P-217 | 80/20 | 7,000 | 1.4 |
| P-218 | 50/50 | 12,000 | 1.6 |
| P-219 | 50/50 | 15,000 | 1.6 |
| P-220 | 50/25/25 | 10,000 | 1.5 |
| P-221 | 100 | 9,000 | 1.6 |
| P-222 | 100 | 12,000 | 1.6 |
| P-224 | 60/40 | 10,000 | 1.6 |
| P-225 | 40/60 | 8,500 | 1.6 |
| P-226 | 60/38/2 | 9,000 | 1.4 |
| P-227 | 95/5 | 11,000 | 1.6 |
| P-228 | 60/38/2 | 16,000 | 1.6 |
| P-229 | 90/10 | 14,500 | 1.6 |
| P-232 | 80/20 | 13,500 | 1.4 |
| P-233 | 60/40 | 9,000 | 1.6 |
| P-235 | 60/40 | 9,000 | 1.6 |
| P-236 | 91/2/7 | 13,500 | 1.4 |

The content of the fluorine-containing polymer in the composition is preferably 0.5% to 15% by mass, and more preferably 2% to 10% by mass, with respect to a total solid content of the composition.

The fluorine-containing polymers may be used singly or in combination of two or more kinds thereof. Among those, from the viewpoint that the effects of the present invention are more excellent, it is preferable that two or more kinds of the fluorine-containing polymers are used in combination.

<Acid Diffusion Control Agent>

The composition may further include an acid diffusion control agent. The acid diffusion control agent acts as a quencher that traps an acid generated from a photoacid generator upon exposure, and functions to control diffusion phenomenon of the acid in the resist film.

The acid diffusion control agent may be, for example, a basic compound. The basic compound is preferably a compound having stronger basicity, as compared with a phenol. Further, the basic compound is preferably an organic basic compound, and more preferably a nitrogen-containing basic compound. The nitrogen-containing basic compound which is usable is not particularly limited, but examples thereof include compounds classified into (1) to (5) below.

In addition, in another aspect, the composition may include, for example, an ionic compound classified into (6) below as the acid diffusion control agent.

(1) Basic Compound (C1) Having Hydrophilic Functional Group

As the basic compound (C1) having a hydrophilic functional group, a compound represented by Formula (BS-1) is preferable.

In Formula (BS-1),

R's each independently represent a hydrogen atom or an organic group. It should be noted that at least one of three R's is an organic group. This organic group is preferably a linear or branched alkyl group, a monocyclic or polycyclic cycloalkyl group, an aryl group, or an aralkyl group.

A hydrogen atom in the alkyl group, the cycloalkyl group, the aryl group, or the aralkyl group as R may be substituted with a substituent. Examples of the substituent include an alkyl group, a cycloalkyl group, an aryl group, an aralkyl group, a hydroxyl group, a carboxyl group, an alkoxy group, an aryloxy group, an alkylcarbonyloxy group, and an alkyloxycarbonyl group. Further, an oxygen atom, a sulfur atom, a carbonyl group, and a combination thereof may be included in the alkyl group.

In addition, it is preferable that at least two of R's are organic groups in the compound represented by Formula (BS-1).

Furthermore, two of R's may be bonded to each other to form a ring. The formed ring may be substituted with a substituent (for example, a hydroxyl group).

Specific examples of the compound represented by Formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyl octadecylamine, dimethylundecylamine, N,N-dimethyldodecylamine, methyl dioctadecylamine, N,N-dibutyl aniline, N,N-dihexyl aniline, 2,6-diisopropyl aniline, N-phenyldiethanolamine, and 2,4,6-tri(t-butyl)aniline.

Furthermore, the basic compound represented by Formula (BS-1) is preferably an alkyl group in which at least one of three R's has a hydrophilic group. By using this basic compound, the resolution of the pattern is improved and a good pattern shape is also obtained.

The number of carbon atoms of an alkyl group having a hydrophilic group is preferably 1 to 8, and more preferably 1 to 6.

Examples of the alkyl group having a hydrophilic group include an alkyl group having a hydroxyl group or a mercapto group. Specific examples of such the basic compound having an alkyl group include triethanolamine and N,N-dihydroxyethylaniline.

Moreover, examples of the alkyl group having a hydrophilic group also include an alkyl group having an oxygen atom, a sulfur atom, or a carbonyl group in an alkyl chain. Specific examples thereof include tris(methoxyethoxyethyl)amine and the compounds exemplified after line 60 of column 3 in the specification of U.S. Pat. No. 6,040,112A.

The alkyl group having a hydrophilic group may be an alkyl group having a hydroxyl group or a mercapto group as the substituent and also having an oxygen atom, a sulfur atom, or a carbonyl group in the alkyl group.

The alkyl group having a hydrophilic group may further have a substituent. Examples of such the additional substituent include a substituted or unsubstituted aryl group. In a case where the aryl group is a substituted aryl group, examples of the substituent in the substituted aryl group include an alkyl group, an alkoxy group, and an aryl group.

(2) Compound Having Nitrogen-Containing Heterocyclic Structure

The nitrogen-containing heterocyclic ring in a compound having a nitrogen-containing heterocyclic structure may or may not have aromatic properties. Further, the nitrogen-containing heterocyclic ring may have a plurality of nitrogen atoms. Incidentally, the nitrogen-containing heterocyclic ring may include heteroatoms other than the nitrogen atom. Examples of the compound having the nitrogen-containing heterocyclic structure include a compound having an imidazole structure (2-phenylbenzimidazole, 2,4,5-triphenylimidazole, 2-phenylbenzimidazole, and the like), a compound having a piperidine structure [N-hydroxyethylpiperidine, bis(1,2,2,6,6-pentamethyl-4-piperidyl)sebacate, and the like], a compound having a pyridine structure (4-dimethylaminopyridine and the like), and a compound having an antipyrine structure (antipyrine, hydroxyantipyrine, and the like).

In addition, a compound having two or more ring structures is also suitably used as the compound having a nitrogen-containing heterocyclic structure. Specific examples thereof include 1,5-diazabicyclo[4.3.0]non-5-ene and 1,8-diazabicyclo[5.4.0]undeca-7-ene.

(3) Amine Compound Having Phenoxy Group

An amine compound having a phenoxy group is a compound comprising a phenoxy group at the terminal on the opposite side to the nitrogen atom of the alkyl group included in an amine compound. The phenoxy group may have a substituent such as an alkyl group, an alkoxy group, a halogen atom, a cyano group, a nitro group, a carboxyl group, a carboxylic acid ester group, a sulfonic acid ester group, an aryl group, an aralkyl group, an acyloxy group, and an aryloxy group.

The amine compound having a phenoxy group preferably has at least one oxyalkylene chain between the phenoxy group and the nitrogen atom. The number of oxyalkylene chains per molecule is preferably 3 to 9, and more preferably 4 to 6. Among the oxyalkylene chains, —CH$_2$CH$_2$O— is preferable.

Examples of the amine compound having a phenoxy group include 2-[2-{2-(2,2-dimethoxyphenoxyethoxy)ethyl}-bis-(2-methoxyethyl)]amine, and the compounds (C1-1) to (C3-3) exemplified in paragraph 0066 of US2007/0224539A1.

(4) Ammonium Salt

Examples of the basic compound include an ammonium salt.

Examples of the anion of the ammonium salt include halide, sulfonate, borate, and phosphate. Among those, halide or sulfonate is preferable.

As the halide, chloride, bromide, or iodide is preferable.

As the sulfonate, an organic sulfonate having 1 to 20 carbon atoms is preferable. Examples of the organic sulfonate include alkyl sulfonate and aryl sulfonate, each having 1 to 20 carbon atoms.

The alkyl group included in alkyl sulfonate may have a substituent. Examples of the substituent include a fluorine atom, a chlorine atom, a bromine atom, an alkoxy group, an acyl group, and an aryl group. Examples of the alkyl sulfonate include methanesulfonate, ethanesulfonate, butanesulfonate, hexanesulfonate, octanesulfonate, benzylsulfonate, trifluoromethanesulfonate, pentafluoroethanesulfonate, and nonafluorobutanesulfonate.

Examples of the aryl group included in aryl sulfonate include a phenyl group, a naphthyl group, and an anthryl group. These aryl groups may have a substituent.

The ammonium salt may be hydroxide or carboxylate. In this case, as the ammonium salt, tetraalkylammonium hydroxide having 1 to 8 carbon atoms, such as tetramethylammonium hydroxide, tetraethylammonium hydroxide, and tetra-(n-butyl)ammonium hydroxide, is preferable.

As the basic compound, guanidine, aminopyridine, aminoalkylpyridine, aminopyrrolidine, indazole, imidazole, pyrazole, pyrazine, pyrimidine, purin, imidazoline, pyrazoline, piperazine, aminomorpholine, or aminoalkylmorpholine is preferable. These may further have a substituent.

(5) Compound (PA) that has Proton-Accepting Functional Group and Decomposes Upon Irradiation with Actinic Rays or Radiation to Generate Compound Exhibiting Deterioration in Proton-Accepting Properties, No Proton-Accepting Properties, or Change from Proton-Accepting Properties to Acidic Properties The composition may further include, as the basic compound, a compound (hereinafter also referred to as a compound (PA)) that has a proton-accepting functional group and decomposes upon irradiation with actinic rays or radiation to generate a compound exhibiting deterioration in proton-accepting properties, no proton-accepting properties, or a change from the proton-accepting properties to acidic properties.

The proton-accepting functional group refers to a functional group having a group or electron which can electrostatically interact with a proton, and for example, means a functional group having a macrocyclic structure, such as a cyclic polyether, or a functional group having a nitrogen atom with an unshared electron pair not contributing to π-conjugation. The nitrogen atom having an unshared electron pair not contributing to π-conjugation is, for example, a nitrogen atom having a partial structure represented by the following formula.

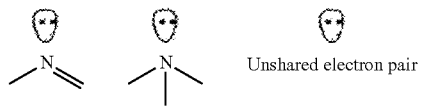

Preferred examples of the partial structure of the proton-accepting functional group include crown ether, azacrown ether, primary to tertiary amines, pyridine, imidazole, and pyrazine structures.

The compound (PA) decomposes upon irradiation with actinic rays or radiation to generate a compound exhibiting deterioration in proton-accepting properties, no proton-accepting properties, or a change from the proton-accepting properties to acidic properties. Here, the expression, exhibiting deterioration in proton-accepting properties, no proton-accepting properties, or a change from the proton-accepting properties to acidic properties, means a change in proton-accepting properties due to addition of a proton to the proton-accepting functional group. Specifically, the expression means a decrease in the equilibrium constant at the chemical equilibrium in a case where a proton adduct is generated from the compound (PA) having the proton-accepting functional group and the proton.

The proton-accepting properties can be confirmed by performing pH measurement.

The compound (PA) generates, for example, a compound represented by Formula (PA-1) as the proton adduct generated through decomposition upon irradiation with actinic rays or radiation. The compound represented by Formula (PA-1) is a compound exhibiting deterioration in proton-accepting properties, no proton-accepting properties, or a change from the proton-accepting properties to acidic properties by incorporation a proton-accepting functional group as well as an acidic group into the compound, as compared with the compound (PA).

$$Q-A-(X)_n—B—R \quad (PA\text{-}1)$$

In Formula (PA-1),

Q represents —SO$_3$H, —CO$_2$H, or —X$_1$NHX$_2$R$_f$. Here, R$_f$ represents an alkyl group, a cycloalkyl group, or an aryl group, and X$_1$ and X$_2$ each independently represent —SO$_2$— or —CO—.

A represents a single bond or a divalent linking group.

X represents —SO$_2$— or —CO—.

n is 0 or 1.

B represents a single bond, an oxygen atom, or —N(Rx)Ry-. Rx represents a hydrogen atom or a monovalent organic group, and Ry represents a single bond or a divalent organic group. Rx may be bonded to Ry to form a ring or may be bonded to R to form a ring.

R represents a monovalent organic group having a proton-accepting functional group.

In addition, a compound (PA) other than a compound that generates the compound represented by Formula (PA-1) can also be appropriately selected. For example, a compound having a proton acceptor site at its cationic moiety may be used as an ionic compound. More specific examples thereof include a compound represented by Formula (7).

$$(R)_m\!\!-\!\!\overset{+}{A}\!\!-\!\!(R_N)_n \quad X^- \quad (7)$$

In Formula (7), A represents a sulfur atom or an iodine atom.

m represents 1 or 2 and n represents 1 or 2. It should be noted that m+n=3 is satisfied in a case where A is a sulfur atom and that m+n=2 is satisfied in a case where A is an iodine atom.

R represents an aryl group.

R$_N$ represents an aryl group substituted with the proton-accepting functional group.

X$^-$ represents an anion.

As the aryl group of each of R and R$_N$, a phenyl group is preferable.

(6) Ionic Compound

The composition may include an ionic compound which becomes a relatively weak acid with respect to an acid generator. As the ionic compound, an onium salt is preferable. In a case where the acid generated from the acid generator upon irradiation with actinic rays or radiation collides with an onium salt having an unreacted weak acid anion, a weak acid is discharged by salt exchange, thereby generating an onium salt having a strong acid anion. In this process, the strong acid is exchanged with a weak acid having a lower catalytic ability, and as a result, the acid is apparently deactivated, and thus, the acid diffusion can be controlled.

As the onium salt which becomes a relatively weak acid with respect to the acid generator, a compound represented by Formula (4), a compound represented by Formula (5), or a compound represented by Formula (6) is preferable.

$$Rz_4\!-\!\!\overset{O}{\underset{\|}{C}}\!\!-\!O^-\ \ X_4^+ \quad (4)$$

$$Rz_5\!-\!SO_3^-\ \ X_5^+ \quad (5)$$

$$Rz_{6a}\!\!\overset{Z_1}{\diagdown}\!\!\underset{-}{N}\!\!\overset{Z_2}{\diagup}\!\!Rz_{6b}\ \ X_6^+ \quad (6)$$

Hereinafter, Formula (4) will be described.

X$_4^+$ represents a cation.

Rz$_4$ represents a cyclic group, an alkyl group, or an alkenyl group. The cyclic group, the alkyl group, and the alkenyl group of Rz$_4$ may each have a substituent (for example, a hydroxyl group).

Examples of the cation of X$_4^+$ include a sulfonium cation and an iodonium cation.

Examples of the cyclic group of Rz$_4$ include an aryl group and a cycloalkyl group. The cyclic group of Rz$_4$ may be either a monocycle or a polycycle.

The alkyl group of Rz$_4$ preferably has 1 to 30 carbon atoms, and more preferably has 3 to 10 carbon atoms.

Examples of the alkenyl group of Rz$_4$ include an alkenyl group having 2 to 10 carbon atoms, and the alkenyl group may be linear or branched. The alkenyl group of Rz$_4$ is preferably a linear alkenyl group having 2 to 4 carbon atoms.

Preferred examples of the anionic moiety of the compound represented by Formula (4) include the structures exemplified in paragraph 0198 of JP2012-242799A.

Hereinafter, Formula (5) will be described.

X$_5^+$ represents a cation.

Rz$_5$ represents a cyclic group, an alkyl group, or an alkenyl group. The cyclic group, the alkyl group, and the alkenyl group of Rz$_5$ may each have a substituent. It should be noted that the carbon atom adjacent to the S atom is not bonded to a fluorine atom.

Examples of the cation of X$_5^+$ include a sulfonium cation and an iodonium cation.

Examples of the cyclic group of Rz$_5$ include an aryl group and a cycloalkyl group. The cyclic group of Rz$_5$ may be either a monocycle or a polycycle.

The alkyl group of Rz$_5$ preferably has 1 to 30 carbon atoms, and more preferably has 3 to 10 carbon atoms.

Examples of the alkenyl group of Rz$_5$ include an alkenyl group having 2 to 10 carbon atoms, and the alkenyl group may be linear or branched. The alkenyl group of Rz$_5$ is preferably a linear alkenyl group having 2 to 4 carbon atoms.

Preferred examples of the anionic moiety of the compound represented by Formula (5) include the structures exemplified in paragraph 0201 of JP2012-242799A.

Hereinafter, Formula (6) will be described.

X$_6^+$ represents a cation.

Rz$_{6a}$ and Rz$_{6b}$ each independently represent a cyclic group, an alkyl group, or an alkenyl group. The cyclic group, the alkyl group, and the alkenyl group of each of Rz$_{6a}$ and Rz$_{6b}$ may each have a substituent (for example, a halogen atom).

Z$_1$ and Z$_2$ each independently represent a single bond or a divalent linking group. It should be noted that a case where Z$_1$ and Z$_2$ are both —SO$_2$— is excluded.

Examples of the cation of $X_6^+$ include a sulfonium cation and an iodonium cation. Examples of the cyclic group of each of $Rz_{6a}$ and $Rz_{6b}$ include an aryl group and a cycloalkyl group. The cyclic group of each of $Rz_{6a}$ and $Rz_{6b}$ may be either a monocycle or a polycycle.

The alkyl group each of $Rz_{6a}$ and $Rz_{6b}$ preferably has 1 to 30 carbon atoms, and more preferably has 3 to 10 carbon atoms.

Examples of the alkenyl group each of $Rz_{6a}$ and $Rz_{6b}$ include an alkenyl group having 2 to 10 carbon atoms, and the alkenyl group may be linear or branched. The alkenyl group of each of $Rz_{6a}$ and $Rz_{6b}$ is preferably a linear alkenyl group having 2 to 4 carbon atoms.

Examples of the divalent linking group of each of $Z_1$ and $Z_2$ include a divalent linking group which may have a substituent divalent hydrocarbon group (an aliphatic hydrocarbon group or an aromatic hydrocarbon group), and includes a heteroatom. Further, the divalent linking group of each of $Z_1$ and $Z_2$ is preferably —$SO_2$—, a carbonyl group, an ester bond, an amide bond, an alkylene group, or a combination thereof. As the alkylene group, a linear or branched alkylene group is preferable, and a methylene group or an ethylene group is more preferable.

Preferred examples of the anionic moiety of the compound represented by Formula (6) include the structures exemplified in paragraphs 0209 and 0210 of JP2012-242799A.

Specific examples of the compounds represented by Formulae (4) to (6) are shown below.

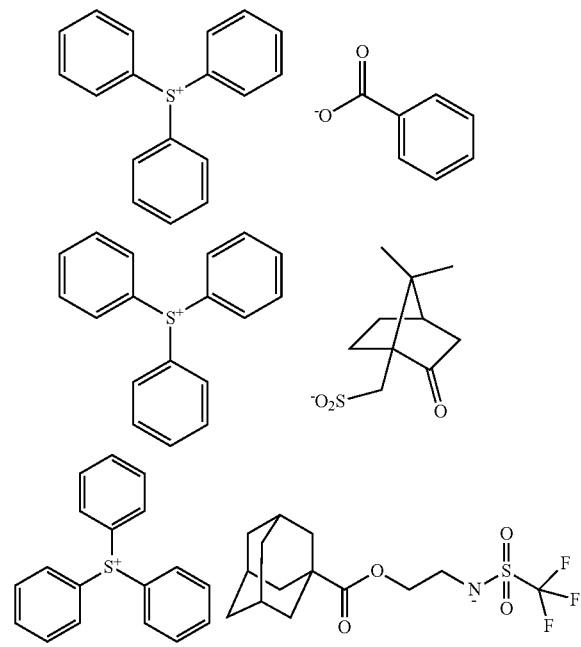

The onium salt which becomes a relatively weak acid with respect to the acid generator may be a compound (hereinafter also referred to as a "compound (CA)") having a cationic moiety and an anionic moiety in the same molecule, in which the cationic moiety and the anionic moiety are linked to each other through a covalent bond.

The compound (CA) is preferably a compound represented by any one of Formulae (C-1) to (C-3).

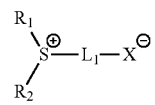 (C-1)

 (C-2)

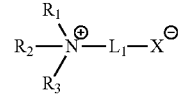 (C-3)

In Formulae (C-1) to (C-3), $R_1$, $R_2$, and $R_3$ each independently represent a substituent having 1 or more carbon atoms.

$L_1$ represents a divalent linking group that links a cationic moiety with an anionic moiety, or a single bond.

—$X^-$ represents an anionic moiety selected from —$COO^-$, —$SO_3^-$, —$SO_2^-$, and —$N^-$—$R_4$. $R_4$ represents a monovalent substituent having a carbonyl group: —C(=O)—, a sulfonyl group: —S(=O)$_2$—, or a sulfinyl group: —S(=O)— at a site for linking to an adjacent nitrogen atom.

$R_1$, $R_2$, $R_3$, $R_4$, and $L_1$ may be bonded to one another to form a ring structure. In addition, in (C-3), two of $R_1$ to $R_3$ may be combined to form a double bond with a nitrogen atom.

Examples of the substituent having one or more carbon atoms in each of $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group. Among those, the alkyl group, the cycloalkyl group, and the aryl group are preferable.

Examples of $L_1$ as the divalent linking group include a linear or branched alkylene group, a cycloalkylene group, an arylene group, a carbonyl group, an ether bond, an ester bond, an amide bond, a urethane bond, a urea bond, and a group formed by a combination of two or more kinds of these groups. As $L_1$, an alkylene group, an arylene group, an ether bond, an ester bond, or a group formed by a combination of two or more kinds of these groups is preferable.

Preferred examples of the compound represented by Formula (C-1) include the compounds exemplified in paragraphs 0037 to 0039 of JP2013-006827A and paragraphs 0027 to 0029 of JP2013-008020A.

Preferred examples of the compound represented by Formula (C-2) include the compounds exemplified in paragraphs 0012 and 0013 of JP2012-189977A.

Preferred examples of the compound represented by Formula (C-3) include the compounds exemplified in paragraphs 0029 to 0031 of JP2012-252124A.

In addition to these, examples of the acid diffusion control agent which is usable in the composition include the compounds synthesized in Examples of JP2002-363146A and the compounds described in paragraph 0108 of JP2007-298569A.

As the acid diffusion control agent, a photosensitive basic compound may be used. Examples of the photosensitive basic compound include the compounds described in JP2003-524799A, J. Photopolym. Sci. & Tech. Vol. 8, P. 543-553 (1995), and the like.

The molecular weight of the acid diffusion control agent is preferably 100 to 1,500, more preferably 150 to 1,300, and still more preferably 200 to 1,000.

In a case where the composition includes the acid diffusion control agent, the content of the acid diffusion control agent is preferably 0.01% to 8.0% by mass, more preferably 0.1% to 5.0% by mass, and still more preferably 0.2% to 4.0% by mass, with respect to a total solid content of the composition.

The acid diffusion control agents may be used singly or in combination of two or more kinds thereof.

The molar ratio of the acid diffusion control agent to the photoacid generator is preferably 0.01 to 10, more preferably to 0.05 to 5, and still more preferably 0.1 to 3. Within the range, the sensitivity and/or the resolution is good, it is difficult to make a pattern finer at a time between exposure and heating (post-baking).

<Solvent>

The composition may include a solvent.

Examples of the solvent include an organic solvent. Examples of the organic solvent include alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

Examples of the alkylene glycol monoalkyl ether carboxylate include propylene glycol monomethyl ether acetate (PGMEA; alternative name: 1-methoxy-2-acetoxypropane), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Examples of the alkylene glycol monoalkyl ether include propylene glycol monomethyl ether (PGME; alternative name: 1-methoxy-2-propanol), propylene glycol monoethyl ether, propylene glycol monopropyl ether, propylene glycol monobutyl ether, ethylene glycol monomethyl ether, and ethylene glycol monoethyl ether.

Examples of the alkyl lactate ester include methyl lactate, ethyl lactate, propyl lactate, and butyl lactate.

Examples of the alkyl alkoxypropionate include ethyl 3-ethoxypropionate, methyl 3-methoxypropionate, methyl 3-ethoxypropionate, and ethyl 3-methoxypropionate.

Preferred examples of the cyclic lactone include β-propiolactone, β-butyrolactone, γ-butyrolactone, α-methyl-γ-butyrolactone, 3-methyl-γ-butyrolactone, γ-valerolactone, γ-caprolactone, γ-octanoic lactone, and α-hydroxy-γ-butyrolactone.

Examples of the monoketone compound which may include a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Examples of the alkylene carbonate include propylene carbonate, vinylene carbonate, ethylene carbonate, and butylene carbonate.

Examples of the alkyl alkoxyacetate include 2-methoxyethyl acetate, 2-ethoxyethyl acetate, 2-(2-ethoxyethoxy) ethyl acetate, 3-methoxy-3-methylbutyl acetate, and 1-methoxy-2-propyl acetate.

Examples of the alkyl pyruvate include methyl pyruvate, ethyl pyruvate, and propyl pyruvate.

The solvent preferably has a boiling point of 130° C. or higher at a normal temperature and a normal pressure.

These solvents may be used singly or in combination of two or more kinds thereof. In the latter case, it is preferable to use a mixed solvent obtained by mixing a solvent including a hydroxyl group with a solvent not including a hydroxyl group.

Examples of the solvent including a hydroxyl group include ethylene glycol, ethylene glycol monomethyl ether, ethylene glycol monoethyl ether, propylene glycol, PGME, propylene glycol monoethyl ether, and ethyl lactate. Among those, PGME or ethyl lactate is preferable.

Examples of the solvent not including a hydroxyl group include PGMEA, ethylethoxypropionate, 2-heptanone, γ-butyrolactone, cyclohexanone, butyl acetate, N-methylpyrrolidone, N,N-dimethylacetamide, and dimethylsulfoxide. Among those, PGMEA, ethylethoxypropionate, or 2-heptanone is preferable.

In a case where a mixed solvent of the solvent including a hydroxyl group and the solvent not including a hydroxyl group is used, the mass ratio thereof is preferably 1/99 to 99/1, more preferably 10/90 to 90/10, and still more preferably 20/80 to 60/40.

Moreover, in a case where a mixed solvent including the solvent not including a hydroxyl group in the amount of 50% by mass or more, it is possible to attain particularly excellent coating evenness. Incidentally, the solvent is preferably a mixed solvent of PGMEA with other one or more kinds of solvents.

The content of the solvent in the composition can be appropriately adjusted in accordance with a desired film thickness or the like. Above all, the concentration of the total solid content of the composition is preferably 0.5% to 30% by mass, more preferably 1.0% to 20% by mass, and still more preferably 1.5% to 10% by mass.

<Surfactant>

The composition may further include a surfactant.

As the surfactant, fluorine-based and silicon-based surfactants (a fluorine-based surfactant, a silicon-based surfactant, and a surfactant having both of a fluorine atom and a silicon atom) are preferable.

Examples of the fluorine-based and/or silicon-based surfactants include the surfactants described in <0276> in US2008/0248425A, for example, EFTOP EF301 or EF303 (manufactured by Shin-Akita Kasei K. K.); FLORAD FC430, 431, or 4430 (manufactured by Sumitomo 3M Inc.); MEGAFACE F171, F173, F176, F189, F113, F110, F177, F120, or R08 (manufactured by Dainippon Ink & Chemicals, Inc.); SURFLON S-382, SC101, 102, 103, 104, 105, or 106 (manufactured by Asahi Glass Co., Ltd.); TROYSOL S-366 (manufactured by Troy Chemical Corp.); GF-300 or GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, or EF601 (manufactured by JEMCO Inc.); PF636, PF656, PF6320, or PF6520 (manufactured by OMNOVA Solutions Inc.); or FTX-204Q 208Q 218Q 230Q 204D, 208D, 212D, 218D, or 222D (manufactured by NEOS Co, Ltd.) may be used. In addition, POLYSILOXANE POLYMER KP-341 (manufactured by Shin-Etsu Chemical Co., Ltd.) can also be used as the silicon-based surfactant.

In addition, examples of the commercially available surfactant include MEGAFACE F178, F-470, F-473, F-475, F-476, and F-472 (manufactured by Dainippon Ink & Chemicals, Inc.); a copolymer of an acrylate (or methacrylate) having a $C_6F_{13}$ group with a (poly(oxyalkylene)) acrylate (or methacrylate); and a copolymer of an acrylate (or methacrylate) having a $C_3F_7$ group with a (poly(oxyethylene)) acrylate (or methacrylate) and a (poly(oxypropylene)) acrylate (or methacrylate).

In addition, other examples of the surfactant include surfactants described in paragraph <0280> of US2008/0248425A, which are other than the fluorine-based and/or silicon-based surfactants.

The content of the surfactant is preferably 0% to 2% by mass, more preferably 0% to 1.5% by mass, and still more preferably 0% to 1% by mass, with respect to a total solid content of the composition.

The surfactants may be used singly or in combination of two or more kinds thereof.

<Other Additives>

The composition may further include a dye, a plasticizer, a light sensitizer, a light absorbent, a compound that promotes solubility in a developer (for example, a phenol compound having a molecular weight of 1,000 or less, and an alicyclic or aliphatic compound having a carboxyl group), and the like, as desired.

Such a phenol compound having a molecular weight of 1,000 or less can be easily synthesized by those skilled in the art with reference to the method described in, for example, JP1992-122938A (JP-H04-122938A), JP1990-028531A (JP-H02-028531A), U.S. Pat. No. 4,916,210A, EP219294B, and the like.

Specific examples of the alicyclic or aliphatic compound having a carboxyl group include a carboxylic acid derivative having a steroid structure such as cholic acid, deoxycholic acid, and lithocholic acid, an adamantane carboxylic acid derivative, adamantane dicarboxylic acid, cyclohexane carboxylic acid, and cyclohexane dicarboxylic acid.

<Pattern Forming Method>

The pattern forming method of an embodiment of the present invention is carried out using the above-mentioned composition.

Specifically, the pattern forming method of the embodiment of the present invention includes forming a film (resist film) of the above-mentioned composition on a substrate (hereinafter also referred to as a "step (1)"), irradiating the resist film with actinic rays or radiation (hereinafter also referred to as a "step (2)"), performing development of the resist film irradiated with actinic rays or radiation with an aqueous alkali solution (hereinafter also referred to as a "step (3)").

Hereinafter, each of the steps will be described in detail.

[Step (1): Film Forming Step]

Examples of a method for forming a resist film on a substrate include a method in which the composition is applied onto a substrate. The application method is not particularly limited, and examples thereof include a spin coating method, a spray method, a roller coating method, and an immersion method, and the spin coating method is preferable.

After forming the resist film, the substrate may be heated (prebaked (PB)), as desired. Thus, a film from which unnecessary residual solvents have been removed can be uniformly formed. A prebaking temperature after forming the resist film is not particularly limited, but is preferably 50° C. to 160° C., and more preferably 60° C. to 140° C.

The substrate on which the resist film is formed is not particularly limited, and examples thereof include inorganic substrates such as silicon, SiN, and $SiO_2$; coating type inorganic substrates such as spin on glass (SOG); and substrates generally used in a process for manufacturing a semiconductor such as an integrated circuit (IC), a process for manufacturing a circuit board for a liquid crystal, a thermal head, or the like, and other lithographic processes of photofabrication, and the like.

The film thickness of the resist film is not particularly limited, but is preferably 1 to 500 nm, and more preferably 1 to 200 nm.

Prior to forming the resist film, an antireflection film may be disposed onto the substrate in advance.

As the antireflection film, an antireflection film in any type of an inorganic film type such as titanium, titanium dioxide, titanium nitride, chromium oxide, carbon, and amorphous silicon, and an organic film type formed of a light absorber and a polymer material can be used. In addition, as the organic antireflection film, a commercially available organic antireflection film can also be used.

[Step (2): Exposing Step]

The exposing step is a step of irradiating the resist film with actinic rays or radiation. Irradiation with actinic rays or radiation can be performed by a known method, and for example, the resist film is irradiated with actinic rays or radiation through a predetermined mask. Here, it is preferable that actinic rays or radiation is irradiated through an immersion liquid. That is, it is preferable that irradiation with actinic rays or radiation is performed with liquid immersion exposure.

The wavelength of a light source for use in an exposure apparatus is not particularly limited, but light at a wavelength of 250 nm or less is preferable, and examples of the light include KrF excimer laser light (248 nm), ArF excimer laser light (193 nm), F2 excimer laser light (157 nm), EUV light (13.5 nm), and electron beams.

An exposure dose can be appropriately selected, but is preferably 10 to 60 $mJ/cm^2$.

In the case of performing liquid immersion exposure, a surface of the resist film may be washed with an aqueous chemical solution before the exposure and/or after the exposure and before performing heating.

The immersion liquid is preferably a liquid which is transparent to the exposure wavelength and has as small a temperature coefficient of a refractive index as possible so as to minimize the distortion of an optical image projected on the resist film. Particularly, in a case where the exposure light source is ArF excimer laser light (wavelength: 193 nm), water is preferable as the immersion liquid from the viewpoints of easy availability and easy handleability, in addition to the above-mentioned viewpoints.

In a case where water is used as the immersion liquid, a small proportion of an additive (liquid) that increases the surface-active activity while decreasing the surface tension of water may be added to water. This additive is preferably an additive that does not dissolve the resist film on the substrate and gives only a negligible effect on the optical coat at the undersurface of the lens element. As the water to be used, distilled water is preferable. In addition, pure water obtained by performing filtration through an ion exchange filter may also be used. With a use of pure water, it is possible to suppress the distortion of an optical image projected on the resist film due to incorporation of impurities.

Moreover, from the viewpoint that the refractive index can further be enhanced, a medium having a refractive index of 1.5 or more can also be used as the immersion liquid. This medium may be either an aqueous solution or an organic solvent.

In the pattern forming method, the exposing step may be performed a plurality of times. In this case, the exposure performed a plurality of times may use the same light source or different light sources, but ArF excimer laser light (wavelength: 193 nm) is preferably used for the first exposure.

After the exposure, development (preferably followed by rinsing) is preferably performed under heating (baking). Thus, a good pattern can be obtained. The baking temperature is not particularly limited as long as a good pattern is obtained, and is usually 40° C. to 160° C. The baking may be performed once or a plurality of times.

[Step (3): Developing Step]

The developing step is a step of developing the resist film irradiated with actinic rays or radiation with an aqueous alkali solution.

Examples of an alkali included in the aqueous alkali solution include inorganic alkalis such as sodium hydroxide, potassium hydroxide, sodium carbonate, sodium silicate, and sodium metasilicate; primary amines such as ethylamine and n-propylamine; secondary amines such as diethylamine and di-n-butylamine; tertiary amines such as triethylamine and methyldiethylamine; alcoholamines such as dimethylethanolamine and triethanolamine; quaternary ammonium salts such as tetramethylammonium hydroxide and tetraethylammonium hydroxide; and cyclic amines such as pyrrole and piperidine.

In addition, an appropriate amount of alcohols and/or a surfactant may also be added to the aqueous alkali solution.

The alkali concentration of the aqueous alkali solution is preferably 0.1% to 20% by mass.

The pH of the aqueous alkali solution is preferably 10.0 to 15.0.

In addition, after performing the developing treatment, a rinsing treatment using a rinsing liquid may be carried out, as desired.

Examples of the rinsing liquid include pure water. An appropriate amount of a surfactant may be added to the pure water.

Moreover, after the developing treatment or the rinsing treatment, a treatment for removing the developer or rinsing liquid adhering on the pattern by a supercritical fluid may be performed.

In the resist film obtained in [Step (1): Film Forming Step] above, the fluorine-containing polymer is unevenly distributed in the upper layer region in the resist film, and as a result, a resist film having an excellent water tracking property is obtained. More specifically, the obtained resist film includes an underlayer including a resin whose solubility in an aqueous alkali solution increases by the action of an acid, a compound that generates an acid upon irradiation with actinic rays or radiation, and an ester compound; and an upper layer including a fluorine-containing polymer, arranged on the underlayer. Usually, in the underlayer, the resin whose solubility in an aqueous alkali solution increases by the action of an acid is a component having the most content. On the other hand, the upper layer is preferably a layer including the fluorine-containing polymer as a main component. The main component is intended to mean that a content of the fluorine-containing polymer is 50% by mass or more with respect to the total mass of the upper layer.

In addition, it is also possible to obtain a resist film having the configuration by preparing a first composition including a resin whose solubility in an aqueous alkali solution increases by the action of an acid, a compound that generates an acid upon irradiation with actinic rays or radiation, and an ester compound, and a second composition including a fluorine-containing polymer, applying the first composition onto a substrate, and then applying the second composition thereon. In this case, it is necessary to carry out the applying step twice, but in a case of using the composition of the embodiment of the present invention, a resist film having the same configuration as above is obtained by performing the application once, which is thus a preferable process.

The pattern forming method can be applied to a method for manufacturing an electronic device. In the present specification, the electronic device is intended to mean a semiconductor device, a liquid crystal device, and electric or electronic equipment (home appliances, media-related equipment, optical equipment, telecommunication equipment, and the like).

EXAMPLES

Examples will be described below, but the present invention is not limited thereto.

Hereinbelow, the compounds used in Examples and Comparative Examples will be described in detail.

<Resin Whose Solubility in Aqueous Alkali Solution Increases by Action of Acid (Resin (A))>

The resins whose solubility in an aqueous alkali solution increases by the action of an acid used in Examples and Comparative Examples are shown below. Further, in the tables which will be described later, the molar ratios (in order from the left side in the structural formulae), the weight-average molecular weights (Mw), and the dispersities (Mw/Mn) of the repeating units in the respective resin are shown.

(1)

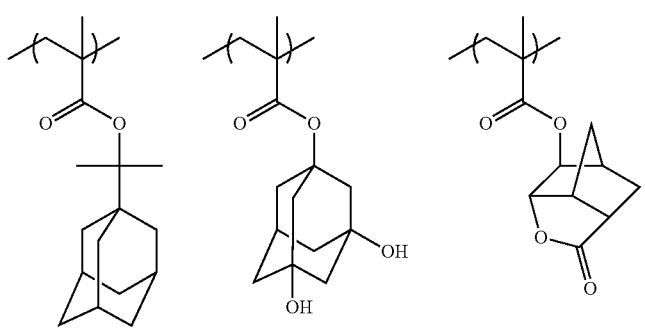

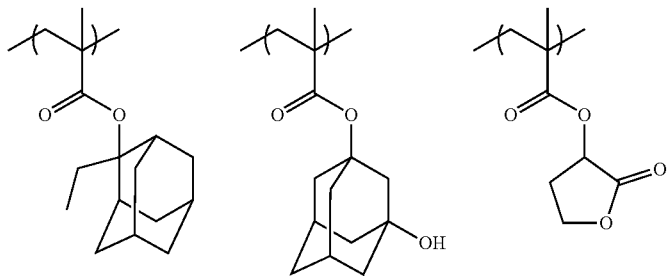
(2)
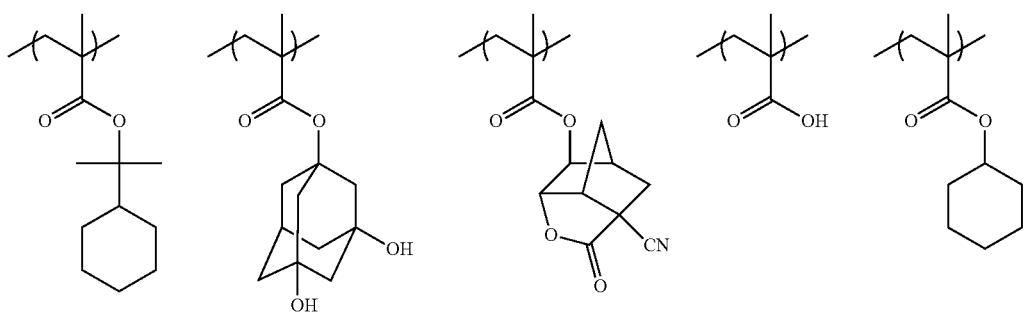
(3)
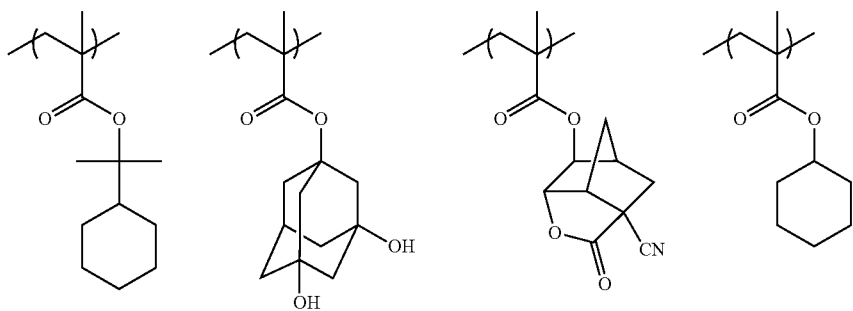
(4)
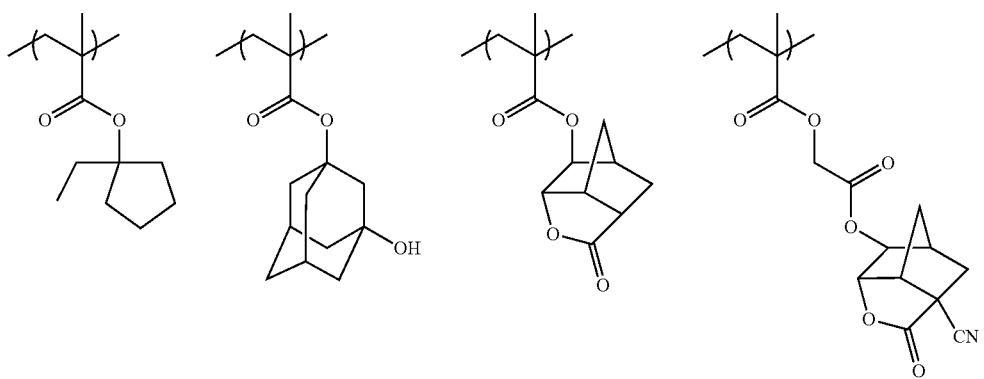
(5)
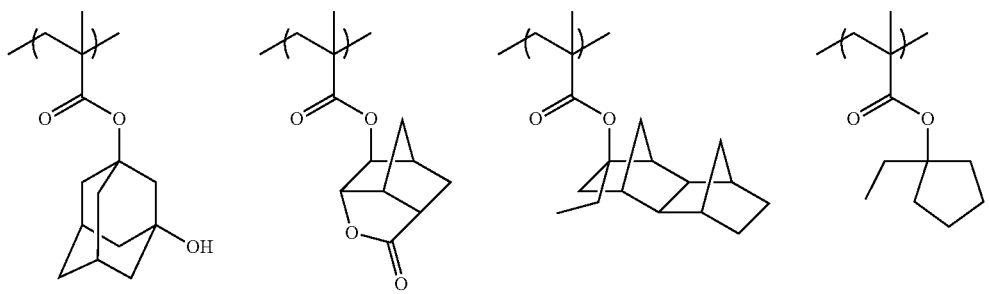
(6)

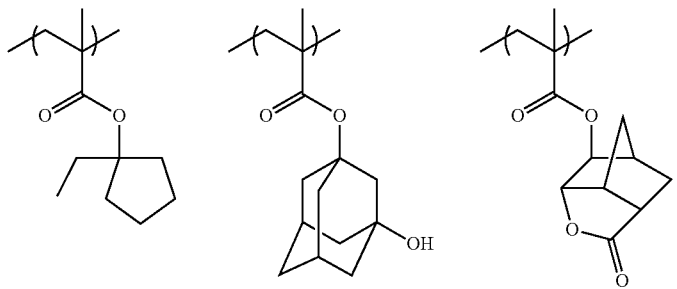
(7)
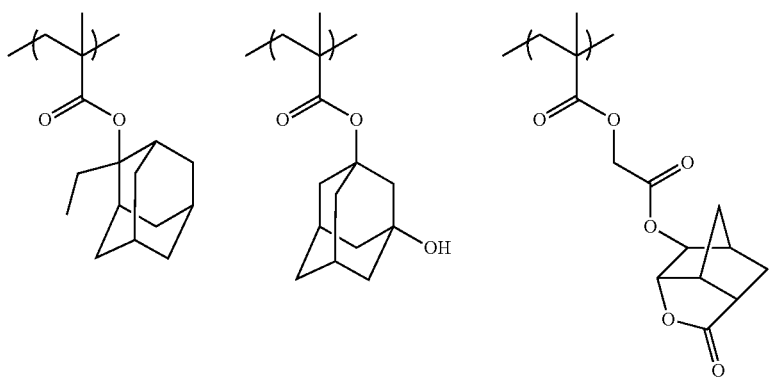
(8)
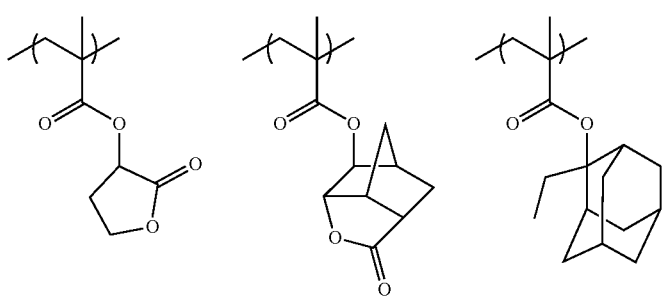
(9)
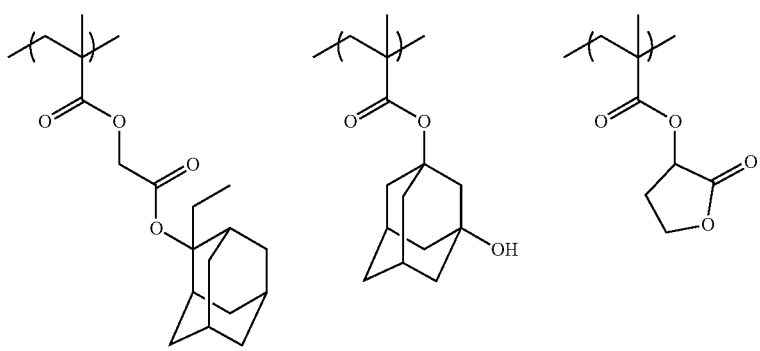
(10)

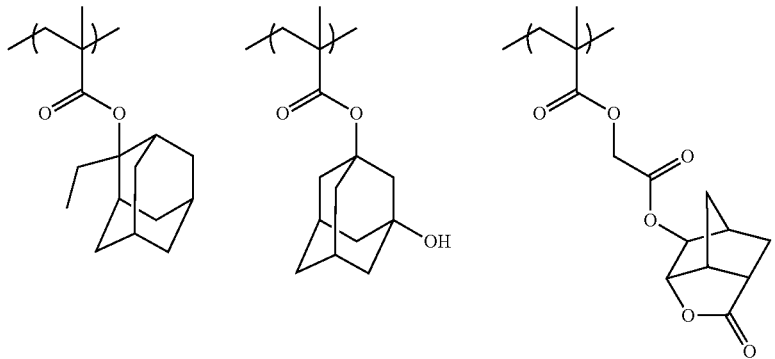
(11)
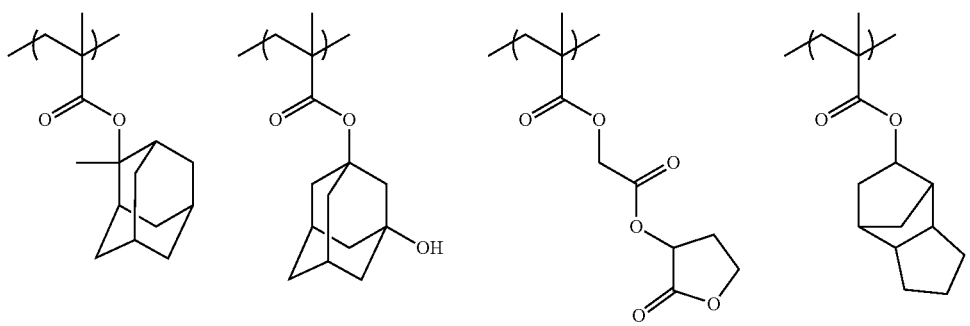
(12)
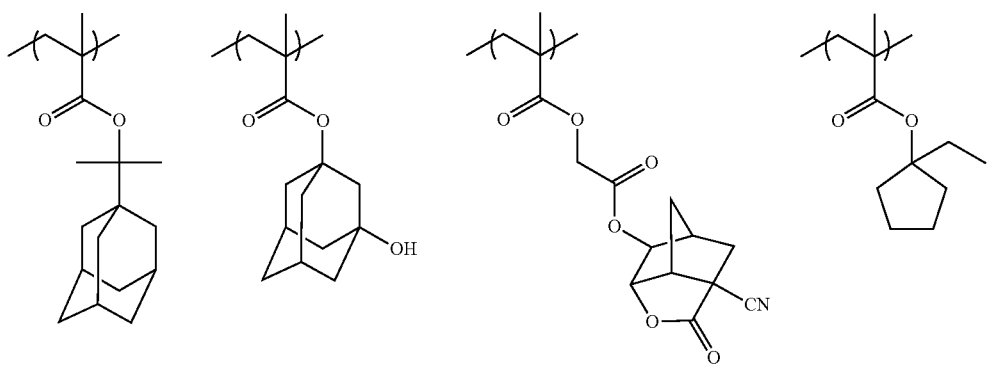
(13)
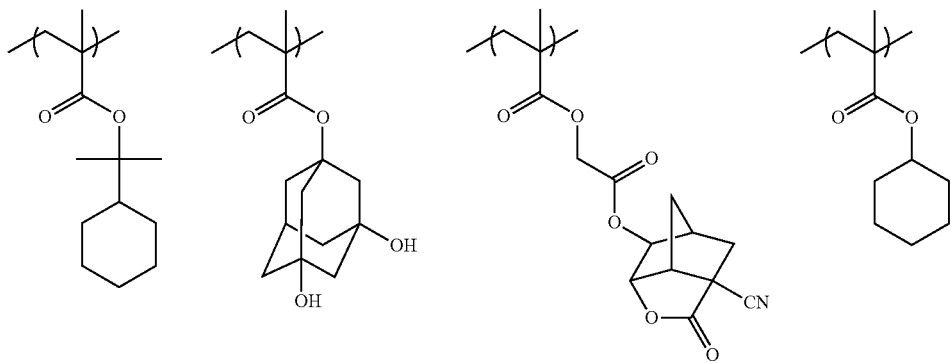
(14)

(15)
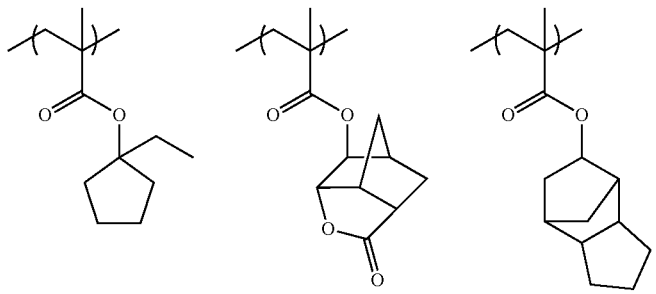
(16)
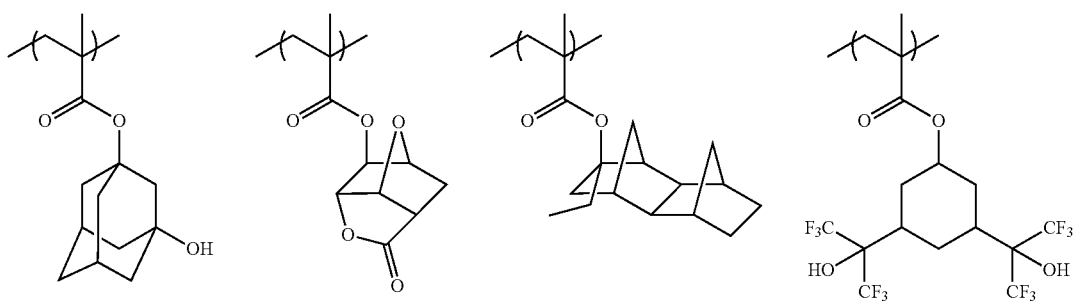
(17)
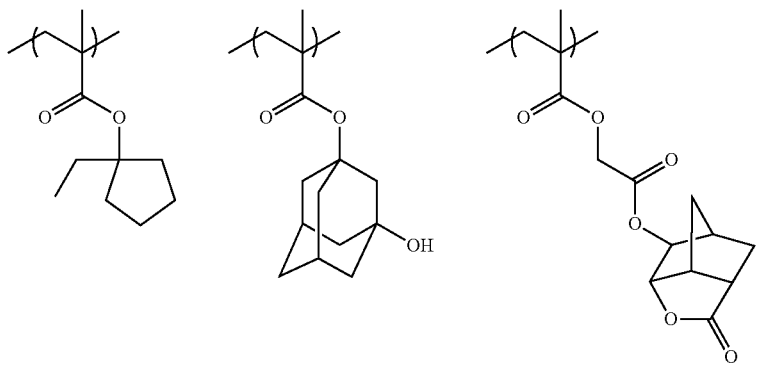
(18)
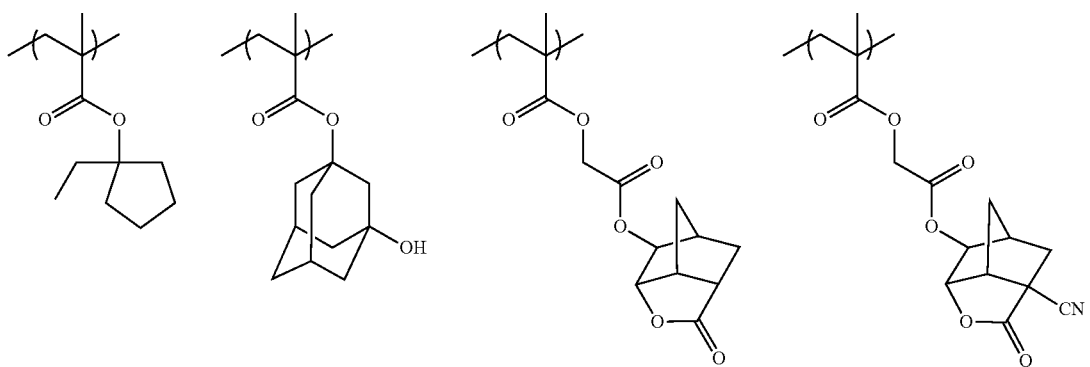

-continued
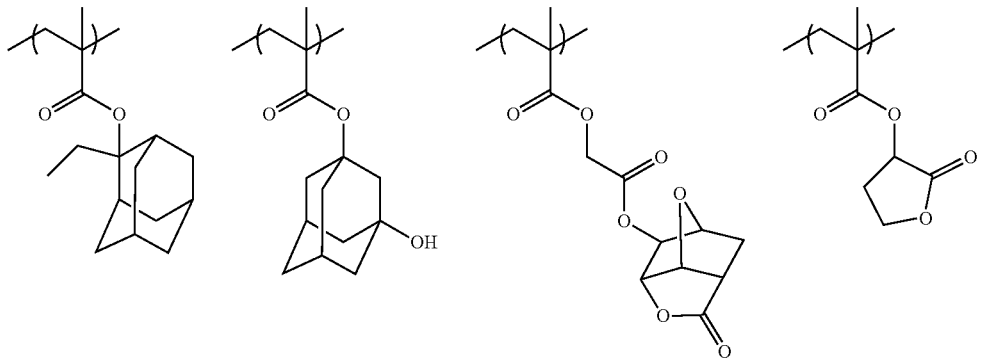
(19)
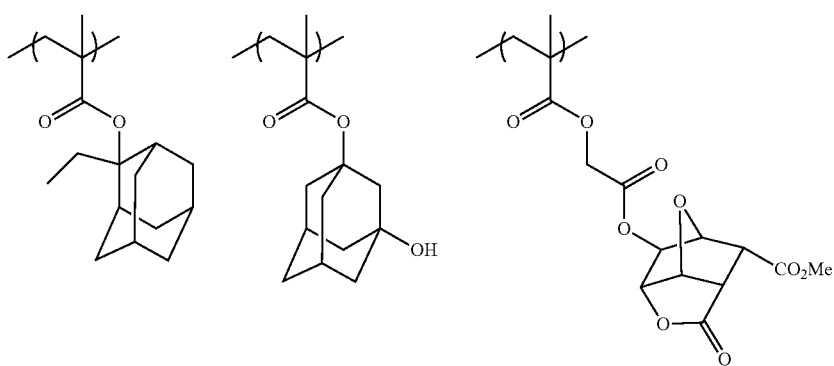
(20)
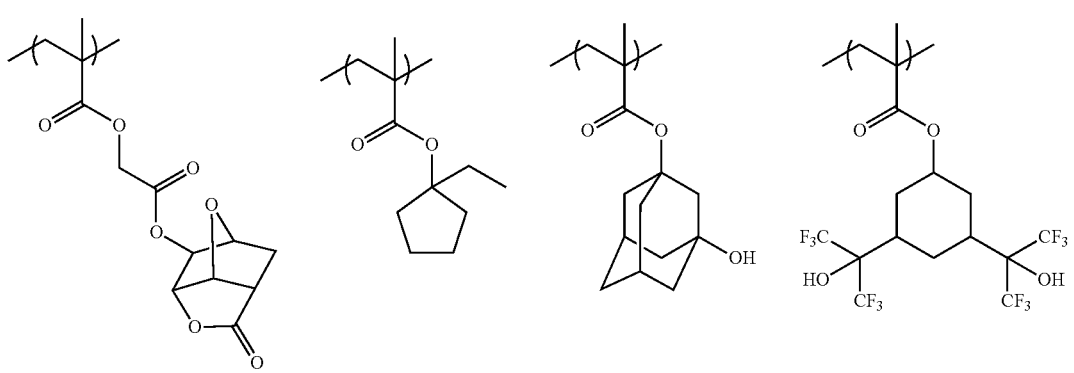
(21)
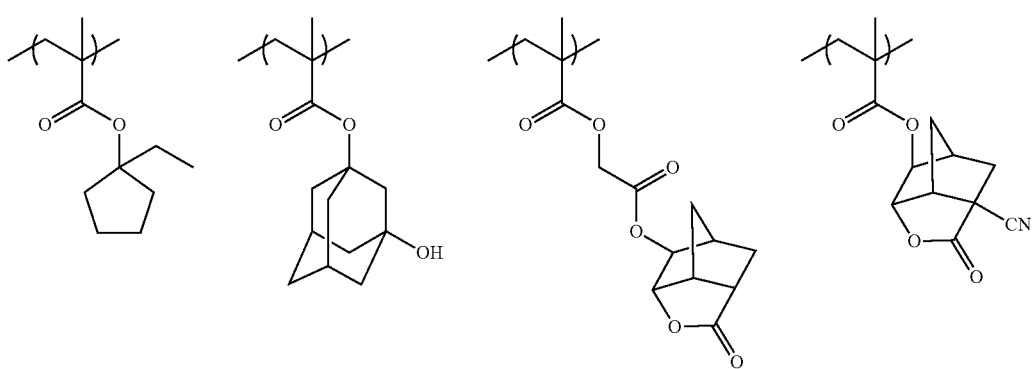
(22)

-continued
(23)
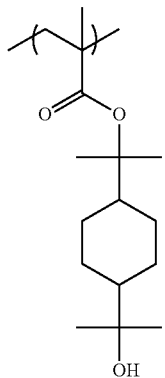 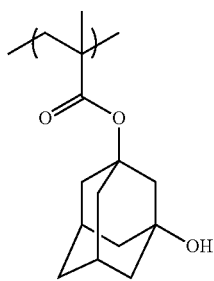 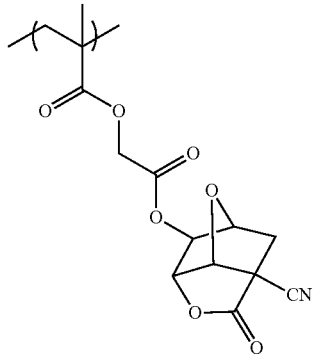 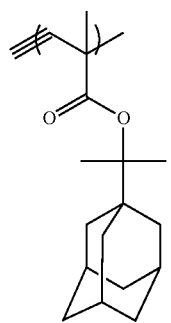
(24)
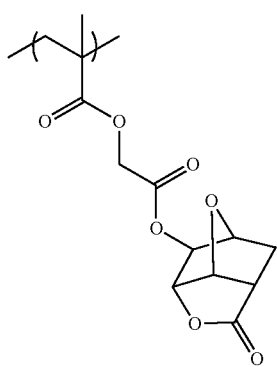 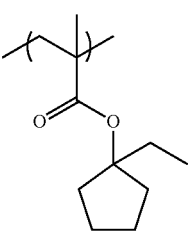 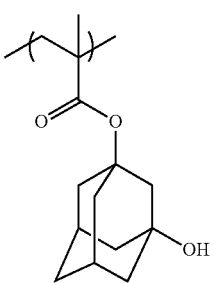 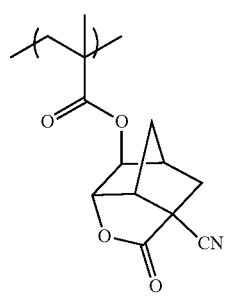
(25)
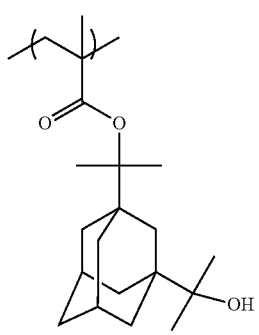 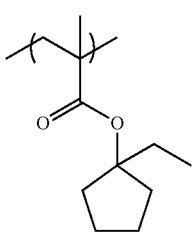 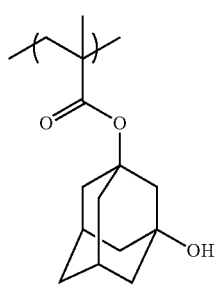
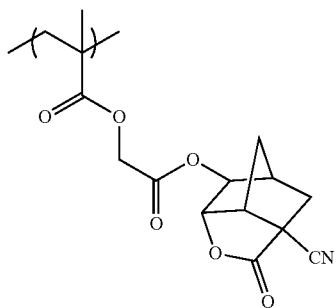 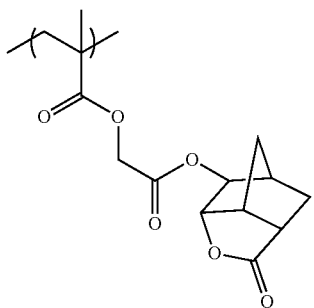

-continued
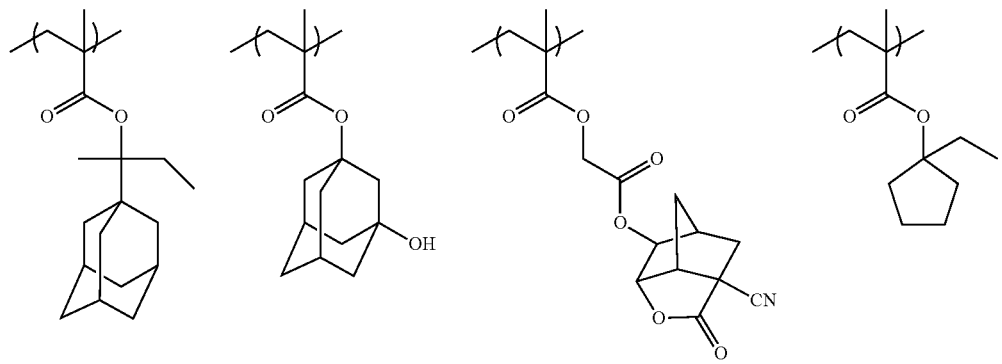
(26)
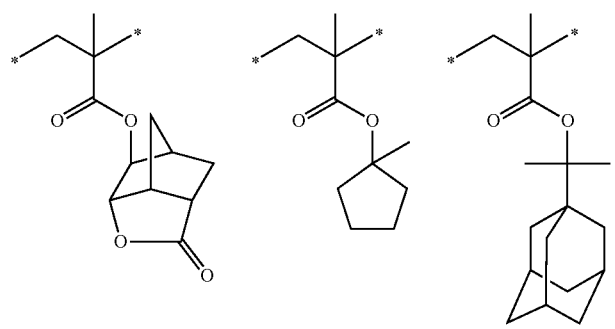
(27)
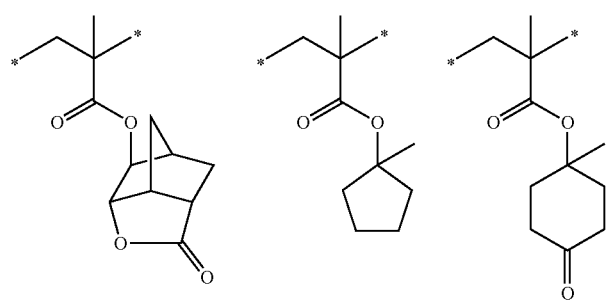
(28)
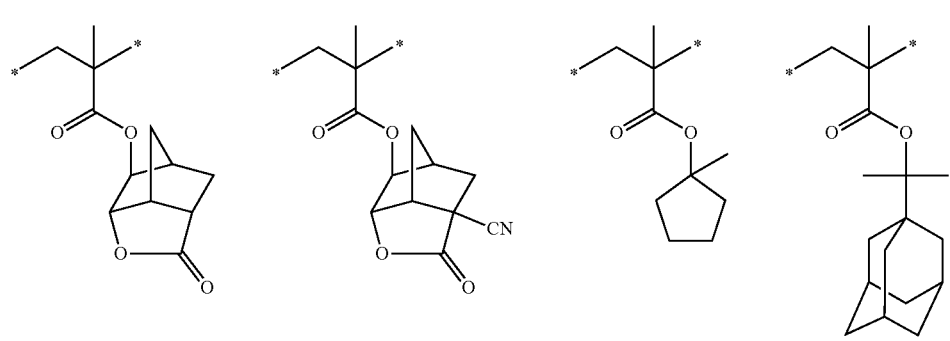
(29)

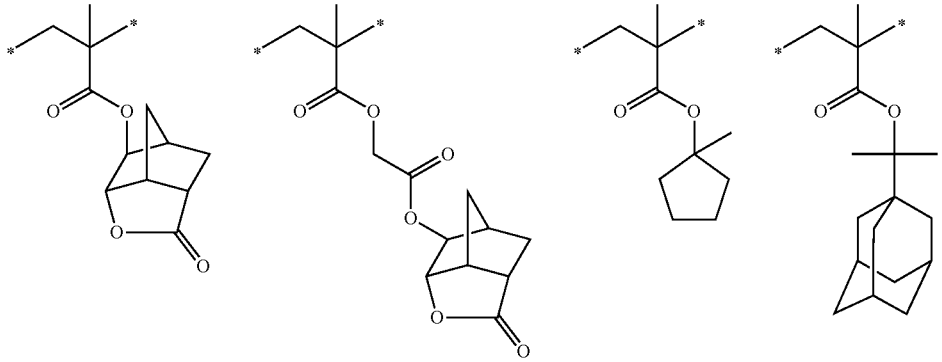
(30)
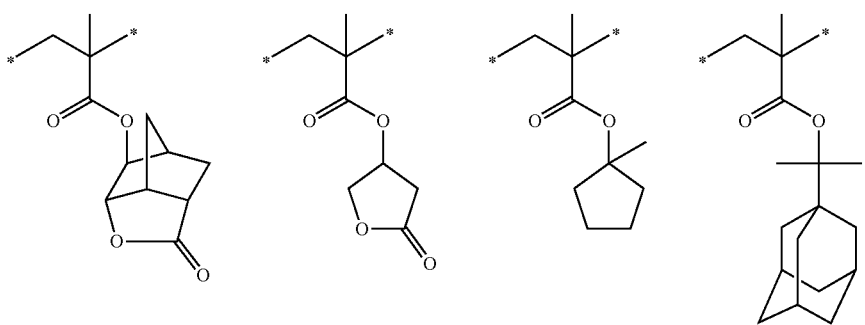
(31)
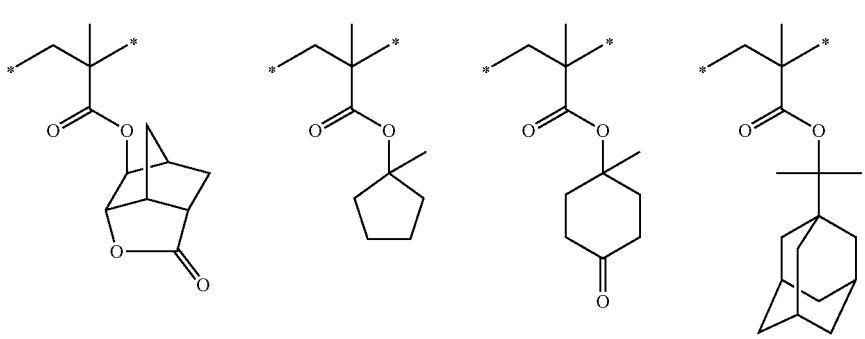
(32)
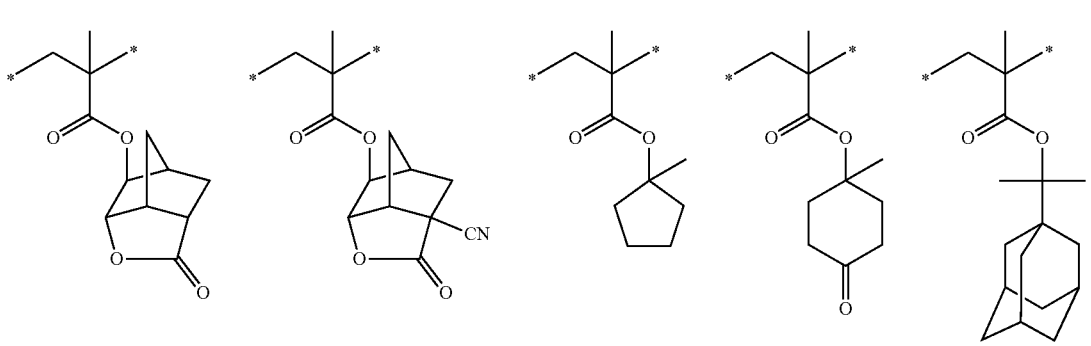
(33)

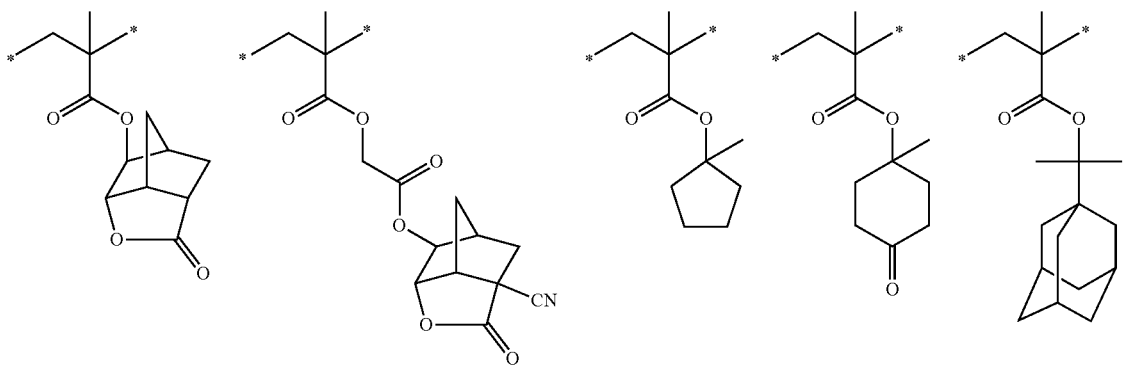
(34)
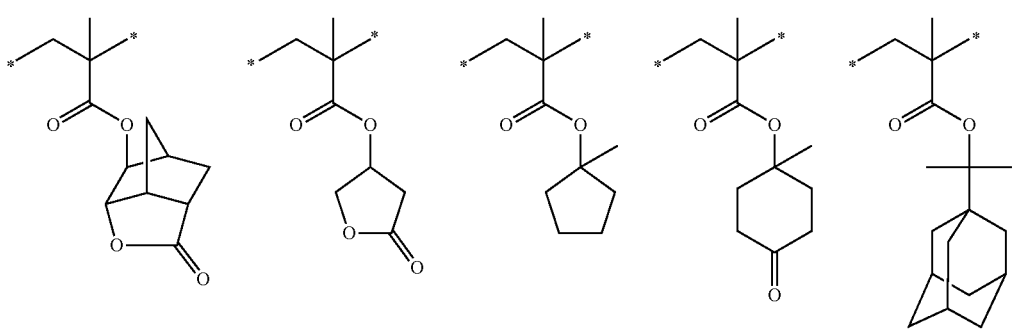
(35)
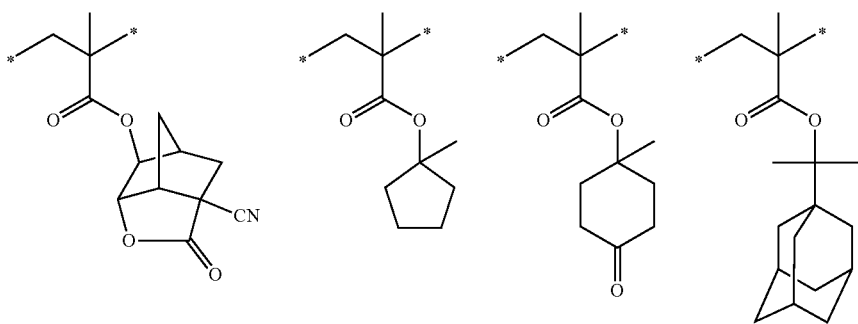
(36)
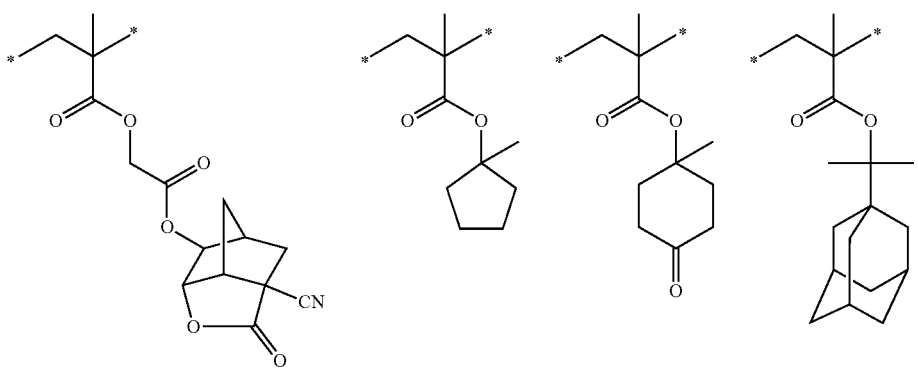
(37)

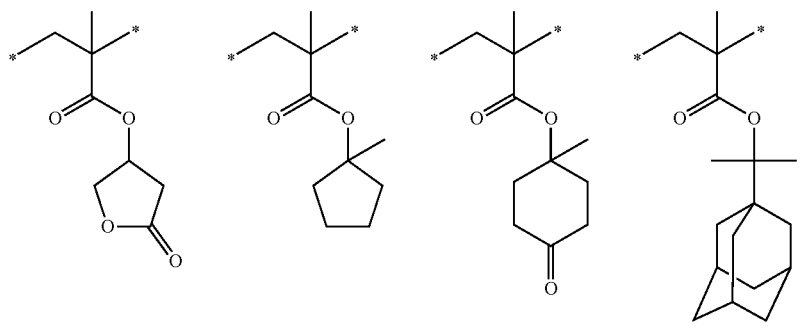

(38)

TABLE 3

| Resin (A) | Composition (molar ratio) | Mw | Mw/Mn |
| --- | --- | --- | --- |
| 1 | 50/10/40 | 8,800 | 1.9 |
| 2 | 40/20/40 | 7,000 | 1.6 |
| 3 | 40/10/35/5/10 | 10,000 | 1.7 |
| 4 | 40/10/40/10 | 11,000 | 1.8 |
| 5 | 40/15/20/25 | 8,500 | 1.6 |
| 6 | 10/40/25/25 | 12,000 | 1.8 |
| 7 | 50/20/30 | 6,500 | 1.6 |
| 8 | 40/10/50 | 8,000 | 1.7 |
| 9 | 25/25/50 | 9,000 | 1.8 |
| 10 | 50/10/40 | 11,000 | 1.8 |
| 11 | 50/10/40 | 8,000 | 1.7 |
| 12 | 40/10/40/10 | 7,000 | 1.7 |
| 13 | 20/15/35/30 | 10,000 | 1.7 |
| 14 | 45/10/35/10 | 8,500 | 1.7 |
| 15 | 50/40/10 | 10,000 | 1.6 |
| 16 | 10/40/40/10 | 9,000 | 1.8 |
| 17 | 55/10/35 | 12,000 | 1.8 |
| 18 | 40/15/20/25 | 9,000 | 1.7 |
| 19 | 40/15/30/15 | 7,500 | 1.6 |
| 20 | 40/15/45 | 8,000 | 1.6 |
| 21 | 40/40/10/10 | 9,500 | 1.8 |
| 22 | 35/15/25/25 | 10,000 | 1.7 |
| 23 | 20/15/45/20 | 8,000 | 1.6 |
| 24 | 25/35/15/25 | 9,000 | 1.8 |
| 25 | 10/30/10/30/20 | 10,000 | 1.7 |
| 26 | 20/10/40/30 | 10,500 | 1.6 |

TABLE 4

| Resin (A) | Composition (molar ratio) | Mw | Mw/Mn |
| --- | --- | --- | --- |
| 27a | 40/40/20 | 8,200 | 1.6 |
| 27b | 50/30/20 | 8,300 | 1.6 |
| 28 | 40/30/30 | 8,000 | 1.6 |
| 29 | 20/20/40/20 | 8,300 | 1.6 |
| 30 | 20/20/30/30 | 8,400 | 1.5 |
| 31 | 20/20/15/45 | 8,600 | 1.5 |
| 32 | 40/15/30/15 | 8,400 | 1.6 |
| 33 | 20/20/20/20/20 | 9,000 | 1.7 |
| 34 | 20/20/15/30/15 | 9,500 | 1.8 |
| 35 | 15/15/25/35/10 | 10,000 | 1.7 |
| 36 | 35/20/35/10 | 7,500 | 1.6 |
| 37 | 40/10/10/40 | 9,000 | 1.7 |
| 38 | 40/15/30/15 | 7,000 | 1.5 |

In addition, the resin 27a and the resin 27b correspond to resins which have the same kinds of repeating units included in the resins and different compositional ratios.

<Compound that Generates Acid Upon Irradiation with Actinic Rays or Radiation>

The compounds that generate an acid upon irradiation with actinic rays or radiation used in Examples and Comparative Examples are shown below.

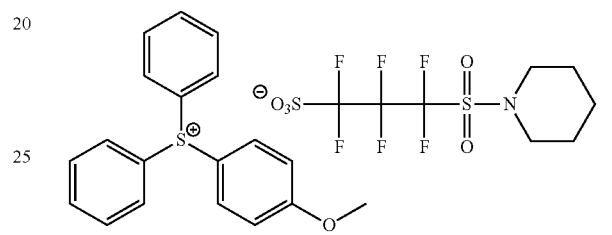

PAG-1

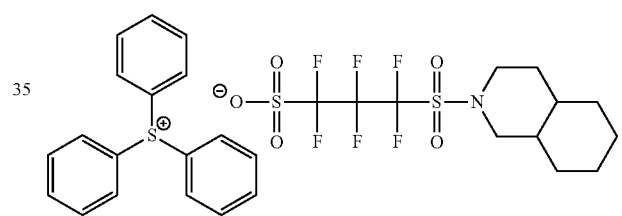

PAG-2

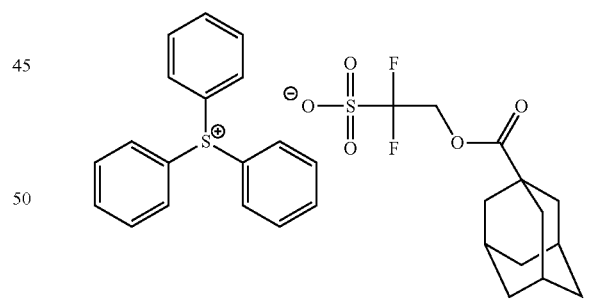

PAG-3

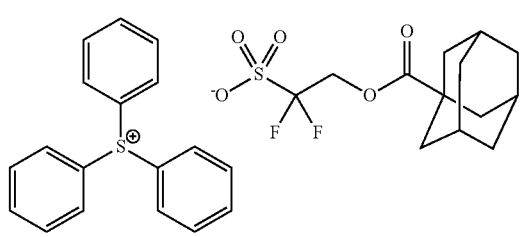

PAG-4

PAG-5
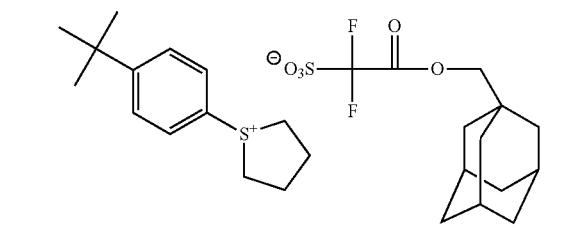
PAG-6
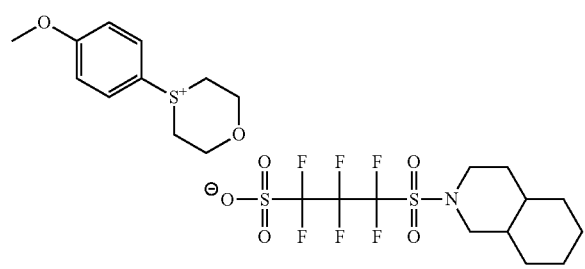
PAG-7
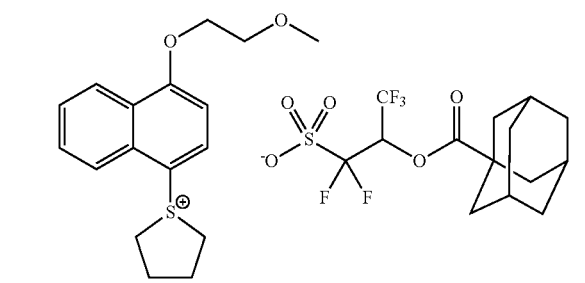
PAG-8
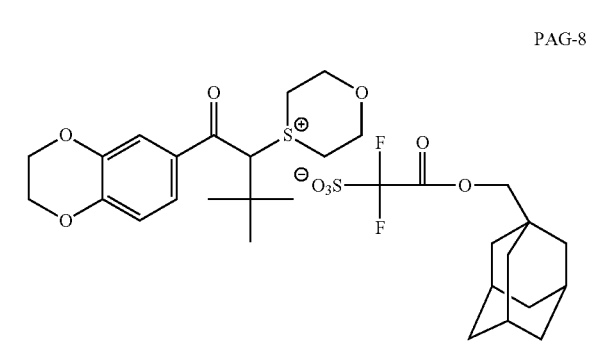
PAG-9
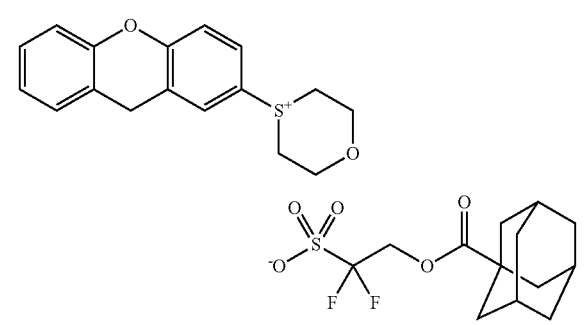
PAG-10
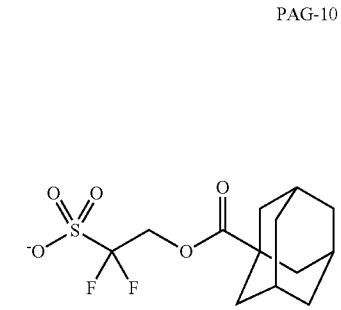
PAG-11
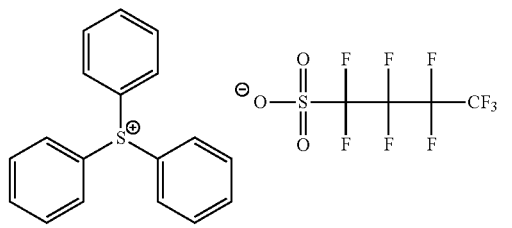
PAG-12
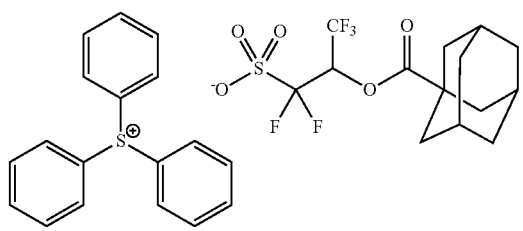
PAG-13
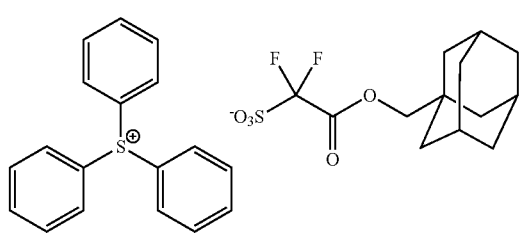
PAG-14
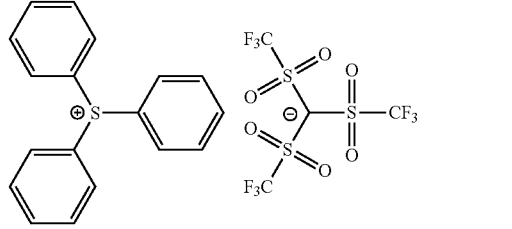
PAG-15
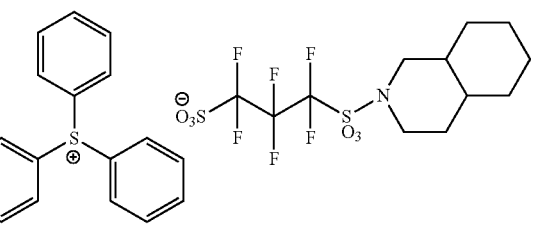

PAG-16

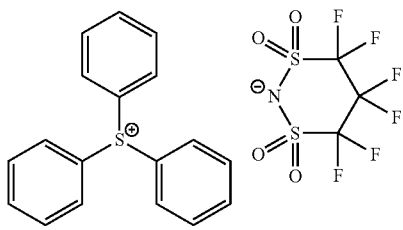

<Acid Diffusion Control Agent>

The acid diffusion control agents used in Examples and Comparative Examples are shown below.

<Ester Compound>

The ester compounds used in Examples and Comparative Examples are shown below. In addition, all of the ester compounds used in Examples and Comparative Examples had alkali decomposability. The definition of the expression, "having alkali decomposability", is as described above.

N-1

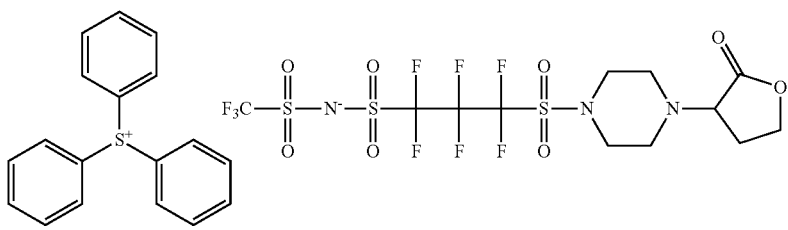

N-2

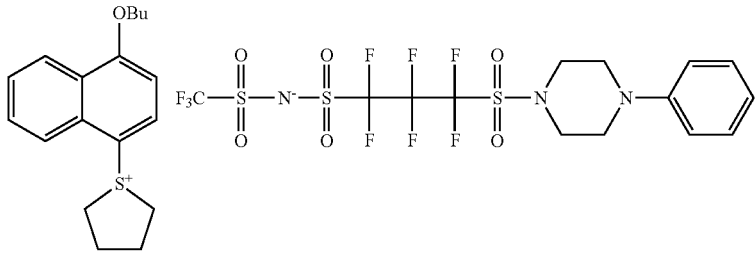

N-3

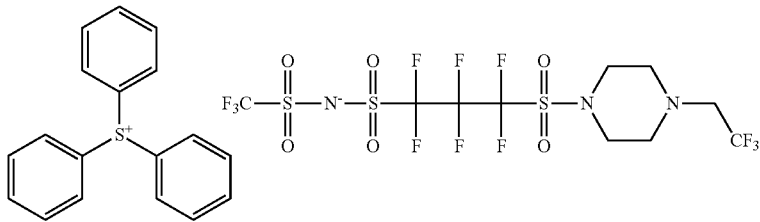

N-4

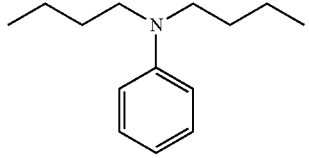

N-5

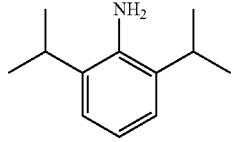

N-6

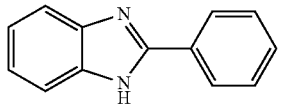

N-7

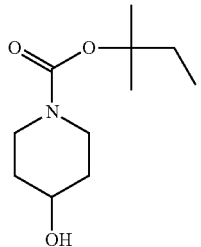

N-8

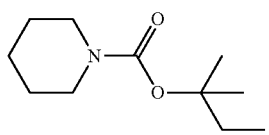

N-9

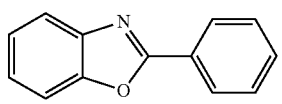

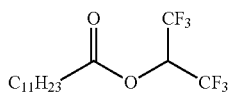
D-24

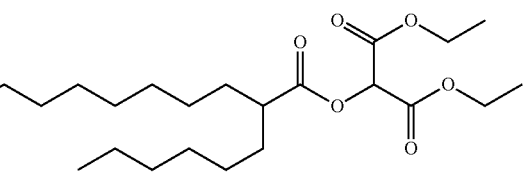
D-44

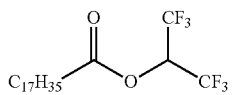
D-25

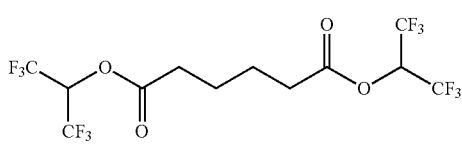
D-26

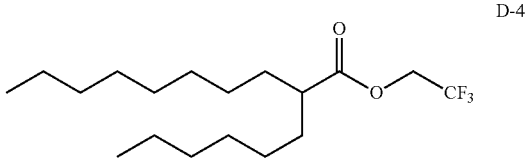
D-45

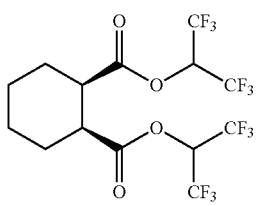
D-33

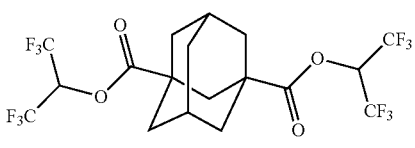
D-46

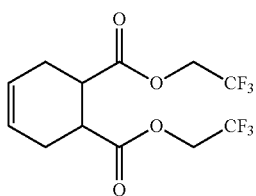
D-34

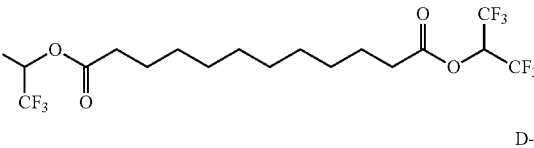
D-47

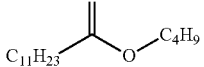
D-1

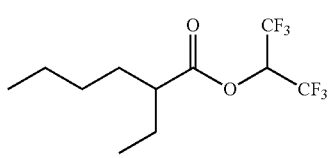
D-37

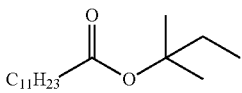
D-16

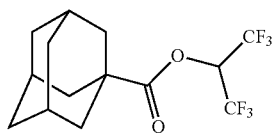
D-39

<Fluorine-Containing Polymer>

The fluorine-containing polymers used in Examples and Comparative Examples are shown below.

In addition, the numbers of the fluorine-containing polymers shown below are consistent with the numbers in the above-mentioned specification, and the content, Mw, and the dispersity (Pd) of each repeating unit in each polymer are as described above.

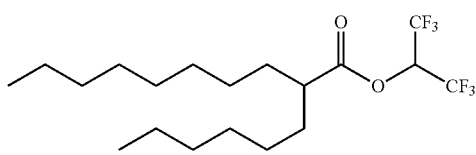
D-42

In addition, among the fluorine-containing polymers shown below, all of the fluorine-containing polymers other than P-203, P-207, P-216, and P-220 had alkali decomposability. The definition of the expression, "having alkali decomposability", is as described above.

(P-203)

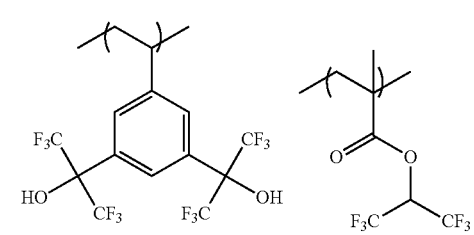

-continued
(P-54)
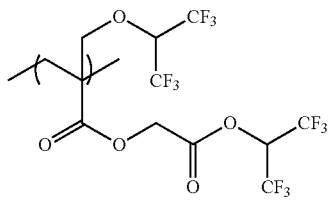 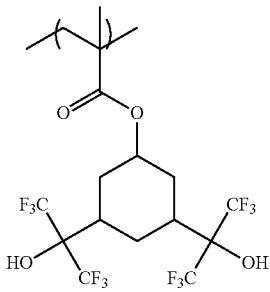
(P-13)
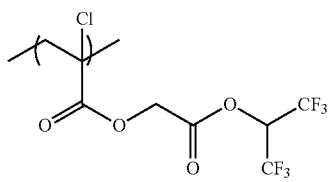
(P-17)
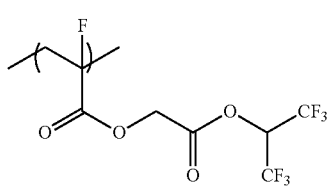
(P-96)
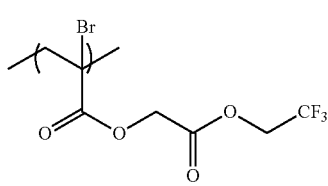 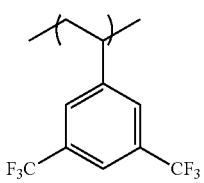
(P-220)
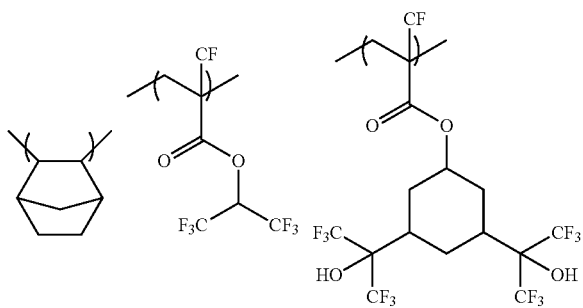
(P-25)
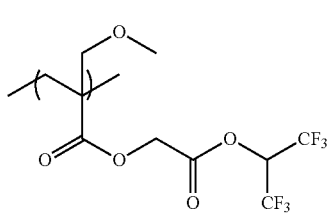

-continued
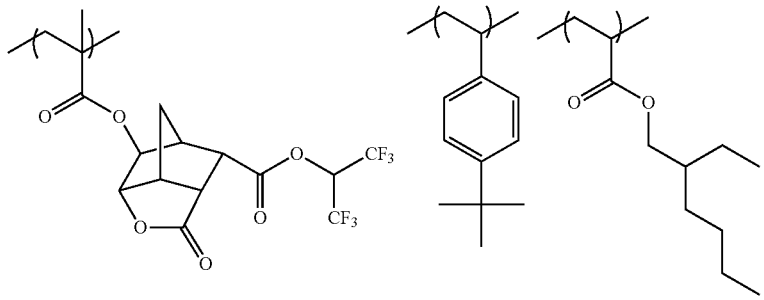
(P-226)
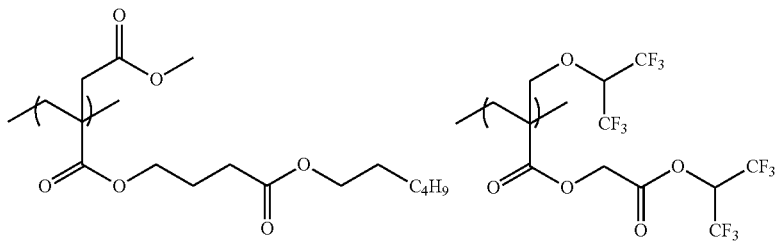
(P-91)
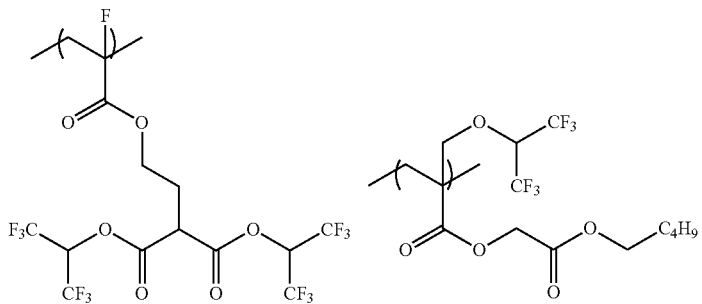
(P-83)
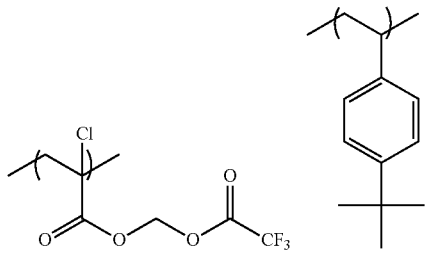
(P-98)
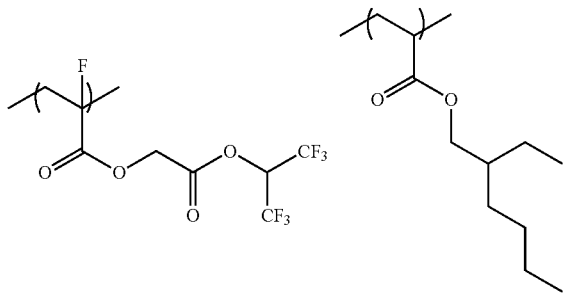
(P-47)
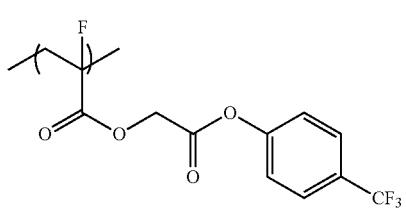
(P-2)

-continued
(P-124)
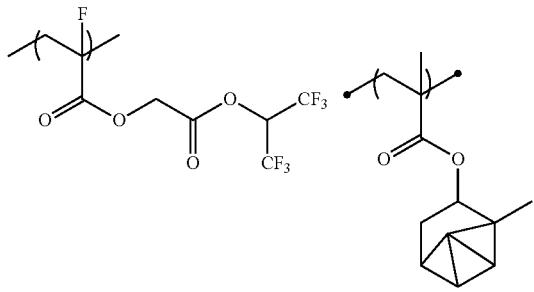
(P-115)
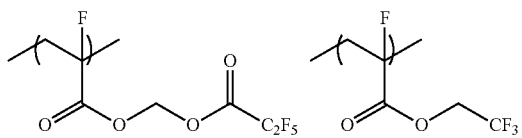
(P-52)
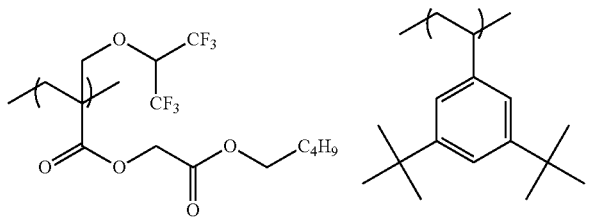
(P-81)
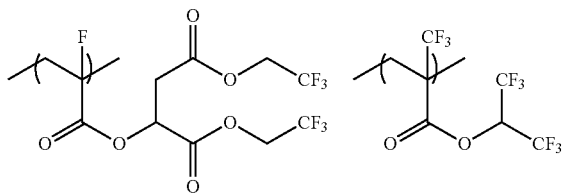
(P-11)
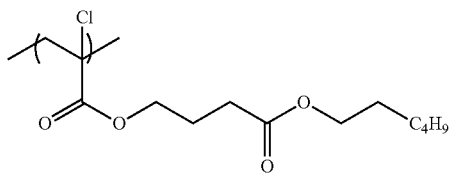
(P-36)
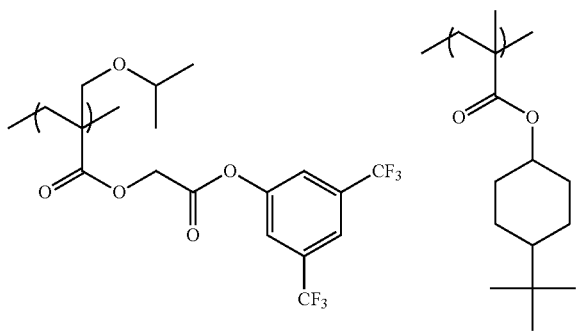

(P-66)
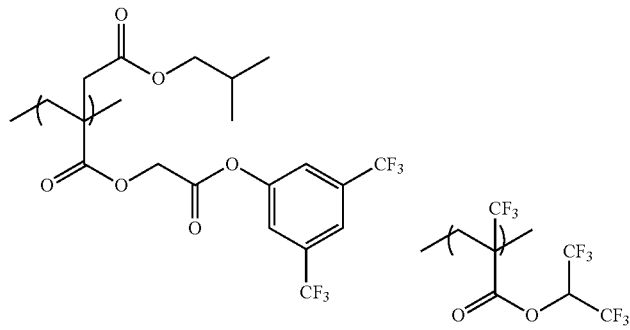
(P-1)
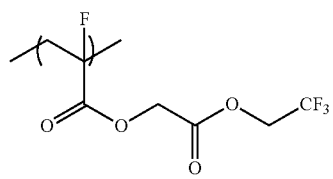
(P-93)
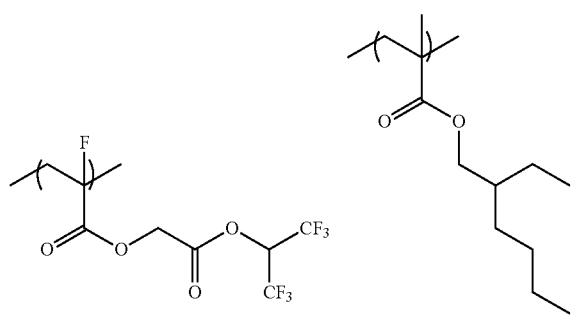
(P-84)
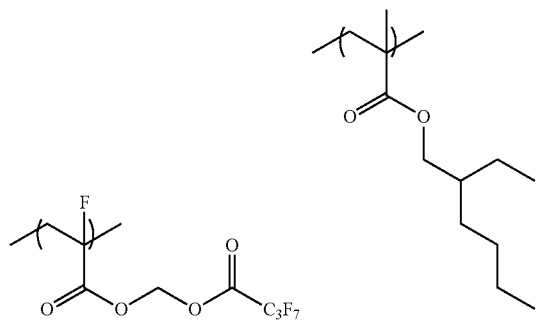
(P-77)
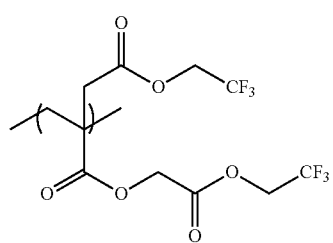

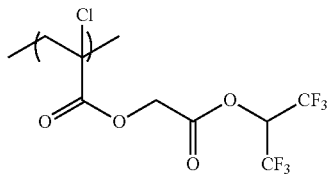
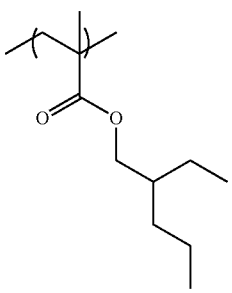
(P-30)
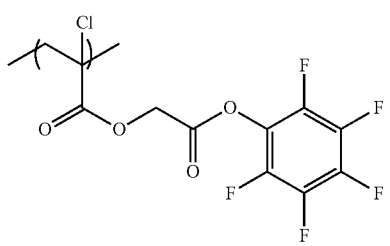
(P-62)
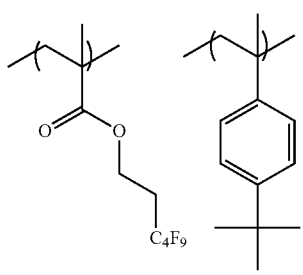
(P-216)
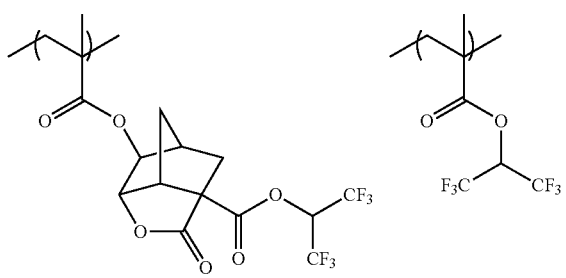
(P-224)
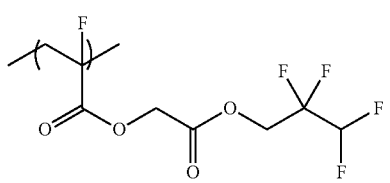
(P-86)
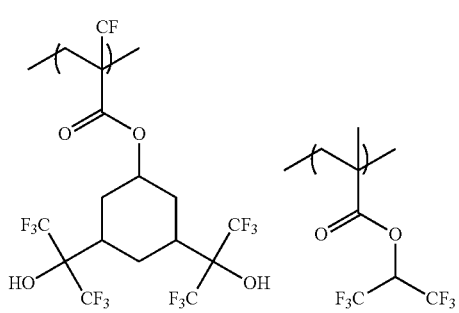
(P-207)

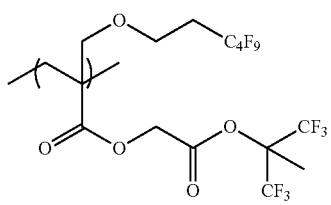
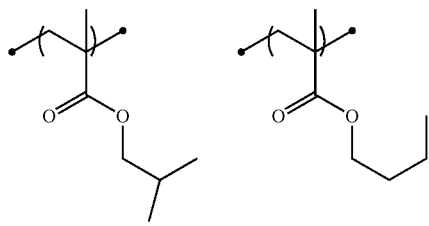

(P-151)

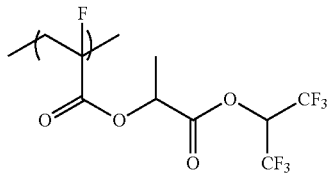
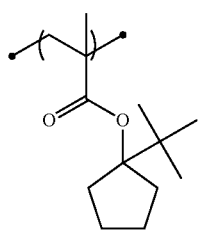

(P-159)

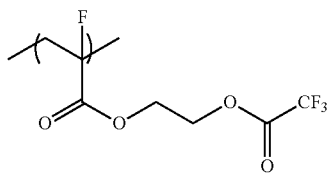
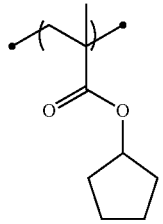

(P-148)

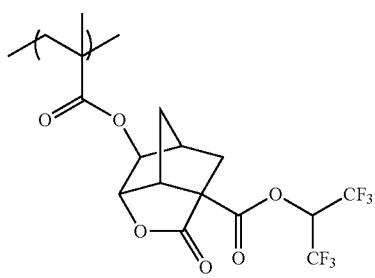
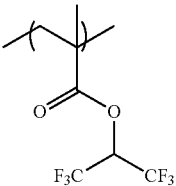

(P-228)

<Surfactant>
W-1: MEGAFACE F176 (manufactured by Dainippon Ink & Chemicals, Inc., fluorine-based)
W-2: MEGAFACE R08 (manufactured by Dainippon Ink & Chemicals, Inc., fluorine- and silicon-based)
W-3: Polysiloxane Polymer KP-341 (manufactured by Shin-Etsu Chemical Co., Ltd., silicon-based)
W-4: TROYSOL S-366 (manufactured by Troy Chemical Corporation)
W-5: PF656 (manufactured by OMNOVA, fluorine-based)
W-6: PF6320 (manufactured by OMNOVA, fluorine-based)
<Solvent>
SL-1: Cyclohexanone
SL-2: Propylene glycol monomethyl ether acetate (PGMEA: 1-methoxy-2-acetoxypropane)
SL-3: Ethyl lactate
SL-4: Propylene glycol monomethyl ether (PGME: 1-methoxy-2-propanol)
SL-5: γ-Butyrolactone
SL-6: Propylene carbonate
<Preparation of Composition>
The components shown in a table which will be described later were dissolved in a solvent to prepare each of solutions having a concentration of the solid content of 5% by mass, and the solution was filtered through a polyethylene filter having a pore size of 0.1 μm to prepare a composition. The prepared composition was evaluated by the following method and the results are summarized in the table which will be described later.
<Image Performance Test>
[Exposure Condition: ArF Liquid Immersion Exposure]
A composition for forming an organic antireflection film, ARC29SR (manufactured by Brewer Science Ltd.), was applied onto a silicon wafer, and the silicon wafer having the composition for forming an organic antireflection film applied thereon was baked at 205° C. for 60 seconds to form an antireflection film with a thickness of 98 nm.
The prepared composition was applied onto the formed antireflection film and the silicon wafer having the composition applied thereon was baked at 130° C. for 60 seconds to form a resist film with a thickness of 120 nm.
Next, the resist film was exposed through a 6% half-tone mask having a 75-nm 1:1 line-and-space pattern using an ArF excimer laser liquid immersion scanner (XT1250i manufactured by ASML, NA0.85). Ultrapure water was used as the immersion liquid. Thereafter, the exposed resist film was heated at 130° C. for 60 seconds, then developed with an aqueous tetramethylammoniumhydroxide solution (2.38% by mass) for 30 seconds, rinsed with pure water, and spin-dried to obtain a pattern.

[Evaluation of Depth of Focus (DOF, Unit: Nm)]

An exposing treatment and a developing treatment were carried out in accordance with the same procedure as in [Exposure Condition: ArF Liquid Immersion Exposure], except that pattern exposure was performed through a half-tone mask in a square array with a hole part in a dimension of 100 nm and a pitch between holes of 600 nm. By the same method as in formation of a line-and-space pattern as described above, except that the type of the mask was changed, an isolated hole pattern having a hole diameter of 90 nm was obtained. The exposure dose used at this time was defined as an optimal exposure dose of the hole pattern. Exposure was performed with a focus varying from −200 nm to 200 nm. The obtained isolated hole pattern was observed with a scanning electron microscope (S-9380II manufactured by Hitachi High-Technologies Corporation), a dimension thereof was measured, and a range of the focus with a pattern dimension falling within a range of 85 to 95 nm was calculated. A larger value thereof means that the depth of focus was greater and the performance was better.

[Pattern Collapse]

With regard to pattern collapse, an exposure dose at which a 75-nm line-and-space pattern is reproduced was taken as an optimal exposure dose, and a line width with which a pattern is resolved without collapse in a fine mask size upon exposure at the optimal exposure dose with respect to a 1:1 line-and-space dense pattern and a 1:10 line-and-space isolated pattern was taken as a critical pattern collapse line width. A smaller value thereof means that a finer pattern is resolved without collapse and pattern collapse is less likely to be generated.

A: Less than 35 nm
B: 35 nm or more and less than 40 nm
C: 40 nm or more and less than 45 nm
D: 45 nm or more, or difficulty in measurement due to noticeable pattern collapse

[Line Edge Roughness (LER)]

With respect to a 5-μm range of longitudinal edges of a line pattern, a distance from a reference line on which edges were to be present was measured at 50 points by means of a critical-dimension scanning electron microscope (S-9220 manufactured by Hitachi High-Technologies Corporation), and a standard deviation thereof was determined to calculate 3a and evaluated in accordance with the following standard.

A: Less than 5.0 nm
B: 5.0 nm or more and less than 6.0 nm
C: 6.0 nm or more and less than 7.0 nm
D: 7.0 nm or more

[Scum]

Development residues (scum) in a line pattern with a line width of 75 nm were observed using a scanning electron microscope (S-4800, manufactured by Hitachi High-Technologies Corporation) and evaluated in accordance with the following standard.

A: Residues were not generated at all.
B: Residues were slightly generated.
C: Residues were significantly generated.
D: Residues were extremely generated.

[Evaluation of Development Defects]

Using a defect inspection apparatus, KLA 2360 (trade name), manufactured by KLA Tencor Ltd., the pattern was measured in a random mode by setting a pixel size of the defect inspection apparatus to 0.16 μm and a threshold value to 20 so as to detect development defects extracted from a difference produced in a case of superposing pixel units on a reference image, and the number of development defects per unit area of the substrate having the obtained pattern was calculated and evaluated in accordance with the following standard.

A: Less than $15/m^2$
B: $15/m^2$ or more and less than $20/m^2$
C: $20/m^2$ or more and less than $30/m^2$
D: $30/m^2$ or more

[Water Tracking Property]

The composition as prepared above was applied onto a silicon wafer and baked at 130° C. for 60 seconds to form a 120-nm resist film, thereby obtaining a wafer including the resist film. Next, the obtained wafer including the resist film was arranged such that the resist film and a quartz glass substrate faced each other, and a space therebetween was filled with pure water.

While the quartz glass substrate was moved (scanned) in parallel to the surface of the wafer in the above state, a condition of the pure water tracking the glass substrate was visually observed. The water tracking property was evaluated by gradually increasing a scan speed of the quartz glass substrate and determining a critical scan speed (unit: mm/sec) at which the pure water could no longer track the scan speed of the quartz glass substrate to cause water droplets to begin to remain on the receding side. A higher critical scan speed indicates that water tracking can be performed at a higher scan speed, and the water tracking property on the resist film is better. In addition, the critical scan speed is preferably 250 mm/sec or more in practical use.

In the following tables, % by mass in the section of "Ester compound (% by mass)" represents a content of the ester compound with respect to a total solid content of the composition.

% by mass in the sections of "Fluorine-containing polymer 1 (% by mass)" and "Fluorine-containing polymer 2 (% by mass)" represents a content of the fluorine-containing polymer with respect to a total solid content of the composition.

TABLE 5

| | | | | Composition | | | | | | Evaluation results | | | | |
|---|---|---|---|---|---|---|---|---|---|---|---|---|---|---|
| | Resin (A) (1 g) | Acid generator (mg) | Basic compound (mg) | Ester compound (% by mass) | Fluorine-containing polymer 1 (% by mass) | Fluorine-containing polymer 2 (% by mass) | Surfactant (mg) | Solvent (mass ratio) | DOF (nm) | Pattern collapse (nm) | LER | Scum | Development defects | Water tracking property (mm/sec) |
| Example 1 | 1 | PAG-1 115 | N-1 65 | D-24 2.0 | P-203 1.0 | P-226 4.5 | W-1 1 | SL-2/SL-5 90/10 | 80 | B | A | B | C | 310 |
| Example 2 | 2 | PAG-3 100 | N-5/N-1 50/50 | D-25 1.0 | P-54 2.0 | — | — | SL-2/SL-6 90/10 | 87 | B | B | B | B | 304 |

TABLE 5-continued

| | | | | Composition | | | | | | Evaluation results | | | | | |
|---|---|---|---|---|---|---|---|---|---|---|---|---|---|---|---|
| | Resin (A) (1 g) | Acid generator (mg) | Basic compound (mg) | Ester compound (% by mass) | Fluorine-containing polymer 1 (% by mass) | Fluorine-containing polymer 2 (% by mass) | Surfactant (mg) | Solvent (mass ratio) | DOF (nm) | Pattern collapse (nm) | LER | Scum | Development defects | Water tracking property (mm/sec) |
| Example 3 | 3 | PAG-1 120.0 | N-3 70 | D-26 2.0 | P-13 4.0 | P-2 2.0 | W-3 2 | SL-1/SL-2 90/10 | 102 | A | B | A | A | 411 |
| Example 4 | 4 | PAG-5 130 | N-5 68 | D-25 2.0 | P-17 5.2 | — | W-4 2 | SL-2/SL-4 60/40 | 96 | C | B | B | B | 386 |
| Example 5 | 27a | PAG-8 120 | N-1/N-8 70/2 | D-33 2.0 | P-96 3.0 | — | — | SL-2/SL-5 90/10 | 91 | B | C | B | B | 373 |
| Example 6 | 27b | PAG-1 125 | N-1 60 | D-34 1.0 | P-220 2.0 | — | — | SL-2/SL-4 60/40 | 86 | C | C | B | B | 329 |
| Example 7 | 7 | PAG-7 107 | N-1/N-9 45/10 | D-37 2.0 | P-25 3.0 | — | — | SL-2/SL-4 60/40 | 84 | B | C | C | B | 307 |
| Example 8 | 8 | PAG-3 107 | N-1/N-8 50/10 | D-42 3.0 | P-226 1.0 | P-47 5.2 | W-2 1 | SL-2/SL-4 60/40 | 103 | A | B | A | A | 402 |
| Example 9 | 9 | PAG-1 110 | N-3 75 | D-47 2.0 | P-91 4.0 | — | — | SL-2/SL-5 90/10 | 99 | B | B | B | B | 399 |
| Example 10 | 10 | PAG-13 133 | N-5/N-1 30/30 | D-42 2.0 | P-226 1.0 | P-93 5.2 | W-4 2 | SL-2/SL-5 90/10 | 101 | A | B | A | A | 425 |
| Example 11 | 11 | PAG-8 105 | N-8/N-1 40/40 | D-37 4.0 | P-83 4.0 | — | W-5 2 | SL-2/SL-4 60/40 | 86 | B | C | C | B | 294 |
| Example 12 | 12 | PAG-5 114 | N-9 60 | D-39 2.0 | P-98 4.0 | P-17 2.0 | — | SL-1/SL-6 60/40 | 95 | B | A | B | A | 364 |

TABLE 6

| | | | | Composition | | | | | | Evaluation results | | | | | |
|---|---|---|---|---|---|---|---|---|---|---|---|---|---|---|---|
| | Resin (A) (1 g) | Acid generator (mg) | Basic compound (mg) | Ester compound (% by mass) | Fluorine-containing polymer 1 (% by mass) | Fluorine-containing polymer 2 (% by mass) | Surfactant (mg) | Solvent (mass ratio) | DOF (nm) | Pattern collapse (nm) | LER | Scum | Development defects | Water tracking property (mm/sec) |
| Example 13 | 29 | PAG-2 115 | N-1/N-8 70/2 | D-44 2.0 | P-47 4.0 | — | — | SL-2/SL-5 80/20 | 77 | C | C | C | B | 316 |
| Example 14 | 14 | PAG-6 125 | N-8 75 | D-45 2.0 | P-2 4.0 | — | W-6 2 | SL-2/SL-4 60/40 | 81 | B | C | C | B | 322 |
| Example 15 | 27a | PAG-13 130 | N-1/N-9 45/10 | D-24 2.0 | P-226 2.0 | P-124 5.7 | — | SL-2/SL-5 90/10 | 107 | A | A | A | A | 440 |
| Example 16 | 16 | PAG-9 100 | N-1/N-8 50/10 | D-26 4.0 | P-124 5.2 | P-224 0.5 | — | SL-2/SL-5 90/10 | 100 | B | A | A | A | 413 |
| Example 17 | 17 | PAG-8 100 | N-2/N-8 40/15 | D-46 2.0 | P-115 4.0 | — | W-3 2 | SL-2/SL-4/ SL-5 60/37/3 | 80 | C | C | D | B | 308 |
| Example 18 | 18 | PAG-3 110 | N-3 70 | D-34 2.0 | P-52 4.0 | — | W-4 2 | SL-2/SL-4 60/40 | 92 | C | B | B | B | 389 |
| Example 19 | 19 | PAG-11 130 | N-3/N-6 70/8 | D-24 2.0 | P-81 4.0 | — | W-5 1 | SL-2/SL-5 97/3 | 89 | B | B | B | B | 380 |
| Example 20 | 20 | PAG-4/N-1 110 | N-1 70/10 | D-47 2.0 | P-17 2.5 | P-47 2.5 | W-6 1 | SL-2/SL-5 90/10 | 105 | B | A | A | A | 406 |
| Example 21 | 21 | PAG-11 120 | N-6 100 | D-47 2.0 | P-11 3.0 | P-226 2.0 | — | SL-2/SL-4 60/40 | 104 | A | B | A | A | 409 |
| Example 22 | 22 | PAG-16 120 | N-6 100 | D-37 4.0 | P-36 4.0 | P-86 2.0 | — | SL-2/SL-4 90/10 | 92 | C | B | B | A | 396 |
| Example 23 | 23 | PAG-1 90 | N-8/N-1 70/20 | D-42 1.0 | P-66 4.0 | P-207 1.0 | — | SL-2/SL-4 60/40 | 90 | B | A | D | B | 384 |
| Example 24 | 24 | PAG-9 125 | N-7 100 | D-37 6.0 | P-1 4.0 | P-207 1.0 | — | SL-2/SL-4 90/10 | 82 | C | C | B | B | 316 |
| Example 25 | 25 | PAG-10 100 | N-5/N-1 60/60 | D-37 6.0 | P-220 2.0 | — | — | SL-2/SL-4/ SL-5 60/37/3 | 78 | D | C | C | C | 284 |

TABLE 7

| | Resin (A) (1 g) | Acid generator (mg) | Basic compound (mg) | Ester compound (% by mass) | Fluorine-containing polymer 1 (% by mass) | Fluorine-containing polymer 2 (% by mass) | Surfactant (mg) | Solvent (mass ratio) | DOF (nm) | Pattern collapse (nm) | LER | Scum | Development defects | Water tracking property (mm/sec) |
|---|---|---|---|---|---|---|---|---|---|---|---|---|---|---|
| Example 26 | 27b | PAG-13 118 | N-1/N-9 21/9 | D-24 2.0 | P-226 1.0 | P-93 5.2 | — | SL-2/SL-5 90/10 | 106 | A | A | A | A | 435 |
| Example 26 | 26 | PAG-10 122 | N-9 60 | D-42 3.0 | P-93 5.2 | — | — | SL-2/SL-5 90/10 | 92 | C | A | B | B | 371 |
| Example 27 | 6 | PAG-12 133 | N-5/N-1 70/5 | D-37 2.0 | P-84 3.0 | — | W-3 2 | SL-2/SL-5 90/10 | 86 | A | C | B | B | 317 |
| Example 28 | 13 | PAG-4 100 | N-3 70 | D-44 8.0 | P-77 2.0 | P-151 3.0 | W-6 1 | SL-2/SL-4 60/40 | 87 | C | C | C | A | 348 |
| Example 29 | 5 | PAG-14 100 | N-8/N-1 70 | D-26 2.0 | P-30 3.0 | P-159 3.0 | — | SL-2/SL-4/SL-5 60/37/3 | 105 | A | B | A | A | 419 |
| Example 30 | 15 | PAG-3 110 | N-5/N-7 70/5 | D-24 2.0 | P-62 1.0 | P148 5.0 | W-6 2 | SL-2/SL-4 60/40 | 101 | B | A | A | A | 406 |
| Example 31 | 29 | PAG-15 110 | N-1/N-8 52/12 | D-24 3.0 | P-226 1.0 | P-93 5.2 | — | SL-2/SL-5 90/10 | 105 | A | A | A | A | 430 |
| Example 32 | 7 | PAG-3 100 | N-5 70 | D-47 0.5 | P-1 2 | P-228 3.0 | — | SL-2/SL-4 60/40 | 94 | B | C | B | A | 393 |
| Example 33 | 28 | PAG-3 100 | N-5 70 | D-47 2.0 | P-1 2 | P-228 3.0 | — | SL-2/SL-4 60/40 | 103 | B | A | A | A | 398 |
| Example 34 | 22 | PAG-3 100 | N-5 70 | D-47 4.0 | P-1 2 | P-228 3.0 | — | SL-2/SL-4 60/40 | 103 | A | A | B | A | 403 |
| Example 35 | 15 | PAG-3 100 | N-5 70 | D-47 8.0 | P-1 2 | P-228 3.0 | — | SL-2/SL-4 60/40 | 98 | B | C | B | C | 390 |
| Example 36 | 8 | PAG-3 100 | N-3 70 | D-47 3.0 | P-226 1.0 | P-93 5.2 | W-1 1 | SL-2/SL-4 60/40 | 105 | A | A | B | A | 402 |
| Example 37 | 29 | PAG-13 118 | N-5/N-7 70/10 | D-34 2.0 | P-1 2 | P-228 3.0 | — | SL-2/SL-5 90/10 | 100 | A | B | A | A | 403 |

TABLE 8

| | Resin (A) (1 g) | Acid generator (mg) | Basic compound (mg) | Ester compound (% by mass) | Fluorine-containing polymer 1 (% by mass) | Fluorine-containing polymer 2 (% by mass) | Surfactant (mg) | Solvent (mass ratio) | DOF (nm) | Pattern collapse (nm) | LER | Scum | Development defects | Water tracking property (mm/sec) |
|---|---|---|---|---|---|---|---|---|---|---|---|---|---|---|
| Example 38 | 30 | PAG-13 118 | N-1/N-6 21/9 | D-24 2.0 | P-1 2 | P-228 3.0 | — | SL-2/SL-5 90/10 | 101 | A | B | A | A | 400 |
| Example 39 | 31 | PAG-13 130 | N-1/N-9 45/10 | D-47 2.0 | P-1 2 | P-228 3.0 | — | SL-2/SL-5 90/10 | 99 | A | B | A | A | 405 |
| Example 40 | 32 | PAG-15 110 | N-1/N-8 52/12 | D-24 3.0 | P-226 1.0 | P-93 5.2 | — | SL-2/SL-5 90/10 | 104 | A | A | A | A | 430 |
| Example 41 | 33 | PAG-15 110 | N-1/N-8 52/12 | D-47 2.0 | P-13 4.0 | P-2 2.0 | — | SL-2/SL-5 90/10 | 101 | B | A | A | A | 398 |
| Example 42 | 34 | PAG-15 110 | N-1/N-8 52/12 | D-47 2.0 | P-13 4.0 | P-2 2.0 | — | SL-2/SL-5 90/10 | 102 | A | B | A | A | 397 |
| Example 43 | 35 | PAG-15 110 | N-1/N-8 52/12 | D-34 2.0 | P-1 2 | P-228 3.0 | W-5 1 | SL-2/SL-5 90/10 | 99 | B | A | A | A | 402 |
| Example 44 | 36 | PAG-15 110 | N-1/N-8 52/12 | D-34 2.0 | P-93 5.2 | — | — | SL-2/SL-5 90/10 | 95 | C | B | A | B | 384 |
| Example 45 | 37 | PAG-15 110 | N-1/N-8 52/12 | 0-24 2.0 | P-93 5.2 | — | W-5 1 | SL-2/SL-5 90/10 | 93 | B | A | B | B | 386 |
| Example 46 | 38 | PAG-15 110 | N-1/N-8 52/12 | D-47 2.0 | P-93 5.2 | — | — | SL-2/SL-5 90/10 | 94 | B | A | B | B | 390 |
| Comparative Example 1 | 1 | PAG-1 125 | N-5/N-1 40/40 | — | P-17 2.5 | P-47 2.5 | W-6 1 | SL-2/SL-5 97/3 | 50 | D | D | D | B | 200 |
| Comparative Example 2 | 5 | PAG-3 130 | N-3 70 | D-1 2.0 | P-17 2.5 | P-47 2.5 | — | SL-2/SL-5 90/10 | 43 | C | D | C | C | 220 |
| Comparative Example 3 | 16 | PAG-6 133 | N-3 70 | D-16 2.0 | P-17 2.5 | P-47 2.5 | W-3 2 | SL-1/SL-2 60/40 | 48 | B | D | D | C | 230 |

TABLE 8-continued

| | Composition | | | | | | | | Evaluation results | | | | | |
|---|---|---|---|---|---|---|---|---|---|---|---|---|---|---|
| | Resin (A) (1 g) | Acid generator (mg) | Basic compound (mg) | Ester compound (% by mass) | Fluorine-containing polymer 1 (% by mass) | Fluorine-containing polymer 2 (% by mass) | Surfactant (mg) | Solvent (mass ratio) | DOF (nm) | Pattern collapse (nm) | LER | Scum | Development detects | Water tracking property (mm/sec) |
| Comparative Example 4 | 27a | PAG-8 110 | N-6 100 | D-24 2.0 | P-216 5.2 | — | — | SL-2/SL-4 60/40 | 52 | C | B | C | D | 150 |
| Comparative Example 5 | 18 | PAG-8 115 | N-6 100 | D-24 2.0 | — | — | — | SL-2/SL-4 60/40 | 55 | D | D | D | C | 30 |

As shown in the tables, desired effects are obtained in a case where the composition of the embodiment of the present invention was used.

Above all, as seen from a comparison between Example 7 and the other Examples, the effects were more excellent in a case where the molecular weight of the ester compound was 300 to 600.

Moreover, as seen from a comparison between Example 28 and other Examples, the effects were more excellent in a case where the ester compound had a halogenated alkyl group.

Furthermore, as seen from a comparison between Examples using D-33, D-34, D-39, and D-46 and the other Examples, the effects were more excellent in a case where Rc Formula (B) as described above was an n-valent chained hydrocarbon group.

In addition, the effects were more excellent in a case where two or more kinds of the fluorine-containing polymers were used.

What is claimed is:

1. An actinic ray-sensitive or radiation-sensitive resin composition comprising:
   a resin whose solubility in an aqueous alkali solution increases by the action of an acid;
   a compound that generates an acid upon irradiation with actinic rays or radiation;
   an ester compound; and
   a fluorine-containing polymer,
   wherein the ester compound has alkali decomposability and has a molecular weight of 50 or more and less than 1,500, and
   the ester compound is a compound represented by Formula (B),

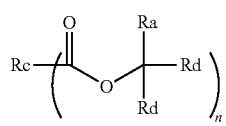

Formula (B)

in Formula (B), Ra represents an electron-withdrawing group, Rc represents an n-valent chained hydrocarbon group, each Rd independently represents a hydrogen atom or a substituent, and n represents an integer of 1 to 3.

2. The actinic ray-sensitive or radiation-sensitive resin composition according to claim 1,
   wherein the ester compound has at least one or more electron-withdrawing groups.

3. The actinic ray-sensitive or radiation-sensitive resin composition according to claim 1,
   wherein at least one of Rd's is an electron-withdrawing group.

4. The actinic ray-sensitive or radiation-sensitive resin composition according to claim 2,
   wherein the electron-withdrawing group is a halogenated alkyl group, a halogen atom, a cyano group, a nitro group, or a group represented by —COO—Rb, and Rb represents an alkyl group.

5. The actinic ray-sensitive or radiation-sensitive resin composition according to claim 2,
   wherein the electron-withdrawing group is a halogenated alkyl group.

6. The actinic ray-sensitive or radiation-sensitive resin composition according to claim 1,
   wherein the molecular weight of the ester compound is 300 to 1,000.

7. The actinic ray-sensitive or radiation-sensitive resin composition according to claim 1,
   wherein a content of the ester compound is 1.0% to 6.0% by mass with respect to a total solid content of the actinic ray-sensitive or radiation-sensitive resin composition.

8. The actinic ray-sensitive or radiation-sensitive resin composition according to claim 1,
   wherein the fluorine-containing polymer has alkali decomposability.

9. The actinic ray-sensitive or radiation-sensitive resin composition according to claim 1,
   wherein the fluorine-containing polymer has a repeating unit represented by Formula (X),

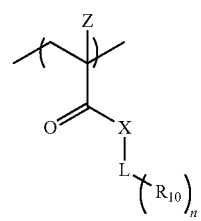

Formula (X)

in Formula (X), Z represents a halogen atom, a group represented by $R_{11}OCH_2$—, or a group represented by $R_{12}OC(=O)CH_2$—, $R_{11}$ and $R_{12}$ each independently represent a substituent, X represents an oxygen atom or a sulfur atom, L represents an (n+1)-valent linking group, $R_{10}$ represents a group having a group whose solubility in an aqueous alkali solution increases through decomposition by the action of the aqueous alkali solution, n represents a positive integer, and in a case where n is 2 or more, a plurality of $R_{10}$'s may be the same as or different from each other.

10. The actinic ray-sensitive or radiation-sensitive resin composition according to claim 9,
wherein the repeating unit represented by Formula (X) is a repeating unit represented by Formula (Y-1) or a repeating unit represented by Formula (Y-2),

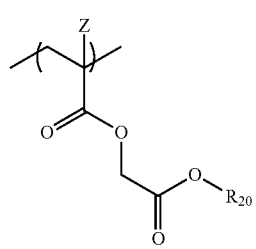

Formula (Y-1)

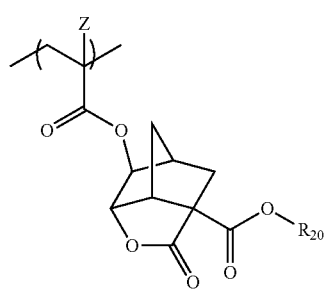

Formula (Y-2)

in Formula (Y-1) and Formula (Y-2), Z represents a halogen atom, a group represented by $R_{11}OCH_2$—, or a group represented by $R_{12}OC(=O)CH_2$—, $R_{11}$ and $R_{12}$ each independently represent a substituent, and $R_{20}$ represents an electron-withdrawing group.

11. The actinic ray-sensitive or radiation-sensitive resin composition according to claim 1, the composition comprising two or more of the fluorine-containing polymers.

12. A resist film formed from the actinic ray-sensitive or radiation-sensitive resin composition according to claim 1.

13. A pattern forming method comprising:
forming a resist film on a substrate with the actinic ray-sensitive or radiation-sensitive resin composition according to claim 1;
irradiating the resist film with actinic rays or radiation; and
developing the resist film with an aqueous alkali solution.

14. The pattern forming method according to claim 13, wherein the irradiation with actinic rays or radiation is performed with liquid immersion exposure.

15. A method for manufacturing an electronic device, the method comprising the pattern forming method according to claim 13.

16. A resist film comprising:
an underlayer including a resin whose solubility in an aqueous alkali solution increases by the action of an acid, a compound that generates an acid upon irradiation with actinic rays or radiation, and an ester compound; and
an upper layer arranged on the underlayer, including a fluorine-containing polymer,
wherein the ester compound has alkali decomposability and has a molecular weight of 50 or more and less than 1,500, and
the ester compound is a compound represented by Formula (B),

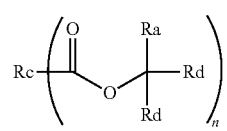

Formula (B)

in Formula (B), Ra represents an electron-withdrawing group, Rc represents an n-valent chained hydrocarbon group, each Rd independently represents a hydrogen atom or a substituent, and n represents an integer of 1 to 3.

17. The actinic ray-sensitive or radiation-sensitive resin composition according to claim 1,
wherein at least one of Rd's is at least one group selected from the group consisting of a halogenated alkyl group, a halogen atom, a nitro group, or a group represented by —COO—Rb, where Rb represents an alkyl group.

18. The actinic ray-sensitive or radiation-sensitive resin composition according to claim 9,
wherein the repeating unit represented by Formula (X) is a repeating unit represented by Formula (Y-1),

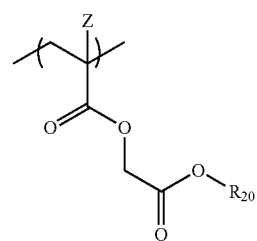

Formula (Y-1)

in Formula (Y-1), Z represents a halogen atom, a group represented by $R_{11}OCH_2$—, or a group represented by $R_{12}OC(=O)CH_2$—, $R_{11}$ and $R_{12}$ each independently represents a substituent, and $R_{20}$ represents an electron-withdrawing group.

19. The actinic ray-sensitive or radiation-sensitive resin composition according to claim 1,
wherein the ester compound has a ClogP value of 3 to 11.

* * * * *